United States Patent [19]

Paz de Araujo et al.

[11] Patent Number: 5,468,679
[45] Date of Patent: Nov. 21, 1995

[54] PROCESS FOR FABRICATING MATERIALS FOR FERROELECTRIC, HIGH DIELECTRIC CONSTANT, AND INTEGRATED CIRCUIT APPLICATIONS

[75] Inventors: Carlos A. Paz de Araujo; Michael C. Scott; Joseph D. Cuchiaro; Larry D. McMillan, all of Colorado Springs, Colo.

[73] Assignee: Symetrix Corporation, Colorado Springs, Colo.

[21] Appl. No.: 154,760

[22] Filed: Nov. 18, 1993

Related U.S. Application Data

[63] Continuation-in-part of Ser. No. 981,133, Nov. 24, 1992, Pat. No. 5,423,285, which is a continuation-in-part of Ser. No. 965,190, Oct. 23, 1992, which is a continuation-in-part of Ser. No. 807,439, Dec. 13, 1991, abandoned, which is a continuation-in-part of Ser. No. 660,428, Feb. 25, 1991, abandoned.

[51] Int. Cl.$^6$ .......................... H01L 21/20; H01L 21/324
[52] U.S. Cl. .............................. 437/110; 437/82; 117/64
[58] Field of Search .................. 437/82, 110; 427/126.1, 427/126.3; 117/64; 204/192.1

[56] References Cited

U.S. PATENT DOCUMENTS

| | | | |
|---|---|---|---|
| 4,752,501 | 6/1988 | Hicks et al. | 427/126.3 |
| 4,817,124 | 3/1989 | Ketterson et al. | 378/119 |
| 4,963,390 | 10/1990 | Lipeles et al. | 427/126.3 |
| 5,028,455 | 7/1991 | Miller et al. | 427/126.3 |
| 5,034,246 | 7/1991 | Mance et al. | 427/126.3 |
| 5,146,299 | 9/1992 | Lampe et al. | 357/23.5 |
| 5,217,754 | 6/1993 | Santiago-Aviles et al. | 427/226 |
| 5,236,874 | 8/1993 | Pintchovski | 427/126.3 |

FOREIGN PATENT DOCUMENTS

| | | | |
|---|---|---|---|
| 0125507 | 11/1984 | European Pat. Off. | C03C 1/00 |
| 0415751A1 | 3/1991 | European Pat. Off. | H01L 29/92 |
| 1-179423 | 7/1989 | Japan . | |
| 2-232974 | 9/1990 | Japan . | |
| 2232974 | 9/1990 | Japan | H01L 29/788 |

OTHER PUBLICATIONS

Sugibuchi, K., et al.; Ferroelectric Field–Effect Memory Device Using $Bi_4Ti_3O_{12}$Film; Journal of Applied Physics; vol. 46, No. 7; Jul. 1975; pp. 2877–2881.

"Ferroelectric Thin Films for Integrated Electronics" 17 slides presented in a talk presented by Donald Lampe of Westinghouse Advanced Tech. Div.

Smolenskii, et al., "Ferroelectrics and Related Materials," Gordon & Breach Science Publishers, Chapt. 15, Oxygen–Octahedral Ferroelectrics.

Scott, et al. "Integrated Ferroelectrics", vol. I, No. 4, 1992 Condensed Matter News.

Lines, et al., "Principles and Applications of Ferroelectrics & related Materials", Clarendon Press, Oxford, 1977.

Melnick, et al. "Process Optimization & Characterization of Device Worthy Sol–Gel Based PZT For Ferroelectric Memories", Ferroelectrics 1990, vol. 109.

Kwak, et al., "Metalorganic Chemical Vapor Deposition of PbTiO3 Thin Films", Appl. Phys. Letter 53 (18) 31 Oct. 1988.

Vest, et al., "PbTiO3 Films From Metalloorganic Precursors", IEEE Transactions on Ultrasonics, Ferroelectrics & Freq. Contrl., vol. 35, No. 6 Nov. 1988.

Vest, et al., "Synthesis of Metallo–Organic Compounds For MOD Powders & Films", Mat. Res. Soc. Symp. Proc., vol. 60, 1986 Materials Research Soc.

Davidson, et al., "Metal Oxide Films From Carboxylate Precursors", Mat. Res. Soc. Symp. Proc., vol. 121, 1988 Materials Research Society.

(List continued on next page.)

Primary Examiner—R. Bruce Breneman
Assistant Examiner—Jeffry Lund
Attorney, Agent, or Firm—Duft, Graziano & Forest

[57] ABSTRACT

A precursor comprising a medium-length ligand carboxylate, such as a metal 2-ethylhexanoate, in a xylenes solvent is applied to an integrated circuit wafer. The wafer is baked to dry the precursor, annealed to form a layered superlattice material on the wafer, then the integrated circuit is completed.

14 Claims, 27 Drawing Sheets

OTHER PUBLICATIONS

Smolenskii, G. A., et al. "Dielectric Polarization of a Number of Complex Compounds", Fizika Tverdogo Tela, V. 1, No. 10, pp. 1562–1572 (Oct., '59).

Smolenskii, G. A., et al., "New Ferroelectrics of Complex Composition". Soviet Physics–Technical Physics, 907–908 (1959).

Smolenskii, G. A., et al., "Ferroelectrics of the Oxygen–Octahedral Type With Layered Structure", Soviet Physics–Solid State, V. 3, No. 3, pp. 651–655, Sep. 1961.

Subbarao, E. C., "Ferroelectricity in Mixed Bismuth Oxides With Layered–Type Structure", J. Chem. Physics, vol. 34, 695 (1961).

Subbarao, E. C., "A Family of Ferroelectric Bismuth Compounds", J. Phys. Chem. Solids, V. 23, pp. 665–676 (1962) & Chapt. 8, pp. 241–292 & pp. 624–625.

Wu, Shu–Yau, "A New Ferroelectric Memory Device, Metal–Ferroelectric–Semiconductor Transistor" IEEE Transactions on Electron Devices, Aug. '74.

Wu, S. Y., "Memory Retention & Switching Behavior of Metal–Ferroelectric Semiconductor Transistors", Ferroelectrics, 1976, vol. 11, pp. 379–383.

Joshi, P. C., et al., "Structural & Optical Properties of Ferroelectric $Bi_4Ti_3O_{12}$ Thin Films By Sol–Gel Technique", Appl. Phys. Letr, vol. 59, No. 10, Nov. 9.

Mantese, J. V., et al., "Metalorganic Deposition (MOD): A Nonvacuum, Spin–On, Liquid–Based, Thin Film Method", MRS. Bulletin, Oct. 1989, pp. 48–53.

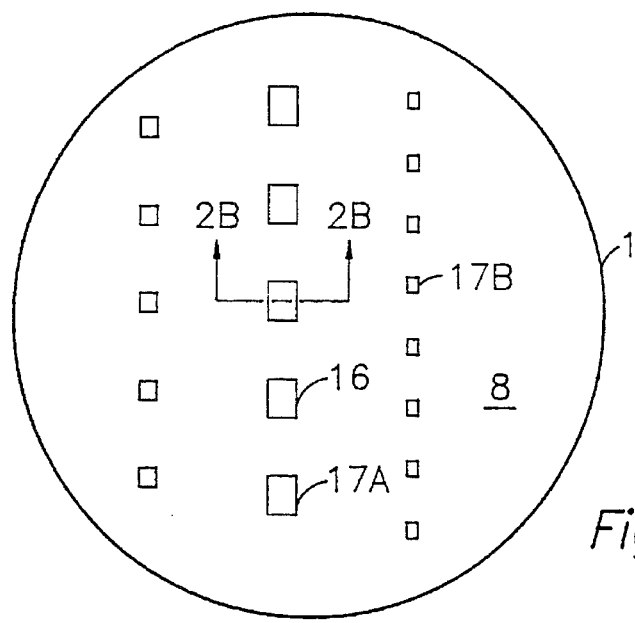
Fig. 2A
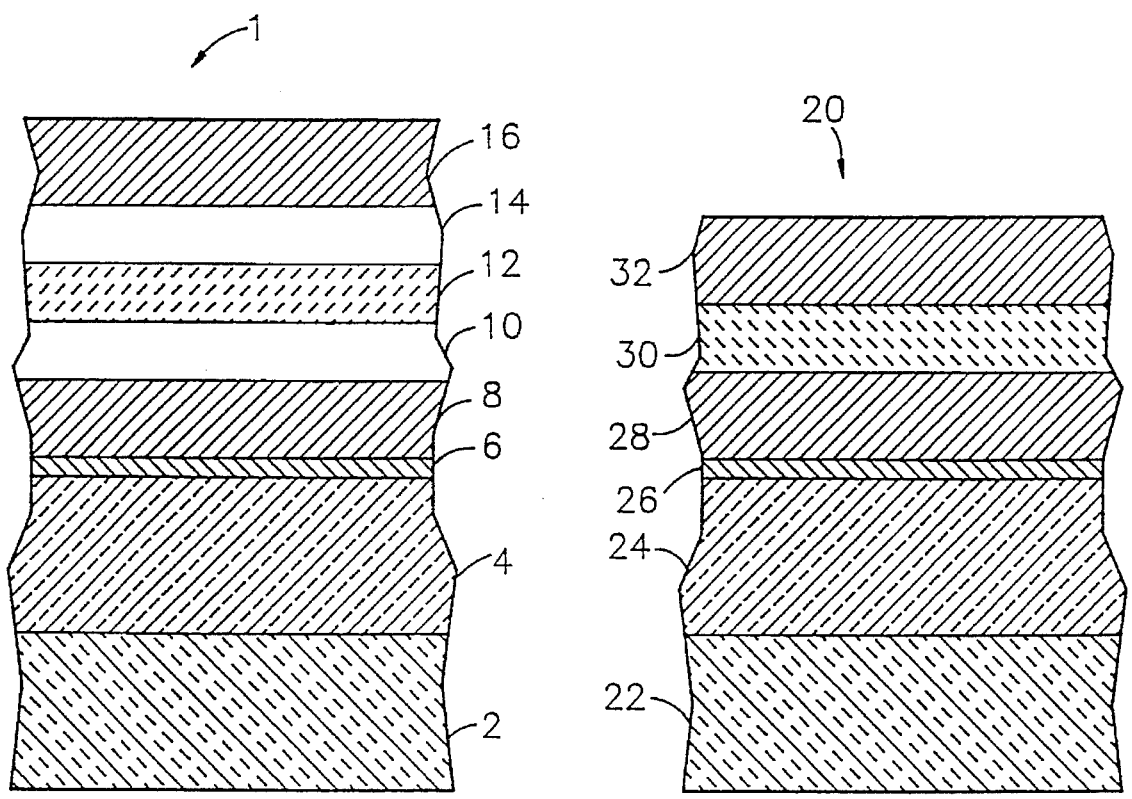
Fig. 2B
Fig. 2C

◯ A  ◯ B  ◯ Q

◯ A  ◯ B  ◯ Q $ABi_2B_2^{+5}O_9$ $ABi_2B_4^{+4}O_{15}$ (Prior art material)

(Prior art material)

(Prior art material)

(Prior art material)

PROCESS FOR FABRICATING MATERIALS FOR FERROELECTRIC, HIGH DIELECTRIC CONSTANT, AND INTEGRATED CIRCUIT APPLICATIONS

This application is a continuation-in-part of U.S. patent application Ser. No. 07/981,133 filed Nov. 24, 1992, Now U.S. Pat. No. 5,423,285, which is a continuation-in-part of U.S. patent application Ser. No. 07/965,190 filed Oct. 23, 1992, which in turn is a continuation-in-part of U.S. patent application Ser. No. 7/807,439 filed Dec. 13, 1991, now abandoned, which in turn is a continuation-in-part of U.S. patent application 07/660,428 filed Feb. 25, 1991, now abandoned.

BACKGROUND OF THE INVENTION

1. Field of the Invention

The invention in general relates to the fabrication of layered superlattice materials, and more particularly to fabrication processes that provide low fatigue ferroelectric and reliable high dielectric constant integrated circuit devices that are unusually resistant to degradation.

2. Statement of the Problem

Layered superlattice materials are a class of ferroelectrics and high dielectric constant materials discovered by G. A. Smolenskii, V. A. Isupov, and A. I. Agranovskaya. See Chapter 15 of the book, *Ferrelectrics and Related Materials*, ISSN 0275-9608, (V.3 of the series Ferroelectrics and Related Phenomena, 1984) edited by G. A. Smolenskii, especially sections 15.3–15.7; G. A. Smolenskii, A. I. Agranovskaya, "Dielectric Polarization of a Number of Complex Compounds", *Fizika Tverdogo Tela*, V. 1, No. 10, pp. 1562–1572 (October 1959); G. A. Smolenskii, A. I. Agranovskaya, V. A. Isupov, "New Ferroelectrics of Complex Composition", *Soviet Physics - Technical Physics*, 907–908 (1959); G. A. Smolenskii, V.A. Isupov, A. I. Agranovskaya, "Ferroelectrics of the Oxygen-Octahedral Type With Layered Structure", *Soviet Physics - Solid State*, V. 3, No. 3, pp. 651–655 (September 1961); E. C. Subbarao, "Ferroelectricity in Mixed Bismuth Oxides With Layer-Type Structure", *J. Chem. Physics*, V. 34, 695 (1961); E. C. Subbarao, "A Family of Ferroelectric Bismuth Compounds", *J. Phys. Chem. Solids*, V. 23, pp. 665–676 (1962) and Chapter 8 pages 241–292 and pages 624 & 625 of Appendix F of the Lines and Glass reference cited above.

As outlined in section 15.3 of the Smolenskii book, the layered perovskite-like materials can be classified under three general types:

(I) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedra; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Up to now, these layered superlattice materials have not been considered as being suitable for non-volatile ferroelectric memories, nor have they been recognized as useful high dielectric constant materials. Attempts have been made to use two of the layered ferroelectric materials, bismuth titanate ($Bi_4Ti_3O_{12}$) and barium magnesium fluoride in a switching memory application as a gate on a transistor. See "A New Ferroelectric Memory Device, Metal-Ferroelectric Semiconductor Transistor", by Shu-Yau Wu, *IEEE Transactions On Electron Devices*, August 1974, pp. 499–504, which relates to the $Bi_4Ti_3O_{12}$ device, and the article "Integrated Ferroelectrics" by J. F. Scott, C. A. Paz De Araujo, and L. D. McMillian in *Condensed Matter News*, Vol. 1, No. 3, 1992, pp. 16–20, which article is not prior art to this disclosure; However, Section IIB of the article discusses experiments with ferroelectric field effect transistors (FEFETs), the exact date of which experiments is not presently known to the inventors. Neither of these devices were successful. In the case of the $Bi_4Ti_3O_{12}$ device, the ON state decayed logarithmically after only two hours, and in the case of the $BaMgF_4$ device, both states decayed exponentially after a few minutes. See "Memory Retention And Switching Behavior Of Metal-Ferroelectric-Semiconductor Transistors", by S. Y. Wu, *Ferroelectrics*, 1976 Vol. 11, pp. 379–383.

It is believed that a key reason why none of the layered superlattice materials have been successfully used in a ferroelectric, high dielectric constant, or other practical application is that the processes of preparing the materials and fabricating devices from the materials that have been employed up to now have not been capable of producing high quality specimens of the materials. The materials used by Smolenskii and his collaborators were powdered materials in which the layered structure was broken and jumbled. The devices described in the papers by Wu cited above were films about 3 to 4 micrometers thick produced by sputtering. A recent paper, that is not believed to be prior art to the present disclosure, discloses the fabrication of a thin film of $Bi_4Ti_3O_{12}$, a layered superlattice material, by spin coating sol-gel onto a substrate and annealing. Joshi, P. C. et al., "Structural and Optical Properties of Ferroelectric Thin Films By Sol-gel Technique," Appl. Phys. Lett., Vol 59, No. 10, November 91.

Prior to about 1988, the vast majority of ferroelectric thin films were made by either RF sputtering or chemical vapor deposition (CVD). See "Metalorganic Chemical Vapor Deposition of $PbTiO_3$ Thin Films", by B. S. Kwak, E. P. Boyd, and A. Erbil, Applied Physics Letters, Vol. 53, No. 18, Oct. 31, 1988, pp. 1702–1704. About 1988, several other approaches began to be developed. The Kwak paper just cited discloses one such development, namely metalorganic chemical vapor deposition, or MOCVD.

The process of applying precursor solutions comprising organic compounds of the elements of the desired thin film in solution to substrates, and then heating the precursor on the substrate to form the film, has been used for many years in manufacturing and is known to be a simple process. However, until recently, all the manufactured products the process has been applied to have been large objects, such as windshields, in which the microscopic properties of the films have not been critical. It was generally thought that since an inherent part of the process is that significant quantities of organic materials must be disassociated from the elements of the future thin film and evaporated from the film as it dries, therefore the resulting film must have a relatively porous structure. About the same time as the MOCVD research mentioned above, the use of the precursor application/heating process was being developed as a process was to produce inks, such as for ink jet or screen printing, for forming conductors, resistors, and dielectric films on circuit boards or other substrates such as metal foil or glass. In this process, films of metal oxides were fabricated by dissolving a carboxylate of the metal in a solvent, such as xylene, spinning, dipping the a stoichiometric mixture of the solution on a substrate to form a thin film of liquid, and drying and firing the film to remove the solvents and organics and form the metal oxide thin film. See "Synthesis of Metallo-orgainic Compounds for MOD Powers and Films", G. M. Vest and S. Singaram, *Materials Research Society Symposium Proceedings*, Vol. 60, 1986 pp. 35–42. Specifically, this paper discloses the reaction of a metal compound, such as barium, bismuth, calcium, lead, strontium, zirconium, ruthenium, and tin compounds with either neodecanoic acid or 2-ethylhexanoic acid to form a metal carboxylate, such as bismuth 2-ethylhexanoate, which is dissolved in xylene to produce a precursor solution from which a thin film of a simple metal oxide, such as $Bi_2O_3$, is produced. In one instance these processes were used to produce thin ferroelectric thin films of $PbTiO_3$ (not a layered superlattice material), and since the processing conditions for making the films is compatible with silicon technology, it was postulated that it would be possible to use the process to make capacitors, detectors, and sensors on chips. See "$PbTiO_3$ Thin Films From Metalloorganic Precursors", Robert W. Vest and Jiejie Xu, IEEE Transactions On Ultrasonics, Ferroelectrics, and Frequency Control, Vol 35, No. 6, November 1988, pp. 711–717. It is also known that these processes can be used to form thin films of other ceramics and superconductors. W. W. Davidson, S. G. Shyu, R. D. Roseman, and R. C. Buchanan, "Metal Oxide Films from Carboxylate Precursors", *Materials Research Society Symposium Proceedings*, Vol. 121, pp. 797–802 (1988). Concurrently with the development of the MOCVD and metal carboxylate processes for printing purpose summarized above, experiments were performed to explore the use of the same or similar precursors as used in the above process to produce ferroelectric thin films by spinning the precursor onto a substrate and drying it. The experiments showed the preferred precursors to be the metal alkoxides and acetates. See U.S. Pat. No. 5,028,455 issued to William D. Miller et al. and the article "Process Optimization and Characterization of Device Worthy Sol-Gel Based PZT for Ferroelectric Memories", in *Ferroelectrics*, Vol 109, pp. 1–23 (1990). While the Miller patent mentions one metal carboxylate, lead tetra-ethylhexanoate, as a possible precursor, it was rejected as less desirable since the large organic group was thought to result in more defects in the final film. Further, the fact that the metal carboxylate processes were developed to produce inks such as for ink jet or screen printing, while the metal alkoxide and acetate processes were developed specifically for ferroelectric materials, also argued against the use of the metal carboxylates in ferroelectric integrated circuit applications.

In spite of the considerable research outlined above, none of the thin films made by the above processes, including the thin films of $PbTiO_3$ made by Vest or the thin films of PZT made by Miller, produced reliable, low fatigue ferroelectrics, and in particular, none produced reliable, low fatigue layered superlattice thin films.

3. Solution to the problem:

The invention solves the above problems by providing a standardized process for making high quality thin films of a layered superlattice material. The microscopic quality of the film provides excellent properties in integrated circuits. The process is simple and compatible with conventional integrated circuit materials and processes.

The process starts with preparing a precursor solution containing each of the metals in the desired thin film compound. For most metals, a metal carboxylate with medium-length ligands is the preferred precursor compound. "Medium-length ligands" herein means ligands with between 6 and 9 carbon links. A metal 2-ethylhexanoate works for most metals. If the metal is titanium, the precursor may comprise titanium 2-methoxyethoxide having at least a portion of its 2-methoxyethoxide ligands replaced by 2-ethylhexanoate.

The precursor is dissolved in a solvent having a boiling point greater than 110° C. A xylenes solvent works for most metals. For highly electropositive elements, the solvent includes 2-methoxyethanol or n-butyl acetate.

The precursor is applied to the integrated circuit wafer by spin coating or using a mist deposition process.

Optionally, the coated wafer is dried by heating it at about 150° C. for a few minutes. It is then baked at about 250° C. for from 30 seconds to a few minutes. The wafer is then annealed in an oxygen furnace at about 700° C. for about an hour. Several, coating, drying, baking and annealing steps may be repeated for thicker films.

Alternatively, a sputtering target may be prepared in the above manner and the material deposited by sputtering it onto the integrated circuit.

If the metal is lead or bismuth, 1% to 75% excess metal is included in the precursor to account for evaporation of the oxide during baking and annealing. The best results were obtained for 50% excess bismuth. If sputtering is used, even higher excess amounts may be required for best results.

Extremely high quality thin films have been made by the above process. For example, strontium bismuth tantalate ($SrBi_2Ta_2O_9$) has been made in thin films suitable for use in integrated circuits and having a polarizability, 2Pr, of 24 microcoulombs/cm$^2$ and showing less than 5% fatigue after $10^{10}$ cycles, which is equivalent to 10 years use in a typical integrated circuit switching device. As another example, barium bismuth tantalate ($BaBi_2Ta_2O_9$) having a dielectric constant of 166, measured at 1 Megahertz with a $V_{osc}$ of 15 millivolts, and a leakage current of $7.84 \times 10^{-8}$ amps/cm$^2$ at a field of 200 KV/cm has been made in thin films of less than 2000 Å, which are suitable for use in integrated circuits.

The development of a process that consistently produces high quality thin films has lead to the discovery that a class of materials, called layered superlattice materials herein, have remarkable properties. Layered superlattice materials having high polarizabilities, extremely low fatigue when switched over long periods in integrated circuits, high dielectric constants, and many other previously unknown electrical properties have been fabricated. Now that process of making high quality layered superlattice materials and reliable integrated circuits utilizing the layered superlattice materials has been discovered, this process can be applied to creating numerous other integrated circuits and other devices utilizing these materials and many other related materials.

SUMMARY OF THE INVENTION

The invention provides a method of fabricating an integrated circuit comprising the steps of: providing an integrated circuit wafer and a precursor comprising a metal carboxylate in a solvent; applying the precursor to the integrated circuit wafer; heating the integrated circuit wafer to form a layer of a chemical compound of the metal on the integrated circuit wafer; and completing the fabrication of the integrated circuit wafer to form a plurality of interconnected electrical devices on the wafer. Preferably the metal carboxylate is a metal carboxylate having medium-length ligands, such as a metal 2-ethylhexanoate. Preferably, the solvent has a boiling point between 110° C. and 170° C. and is selected from the group comprising alcohols, aromatic hydrocarbons, and esters. Preferably, the solvent is xylenes, 2-methoxyethanol, or n-butyl acetate. Preferably, the step of heating includes a step of drying at a temperature of 200° C. or less, a step of baking at a temperature of between 200° C. and 600° C. and/or a step of annealing at a temperature of 500° C. to 850° C. Preferably, the step of annealing comprises rapid thermal annealing and/or annealing in a diffusion furnace. If the metal is a highly electropositive element, the precursor comprises a solvent selected from the group comprising 2-methoxyethanol and n-butyl acetate. Preferably, the metal comprises one or more of the elements from the group comprising strontium, calcium, barium, bismuth, cadmium, lead, titanium, tantalum, hafnium, tungsten, niobium zirconium, bismuth, scandium, yttrium, lanthanum, antimony, chromium, and thallium. If the metal compound includes bismuth, lead, thallium or antimony, the precursor comprises 1% –75% excess of such metal.

In another aspect the invention provides a method of fabricating an integrated circuit comprising the steps of: providing an integrated circuit wafer and a precursor comprising titanium 2-methoxyethoxide; applying the precursor to the integrated circuit wafer; heating the integrated circuit wafer to form a layer of a titanium compound on the integrated circuit wafer; and completing the fabrication of the integrated circuit wafer to form a plurality of interconnected electrical devices on the wafer. Preferably the method further comprises, prior to the step of applying, the step of reacting the titanium 2-methoxyethoxide with 2-ethylhexanoic acid, thereby replacing at least a portion of the 2-methoxyethoxide ligands by 2-ethylhexanoate.

In a further aspect the invention provides a method of fabricating a layered superlattice material comprising the steps of: providing a first substrate and a precursor liquid containing a metal; applying the precursor liquid to the first substrate; and heating the precursor on the first substrate to form a layered superlattice material containing the metal on the first substrate. Preferably, the precursor liquid comprises a metal carboxylate in a solvent. Preferably, the metal carboxylate is a metal carboxylate having medium-length ligands, such as a metal 2-ethylhexanoate, and the solvent has a boiling point between 110° C. and 170° C. Preferably, the solvent is selected from the group comprising alcohols, aromatic hydrocarbons, and esters, and preferably comprises xylenes, 2-methoxyethanol, and n-butyl acetate. Preferably, the step of heating includes a step of drying at a temperature of 200° C. or less, and includes a step of baking at a temperature of between 200° C. and 600° C. and a step of annealing at a temperature of 500° C. to 850° C. Preferably, the step of annealing comprises rapid thermal annealing and/or annealing in a diffusion furnace. If the metal is a highly electropositive element, the precursor comprises a solvent selected from the group comprising 2-methoxyethanol and n-butyl acetate. Preferably, the metal comprises one or more of the elements from the group comprising strontium, calcium, barium, bismuth, cadmium, lead, titanium, tantalum, hafnium, tungsten, niobium zirconium, bismuth, scandium, yttrium, lanthanum, antimony, chromium, and thallium. If the metal compound includes bismuth, lead, thallium, or antimony, the precursor comprises 1% –75% excess of such metal. Preferably, the layered superlattice material comprises a material having a dielectric constant greater than 50. Alternatively, the layered superlattice material is ferroelectric and is capable of switching polarization states $10^9$ times with less than 30% fatigue. Preferably, the layered superlattice material comprises a material having the formula

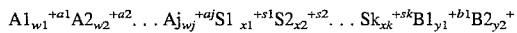

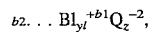

where A1, A2 . . . Aj represent A-site elements in a perovskite-like structure, S1, S2 . . . Sk represent superlattice generator elements, B1, B2 . . . Bl represent B-site elements in a perovskite-like structure, Q represents an anion, the superscripts indicate the valences of the respective elements, the subscripts indicate the average number of atoms of the element in the unit cell, and at least w1 and y1 are non-zero. Preferably, the A-site element comprises one or more of the elements from the group comprising strontium, calcium, barium, bismuth, cadmium, and lead, the B-site element comprises one or more elements from the group comprising titanium, tantalum, hafnium, tungsten, niobium and zirconium, the superlattice generator element comprises one or more elements from the group comprising bismuth, scandium, yttrium, lanthanum, antimony, chromium, and thallium, and the anion comprises an element from the group comprising oxygen, chlorine, fluorine, and hybrids thereof. The layered superlattice material may also comprise a solid solution of two or more materials having the above formula. Preferably, the first substrate comprises an integrated circuit wafer. Alternatively, the first substrate comprises a support and the method further includes the step of sputtering the material from the support onto a second substrate, which preferably is an integrated circuit wafer.

In yet another aspect, the invention provides a method of fabricating a ferroelectric memory device, the method comprising the steps of: forming a first electrode on a substrate; forming a thin film of a layered superlattice ferroelectric material on the first electrode; and forming a second electrode on the ferroelectric material.

In still a further aspect the invention provides a method of fabricating an integrated circuit comprising the steps of: providing an integrated circuit wafer, a support, and a precursor comprising a metal carboxylate in a solvent; applying the precursor to the support to form a sputtering target; sputtering the target to form a layer of a chemical compound of the metal on the integrated circuit wafer; and completing the fabrication of the integrated circuit wafer to form a plurality of interconnected electrical devices on the wafer. Preferably, the chemical compound is a layered superlattice material.

The invention not only provides a reliable and consistent process for making high quality layered superlattice materials, but also provides an opening to a whole new integrated circuit fabrication technology. Numerous other features, objects and advantages of the invention will become apparent from the following description when read in conjunction with the accompanying drawings.

BRIEF DESCRIPTION OF THE DRAWINGS

FIG. 2A is a top view of a silicon wafer on which thin film capacitors according to the invention are shown greatly enlarged;

FIG. 2B is a portion of the cross-section of FIG. 2A taken through the lines 2B —2B, illustrating a thin film capacitor device having buffer layers according to the invention;

FIG. 2C is a cross-sectional illustration of a portion of a thin film capacitor according to the invention;

DESCRIPTION OF THE PREFERRED EMBODIMENT

Figure 1A:
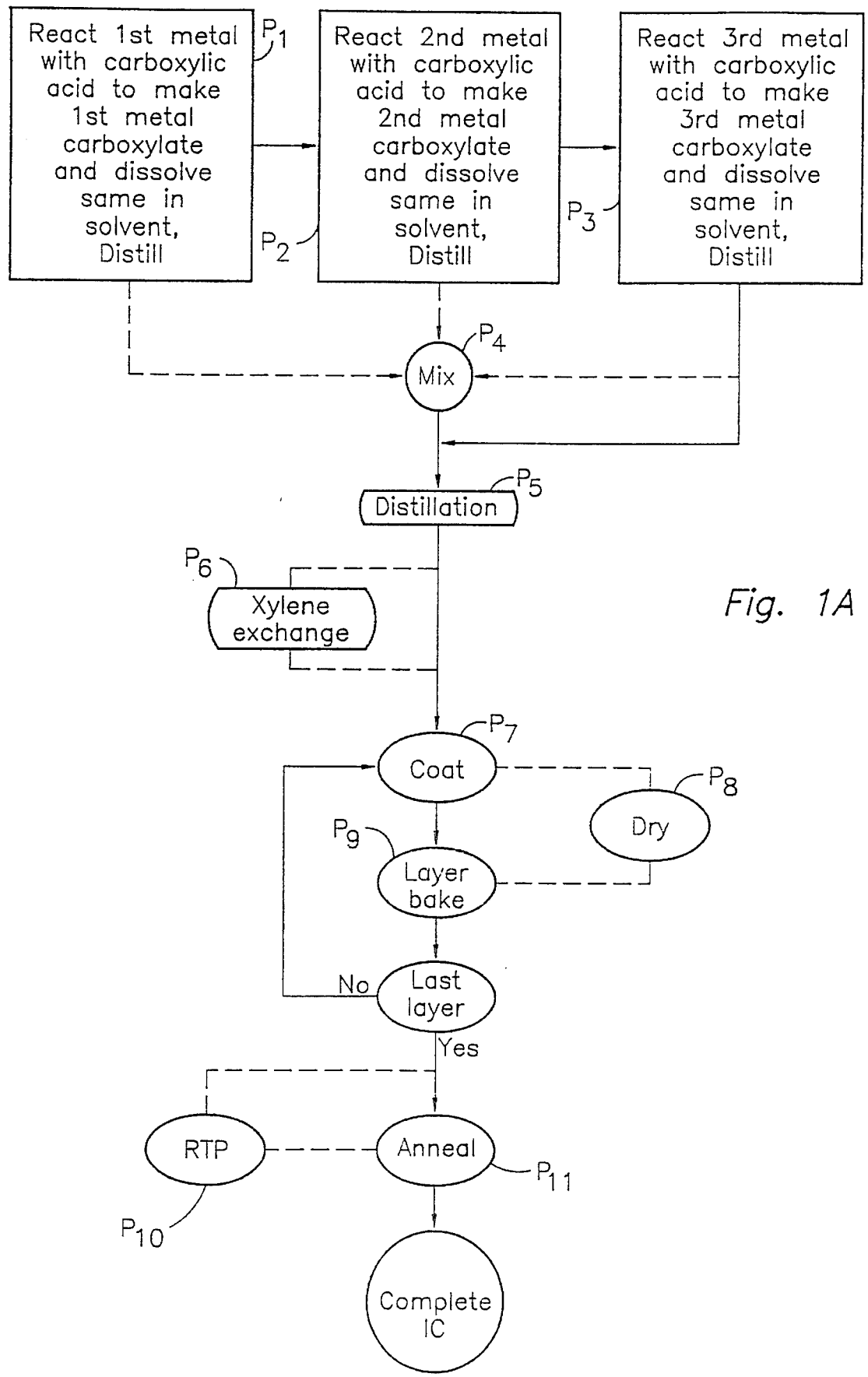
FIG. 1A is a flow chart showing the preferred embodiment of a process for preparing a thin film of a layered superlattice material according to the invention.

1. Overview.

In developing the processes of the invention, it was an goal to arrive at process that could be easily adapted to manufacturing and in which the end product, the thin films, were of high quality. Further, it was important that the process be standardizable and produce a high yield. It was also desirable that the process be compatible with conventional integrated circuit technology, such as silicon technology. As related above, it was known that the precursor should be one in which the organic groups forming the ligands which held the metal of the future film were relatively small so as to minimize the amount of organic material that had to be vaporized, and thus minimize the size of the pores and other microscopic defects in the film. Further, it was known that the solvent should have a relatively high boiling point so that it did not evaporate so quickly and violently as to cause microscopic damage to the film. An important factor in making such a process standardizable is that the precursor solutions have a relatively long shelf life. This has three aspects: first the precursors for the individual metals, such as strontium, tantalum, etc. should have a long shelf life so that one can readily select and mix solutions to produce any desired layered superlattice material; second, there should be a common solvent for all the precursors, so that they can be readily combined; third, the mixed precursor for a given layered superlattice material, such as strontium bismuth tantalate, should have a relatively long shelf life so that it can be made ahead of time in volume and used as needed. The above factors can conflict and thus the selection of process materials and parameters can be complex.

It is known that metal alkoxides generally produce good metal oxide thin films with little or no cracking, particularly when they are partially hydrolyzed immediately before deposition. For example, titanium isopropoxide is hydrolyzed by the following reactions:

(A) $Ti(OiPr)_4+H_2O \rightarrow Ti(OH)(OiPr)_3+HOiPr$ (B) $Ti(OH)(OiPr)_3+Ti(OiPr)_4 \rightarrow iPrOH+(iPrO)_3Ti\text{-}O\text{-}Ti(OiPr)_3$, where OiPr indicates the isopropoxide group, $Ti(OiPr)_4$ is titanium (tetrakis) isopropoxide, $Ti(OH)(OiPr)_3$ is titanium (tris) isopropoxide hydroxide, and HOiPR is isopropanol. The $(iPrO)_3Ti\text{-}O\text{-}Ti(OiPr)_3$ compound may react with another molecule of $Ti(OiPr)_4$ to form a Ti-O-Ti-O-Ti chain, etc. Thus the water initiates a reaction that partially polymerizes the metal oxide into long chains. This distributes the metal and oxygen in a way that is closer to the structure of the film that is desired to be produced, and results in denser films and prevents cracking.

Most metal alkoxides are soluble in 2-methoxyethanol and xylenes. However, short-chain metal alkoxides, such as ethoxides and propoxides, usually hydrolyse too readily to permit convenient handling and long term storage. These alkoxides will absorb ambient water from the atmosphere, which quickly hydrolyses some of the material and, over long periods, can lead to formation of precipitates as discussed below. A typical fast short-chain hydrolysis reaction is:

(C) $M\text{-}O\text{-}CH_2CH_3+H_2O \rightarrow M\text{-}O\text{-}H+HOCH_2CH_3$, where M is a metal ion, O is oxygen, C is carbon, and H is hydrogen. That is, the metal alkoxide plus water yields a metal hydroxide and an alcohol.

Longer chain metal alkoxides, such as 2-methoxyethoxides, hydrolyse more slowly because the long, bent hydrocarbon chain sterically obstructs attack on the metal-oxygen bond. An example of a longer chain hydrolysis reaction is:

(D) $M\text{-}O\text{-}CH_2CH_2OCH_3+H_2O \rightarrow M\text{-}OH+HOCH_2CH_2OCH_3$.

A moderately long, branched chain metal alkoxide hydrolyses even more slowly. Tert-butoxides and neopentoxides are useful metal precursors if slow hydrolysis is desirable and have the following reactions:

(E) $M\text{-}O\text{-}C\text{-}(CH_3)_3+H_2O \rightarrow M\text{-}OH+HOC(CH_3)_3$ (F) $M\text{-}O\text{-}CH_2\text{-}C\text{-}(CH_3)_3+H_2O \rightarrow M\text{-}OH+HOCH_2C(CH_3)_3$.

An upper limit on the size of the alkoxide ligands attached to the metal atoms which is to be partially hydrolyzed before deposition is determined by the fact that the very long-chain alcohols are generally less polar than the shorter chains and are correspondingly less miscible with water. If the alcohol produced in the reaction is immiscible with water, the hydrolysis water will separate from the solution. Should this occur, the water generally forms small droplets suspended in the alcohol/metal alkoxide solution. Gelation of the alkoxide continues, but only on the surfaces of the water droplets. Formation of small, pebble-like chunks of metal hydroxide and metal oxide proceeds fairly quickly on these water droplet surfaces.

Reactions such as described above that form precipitates also occur if water is present in hydrolyzable compounds over long periods. Thus solutions that are hydrolyzable have a longer shelf life if any water present after formation of the precursor is removed by distillation. For this purpose, the solvent used must have a boiling point higher than that of water. For this reason, xylenes and 2-methoxyethanol are preferred solvents, since water may be removed by distillation while the solvent/metal oxide precursor remains behind.

Short-chain metal carboxylates have been found to result in low porosity thin films, since the volume of hydrocarbon lost during thermal decomposition in the bake step is small as compared to the long-chain carboxylates. Short-chain metal carboxylates are also usually very polar and therefore are very water soluble, thus they do not separate when hydrolysis water is added to the solution. However, the high polarity also tends to make them insoluble in high boiling point solvents such as xylenes and 2-methoxyethanol. On the other hand, the longer-chain metal carboxylates, such as the neodeconates and 2-ethylhexanoates are generally all soluble in either 2-methoxyethanol and xylenes. However, they are not soluble in water. Thus the presence of any substantial amount of a metal neodeconate or a metal 2-ethylhexanoate usually will cause separation of the hydrolysis water and gelation of the alkoxide around the water droplets formed if hydrolysis is attempted. Further, since xylene is not soluble in water, xylene-solvated precursors cannot be deliberately hydrolyzed prior to deposition. Further, as discussed in the Background of the Invention section above, the prior art Miller patent indicates that the longer chain carboxylates, such as the hexanoates, contain too much organic material to produce good films.

Considering the above, it appeared that the only potential candidates for precursor solutions that might produce thin films that were of high quality on a microscopic basis were the metal alkoxides with intermediate length ligands. However, careful analysis of test results showed that while films made from metal neodecanoate solutions, which have ten carbon links in their chains, frequently bubble during post-deposition thermal treatment, films made from metal 2-ethylhexanoate solutions, which have eight carbon links in their chains, rarely bubble. Thus, it was postulated, that a medium-chain carboxylate, such as a 2-ethylhexanoate, may form the basis for a precursor solution that has a long shelf life and also produces a high quality thin film can be obtained.

As the examples below show, the above postulate has proved to be correct. It has been further found that 2-ethylhexanoates can be formed with nearly all metals that occur in layered superlattice materials. The alkali metals, such as sodium and potassium, and the alkaline earths such as strontium, barium, magnesium, and calcium, react directly with a carboxylic acid to form a metal carboxylate and hydrogen:

(G) $M + nHO_2CR \rightarrow M(O_2CR)_n + (\frac{1}{2})nH_2$, where n is an integer from 1 to 6 and is equal to the charge of the metal ion M, R is an alkyl group, and $M(O_2CR)_n$ is the metal carboxylate. In the reaction $H_2$, the hydrogen, boils out of the solution. If the alkyl group R is $CH(C_2H_5)C_4H_9$, then the carboxylic acid is 2-ethylhexanoic acid and the carboxylate is 2-ethylhexanoate. For other metals, a compound of the metal that will react with 2-ethylhexanoic acid or a 2-ethylhexanoate to form the metal 2-ethylhexanoate is generally readily available. If an alkoxide of the metal is available, that will be a good choice. The alkoxide will react with 2-ethylhexanoic acid as follows:

(H) $M(OR)_m + mHO_2C_8H_{15} + heat \rightarrow M(O_2C_8H_{15})_m + mHOR$, where R is the alkyl group, m is an integer, $M(OR)_m$ is the alkoxide, $HO_2C_8H_{15}$ is 2-ethylhexanoic acid, $M(O_2C_8H_{15})_m$ is the metal 2-ethylhexanoate, and HOR is an alcohol. The alcohol may be distilled away. If an alkoxide is not readily available, then one looks for a compound in which the metal is combined with a very electronegative anion, preferably an anion including oxygen. The nitrates ($NO_3$), acetates ($O_2C_2H_3$), sulfates ($SO_4$), and carbonates ($CO_3$) are preferable, and chlorides (Cl) also will work. Hydroxides (OH) sometimes also can be useful. For example:

(I) $M(NO_3)_m + m/2\ Ba(O_2C_8H_{15})_2 \rightarrow M(O_2C_8H_{15})m + m/2\ Ba(NO_3)_2$, where $M(NO_3)_m$ is a metal nitrate, $Ba(O_2C_8H_{15})_2$ is barium 2-ethylhexanoate, $M(O_2C_8H_{15})_m$ is the metal carboxylate of interest, and $Ba(NO_3)_2$ is barium nitrate. The barium nitrate precipitates from the solution which can be filtered to leave the metal carboxylate. As another example:

(J) $Bi_2(CO_3)_3 + 6\ HO_2C_8H_{15} + heat\ (slow) \rightarrow 2\ Bi(O_2C_8H_{15})_3 + 3\ CO_2 + 3H_2O$, which produces bismuth 2-ethylhexanoate [$Bi(O_2C_8H_{15})_3$] from bismuth carbonate and 2-ethylhexanoic acid. The $CO_2$ bubbles out of the solution. These reaction are simple ion-exchange reactions in which the most electronegative ion, such as $NO_3$, attaches to the most electropositive cation, such as Ba. Thus one can almost always find a suitable reaction to produce the desired metal carboxylate. The metal carboxylates do not react with water, and are very stable.

For only a few metals, the metal carboxylate does not always provide satisfactory thin films. Titanium is one such metal. While the above-described carboxylate process often works well with titanium, it has been found that in some solutions the films are not of the desired high quality. Unfortunately, the readily available alkoxide of titanium, titanium isopropoxide, hydrolyses readily, thus has a short shelf life. The solution is to react the titanium isopropoxide with 2-methoxyethanol to produce titanium 2-methoxyethoxide and isopropanol:

(J) $Ti(OiPr)_4 + 4\ HOC_2H_4OCH_3 \rightarrow Ti(OC_2H_4OCH_3)_4 = 4\ iPrOH$.

The isopropanol can be distilled out. Titanium 2-methoxyethoxide hydrolyses more slowly that titanium isopropoxide and thus has a longer shelf life. Further, the 2-methoxyethanol is an effective solvent for the fabricating process, and if it is desired, can easily be replaced by xylenes via the addition of xylene and the distillation out of the 2-methoxyethanol. The titanium 2-methoxyethoxide cures rapidly during the bake process, which can result in cracking. Thus it has been found that the best results are obtained if the titanium 2-methoxyethoxide is reacted with a small amount of 2-ethylhexanoic acid, preferably immediately prior to deposition, which replaces some or all of the 2-methoxyethoxide ligands by 2-ethylhexanoate, which slows down the curing and produces better films.

The highly electropositive elements, such as strontium, also present a special problem. The high electropositive quality tends to make the metal 2-ethylhexanoates of these elements, such as strontium 2-ethylhexanoate, highly polar. As mentioned above, high polarity compounds tend to be insoluble in non-polar solvents, such as xylenes. Thus strontium 2-ethylhexanoate tends to precipitate out of a pure xylene solvent during the deposition step. Such precipitation causes comet-like patterns to appear, resulting in a low-quality film. The addition to the mixture of a small amount of 2-methoxyethanol, n-butyl acetate, or other solvent having an increased affinity for the highly electropositive element, as a co-solvent eliminates this problem.

It has also been found that 1,4-dioxane may serve as a "backstop" solvent in difficult cases. Almost any inorganic material is soluble in 1,4-dioxane. Thus 1,4-dioxane may be used to get a recalcitrant material into solution. However, 1,4-dioxane has a boiling point of only 100° C., thus if used alone as a solvent in a precursor solution, the quality of the thin film is poor. However, if higher boiling point solvents, such as the heavy alcohols and ketones listed in Table A, or ethylene glycol and 2-ethylhexanoic acid are used as co-solvents, good thin films result.

It has also been found that the addition of n-butyl acetate as a co-solvent with the xylenes in many cases produces higher quality films.

Figure 1B:
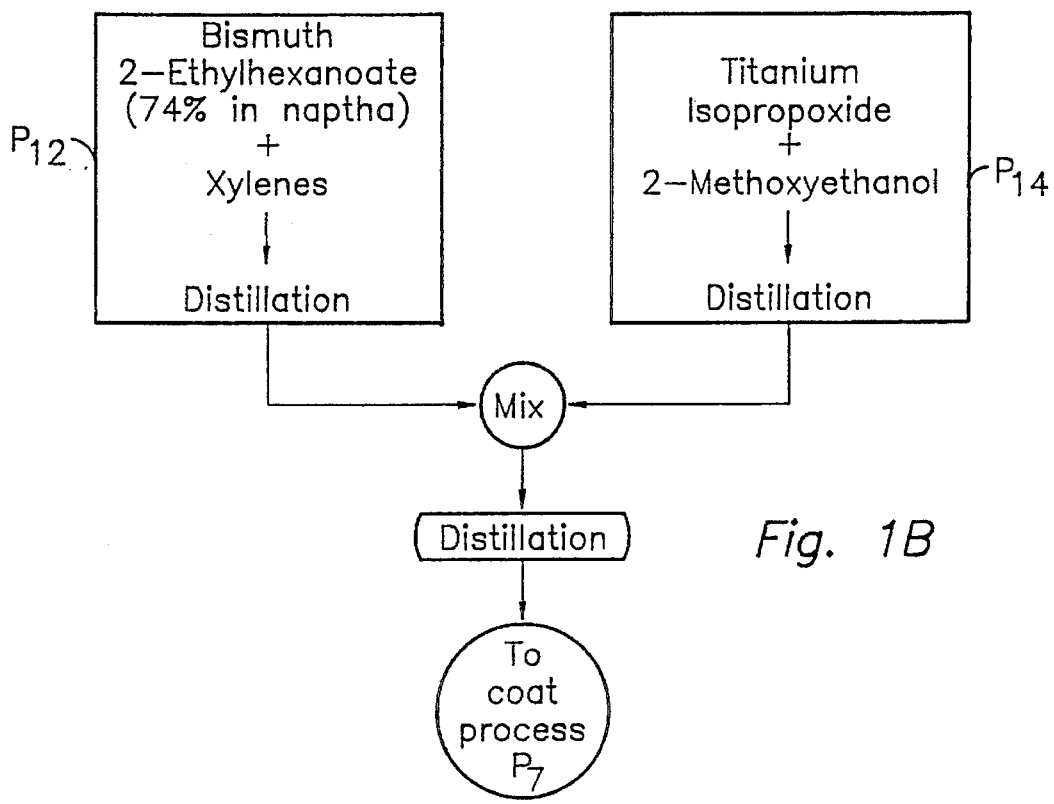
FIG. 1B is a flow chart showing an alternative preferred embodiment of the precursor solution formation portion of the process of FIG. 1A.
Figure 1C:
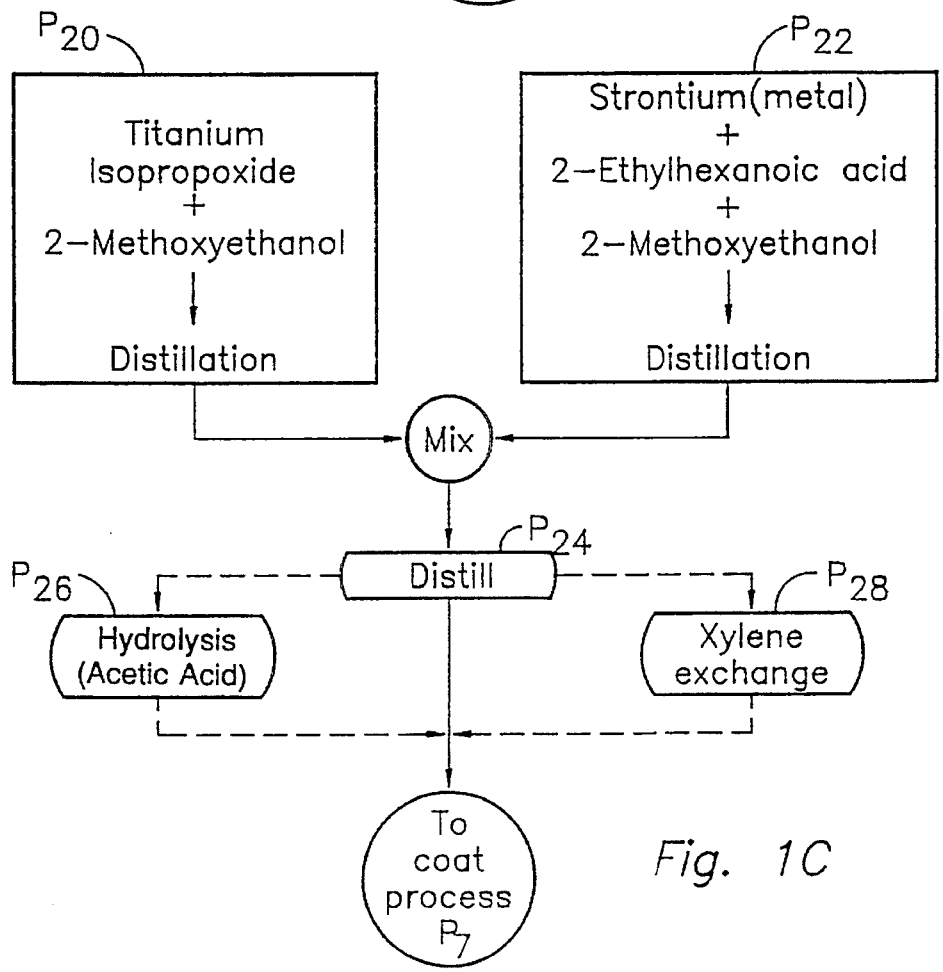
FIG. 1C is a flow chart showing an another alternative preferred embodiment of the precursor solution formation portion of the process of FIG. 1A.

2. Detailed Description of the Layered Superlattice Thin Film Fabrication Process Following the above reasoning a standardized process was derived by which high quality thin films of any layered superlattice material can be easily made from precursors having a long shelf life. This process is simple and relatively inexpensive, and thus lends itself to large scale manufacturing. The basic preferred process for fabricating layered superlattice thin films as may be incorporated into a integrated circuit is illustrated in FIGS. 1A, 1B, and 1C. Electrical devices that have been fabricated utilizing the process of the invention are shown in FIGS. 2A through 5. We shall first describe the electrical devices briefly, and then describe the process of the invention, relating it to the devices.

An exemplary wafer 1 on which test samples of capacitor devices according to the invention have been fabricated is shown in FIG. 2A. It should be understood that the FIGS.

Figure 2D:
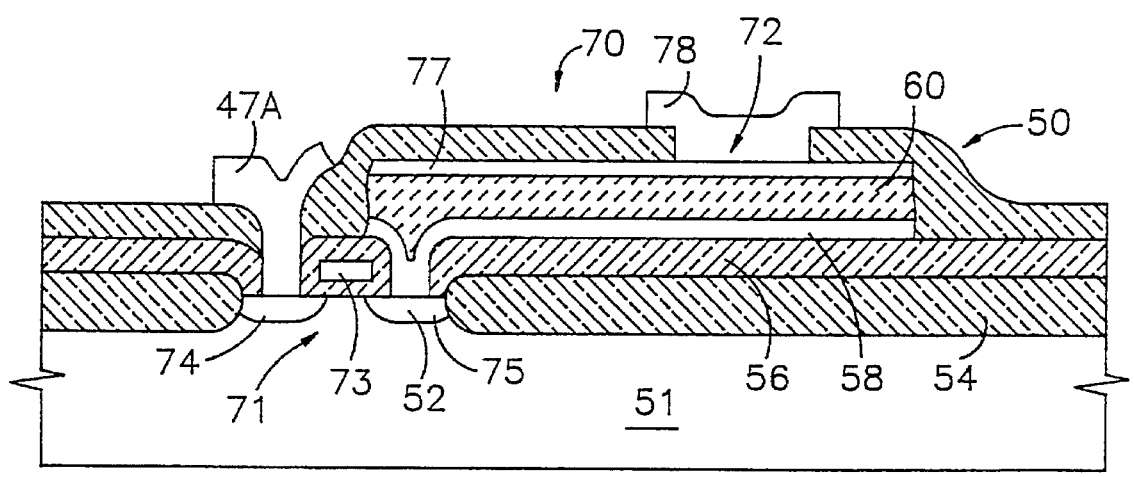
FIG. 2D is a cross-sectional illustration of a portion of an integrated circuit fabricated utilizing the process of the invention.

2A, 2B, and 2C depicting capacitor devices and FIG. 2D depicting an integrated circuit device are not meant to be actual plan or cross-sectional views of any particular portion of an actual capacitor or integrated circuit device, but are merely idealized representations which are employed to more clearly and fully depict the structure and process of the invention than would otherwise be possible. FIG. 2B shows a cross-section of the wafer 1 of FIG. 2A taken through the line 2B—2B. FIG. 2C depicts a similar cross-section taken through a wafer similar to that of FIG. 2A but having a different layered structure. Referring to FIGS. 2A and 2B, the wafer 1 preferably comprises a P-type silicon substrate 2 on which an approximately 5000 Å silicon dioxide insulating layer 4 has been wet grown. A thin layer 6 of titanium metal has been deposited on the silicon dioxide 4, preferably by sputtering in situ, and a 2000 Å thick electrode of platinum has been deposited on the titanium 6, preferably by sputtering in situ. By "in situ" is meant that both the titanium and the platinum are sputtered without breaking vacuum. The titanium diffuses into the silicon dioxide and platinum and assists the platinum 8 in adhering to the silicon dioxide 4, and is optional. A buffer layer 10, is deposited on the platinum electrode 8, followed by a layer 12 of a layered superlattice material according to the invention, followed by another buffer layer 14, via processes that will be described in detail below. Another 2000 Å layer of platinum is deposited on the buffer layer 14. The wafer 1 is annealed, patterned with a photo-mask process, and etched down to the electrode layer 8 to produce rectangular capacitor devices 17A, 17B, etc. (FIG. 2A) of various sizes separated by large areas of the electrode 8. The size of the devices 17A, 17B, etc. is greatly exaggerated in FIG. 2A. Each device 17A, 17B, etc. may be tested by connecting one lead of the test device to the platinum electrode layer 8 and contacting the other electrode layer 16 of the particular device 17A, 7B, etc. with a fine probe connected to the other lead of the test device. Devices having the cross-sectional structure of FIG. 2C are similarly fabricated except that the two buffer layers 10, 12 are not deposited. That is, the wafer of FIG. 2C includes a silicon substrate 22, a silicon dioxide layer 24, an optional titanium layer 26, a first platinum electrode 28, a layered superlattice material layer 30, and a second platinum electrode 32. The wafer 20 is similarly patterned to form capacitor devices of various sizes having the cross-section shown in FIG. 2C. The fabrication of exemplary devices of the types shown in both FIGS. 2B and 2C will be described in detail in the Examples below.

A portion of an integrated circuit wafer 50, i.e. a ferroelectric capacitor-based memory cell 70, that may be formed utilizing the process of the invention is shown in FIG. 2D. The wafer 50 includes a silicon substrate 51, field oxide areas 54, and two electrically interconnected electrical devices, a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47A and 78 make electrical connection to the devices 71, 72 to other parts of the integrated circuit 70. A detailed example of the complete fabrication process for an integrated circuit memory cell as shown in FIG. 2D is given in U.S. patent application Ser. No. 919,186, which is incorporated herein by reference. The detailed process for fabricating the layered superlattice ferroelectric layer 60 is given below.

The preferred process for fabricating a layered superlattice material in which there are three metallic elements is shown in FIG. 1A. The process begins by the formation of a liquid precursor. In each of steps P1 through P3 a metal compound is reacted with a carboxylic acid to form a metal carboxylate, which is dissolved in a solvent. The preferred carboxylic acid is one having a medium-length ligand, such as 2-ethylhexanoic acid, although others may be used. Preferably the solvent's boiling point should be within the range 110° C.–170° C. The preferred solvents are alcohols, such as 2-methoxyethanol, aromatic hydrocarbons, such as the xylenes, and esters, such as n-butyl acetate, though any of the solvents in Table A may be used.

TABLE A

| Solvent | Boiling Point |
|---|---|
| n-Butyl acetate | (bp = 126.5° C.) |
| N, N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1, 3, 5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |

The amounts of the metals used are usually proportioned so that an equivalent weight of each metal equal to the molecular weight of the metal in the stoichiometric formula for the desired layered superlattice material. An exception is lead. Generally an excess of lead of between 1% and 100%, preferably between 3% and 10%, of the equivalent stoichiometric amount is included because lead oxide has a higher vapor pressure than the other metals and a significant amount of lead evaporates as lead oxide during baking and annealing. Similarly, excess amounts of other materials, such as bismuth, thallium, and antimony, that evaporate or otherwise are lost in the process may be used. For bismuth the best results were obtained with 50% excess. In Example 1 below, an excess of titanium is noted in the $Bi_4Ti_3O_{12}$ material, however this was an accidental excess and is believed to be too small of an excess to make a significant difference, but is noted for completeness.

The steps P1, P2, and P3 are preferably performed by mixing the metal or other metal compound, such as a metal alkoxide, with the carboxylic acid and the solvent and stirring. Low heat of between about 70° C. and 90° C. may be added to assist the reaction and dissolving, but this is generally not necessary. The solid arrows indicate that generally, the chemist will perform all the steps P1, P2 and P3 in the same container; that is the first metal or metal compound, the first measure of carboxylic acid, and a first solvent are placed in a container, the metal or metal compound and carboxylic acid are reacted, and the reactant dissolved, the second metal or metal compound is then placed in the same container and additional carboxylic acid and solvent are added and stirred to react the second metal or metal alkoxide and dissolve the reactant, then the third metal or metal compound, third carboxylic acid, and third solvent are added, the metal or metal compound is reacted, and the reactant dissolved. In this process the most reactive metal or metal compound is preferably added first, the second most reactive metal or metal compound added second, and the least reactive metal or metal compound added last. It also may be desirable to perform the distillation step after each or some of the metal and/or metal compounds are reacted and dissolved. Alternatively, each metal and/or metal compound may be combined with a carboxylic acid and solvent, reacted, and dissolved in a separate container, the result distilled if desirable, and then the three separate solutions mixed in step P4. Variations and combinations of preparing the individual metal precursors separately or in the same container with or without distillation(s) may be used depending on the solvents used and the form in which metal element is readily available. In addition it should be understood that if the desired superlattice material includes only two metallic elements, then only two metals or metal compounds will be reacted and dissolved, and if the desired superlattice material includes four or more metallic elements, then four or more metals or metal compounds will be reacted and dissolved. Further, it is understood that any of the steps P1, P2, and P3 may be replaced by using a preprepared metal carboxylate.

When the solution of reacted and dissolved metal carboxylates has been prepared, the mixed precursor solution is then distilled in step P5 by heating and stirring the solution to reduce the solution to the desired volume and viscosity, which may depend on whether the solution is to be stored or used immediately, and/or to remove certain liquids. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired volume and viscosity are reached. It may be necessary to add the desired solvent several times in the distilling process to remove all undesired solvents and obtain the desired volume and viscosity.

Optionally, either separately or in combination with the steps P1 through P5, a xylene exchange step P6 is performed. In this step xylene is added and the other solvents are distilled away. This xylene exchange step P6 would generally be performed when the coating process P7 is one in which a xylene-based precursor is preferable. This may also depend on the personal preferences and experience of the person who performs the coating process P7. Although the xylene exchange is shown as a separate step P6, if it is known that the xylene-based precursor will be preferable, the xylene may be added with the other solvents in steps P1, P2, and/or P3 and the other solvents distilled away in the distillation step P5. Or, as shown by the dotted lines in FIG. 1A, the precursor may be stored after the distillation step P5, and the xylene exchange performed just prior to use. If it is not known at the time of preparing the precursor solution whether or not a xylene-based solution will be preferable, then the xylene exchange should not be done since the xylene generally has a higher boiling point than the other solvents used in steps P1, P2, and P3 and therefore removing it in favor of the other solvents is difficult.

As described in example 3 below, it has recently been found that the addition of n-butyl acetate as a co-solvent just prior to the coating step P7 often results in superior films.

In step P7 the precursor solution is then applied to a wafer, such as the wafer 1 in FIG. 2B, the wafer 20 in FIG. 2C, or the wafer 50 in FIG. 2D. In the case of wafer 20, the substrate 2 and the layers 4, 6, and 8 will be already formed at the time of coating in step P7 to form layer 10. Then the process of FIG. 1A may be used to form layers 12 and 14. Similarly, in the case of wafer 20, the substrate 22, and the layers 24, 26, and 28 will be formed, and in the case of wafer 50, the substrate 51, the doped areas 52, and the layers 54, 56, and 58 will be formed prior to the coating step P7 in which the layers 30 and 60, respectively, are deposited. Preferably the coating step P7 may be either a mist deposition at ambient temperature in a vacuum as described in the first embodiment in U.S. patent application Ser. No. 660, 428, which is incorporated herein by reference, or it may be a spin deposition, which is a well-known form of deposition in which the precursor is placed on a wafer and the wafer is spun to evenly distribute the precursor over the wafer. Preferably the wafer is spun at a spin rate of between 750 RPM and 6000 RPM for a period of 5 seconds to a minute, with these parameters depending on the concentration and viscosity of the solution being applied and the desired thickness of the resulting layer. In general the xylene exchange P6 is performed in preparing the precursor solution if the spin coating method is used, and the xylene exchange P6 is not performed if the mist deposition is used. After the coating process, the wafer 1, 20, 50 is transferred to a hot plate in which it is baked as indicated at P9. Alternatively, an oven may be used in the baking if it is desirable to control ambients. Preferably, the baking is at a temperature in the range of 200° C. and 400° C. for a time period between 30 seconds and 15 minutes. Optionally, a drying step P8 may be preformed between the coating and bake steps. The drying will generally comprise a heating on a hot plate or in an oven for from about 30 seconds to a few minutes at a lower temperature than the bake step. Preferably, the drying is performed at about 150° C. If the initial coating and bake steps do not result in a layer, such as 30 in FIG. 2C, that is as thick as desired, then the coating P7, optionally the drying step P8, and the baking step P9 are repeated until the desired thickness is obtained. After the last layer is coated and baked, the wafer is placed in a diffusion furnace and the layered superlattice material is annealed at step P11. Preferably, the annealing is performed in an oxygen atmosphere at ambient pressure with a flow rate of about 3 liters to 6 liters per minute, and at a temperature of between 600° C. and 850° C. for a time period of between 5 minutes and three hours. The temperature is preferably ramped upward in steps over this period. Optionally, the wafer may be annealed in a rapid thermal process (RTP) step P10 prior to the diffusion furnace anneal step P11. The RTP step utilizes a halogen light source to raise the wafer rapidly to a high temperature in the range from 500° C. to 850° C. for an anneal time of between 15 seconds and 3 minutes. After the annealing P11, the rest of the wafer 1, 20, or 50 is completed.

For those metals for which the metal carboxylates do not yield a good thin film, a variation of the above process is utilized. In this variation preferably a metal alkoxide rather than a metal carboxylate precursor is employed. Preferably an alkoxide is chosen that has a medium-length ligand, so that the precursor has a long shelf life and does not produce precipitates. Preferably, the alkoxide is one that is an effective solvent for the fabricating process, and if it is desired, can easily be replaced by xylenes via the addition of xylene and distillation. As discussed above, 2-methoxyethanol is such an ideal alkoxide. When the precursor is a metal alkoxide it is also very important that all the water be distilled out of the solution before it is stored.

An example of the above variation of the process of FIG. 1A to produce a bismuth titanate ($Bi_4Ti_3O_{12}$) thin film is shown in FIG. 1B. This variation is the same as the precursor solution formation portion of the process of FIG. 1A, except that the reaction and dissolving of the titanium in step P14 does not involve a carboxylic acid. In step P14 titanium isopropoxide is reacted with 2-methoxyethanol to produce titanium 2-methoxyethoxide, isopropanol and water, and the isopropanol and water are distilled off. In step P12 the bismuth metal, bismuth carbonate, or bismuth oxide has already been reacted with a carboxylic acid, i.e. 2-ethylhexanoic acid, to form bismuth 2-ethylhexanoate, a metal carboxylate. Bismuth is readily available commercially in this form. The process of FIG. 1B is the process used to produce the bismuth titanate to produce the samples described below in the discussion of Example 1. However, some combination of the processes of FIG. 1A and 1B by using various amounts of 2-ethylhexanoic acid and 2-methoxyethanol in step P14 may also be used to produce bismuth titanate. The 2-methoxyethoxide ligands are more heat sensitive than 2-ethylhexanoate ligands, and the deposition and film shrinkage process may proceed so rapidly that cracking and other defects may occur. Therefore, small amounts of 2-ethylhexanoic acid are added to replace some or all of the 2-methoxyethoxide ligands by 2-ethylhexanoate ligands in the titanium solution just prior to coating. The 2-ethylhexanoate ligands are less thermally sensitive and slow down the deposition and thermal decomposition process, usually producing better results.

FIG. 1C shows another variation of the precursor solution formation process portion of FIG. 1A. In the process of FIG. 1C, the step P20 is the same as the step P14 of FIG. 1B, and the step P22 is the same as one of the steps P1 through P3 in FIG. 1A: that is, a metal, strontium, a carboxylic acid, 2-ethylhexanoic acid, and a solvent, 2-methoxyethanol, are combined to produce a metal carboxylate, strontium 2-ethylhexano-ate, dissolved in a solvent, 2-methoxyethanol. In FIG. 1C optional steps of hydrolysis P26 and xylene exchange P28 are shown after the step of distilling P24. The xylene exchange step was discussed above in connection with step P6 of FIG. 1A. The hydrolysis step involves adding water to the solution to react with the metal alkoxide, i.e. titanium 2-methoxyethoxide, to partially polymerize the metal oxides into chains. This is sometimes useful to prevent the film from cracking after deposition. The acetic acid is optional and slows the rate of hydrolysis to prevent solids from forming and precipitating during hydrolysis. A distillation process is usually done as the final step of the hydrolysis P26. The process of FIG. 1C including the xylene exchange step P28, but not the hydrolysis step P26, was the process used in preparing the strontium titanate ($SrTiO_3$) solution to form the layers 10, 14 of the device of FIG. 2B as described below in Examples 1 and 2.

Figure 3:
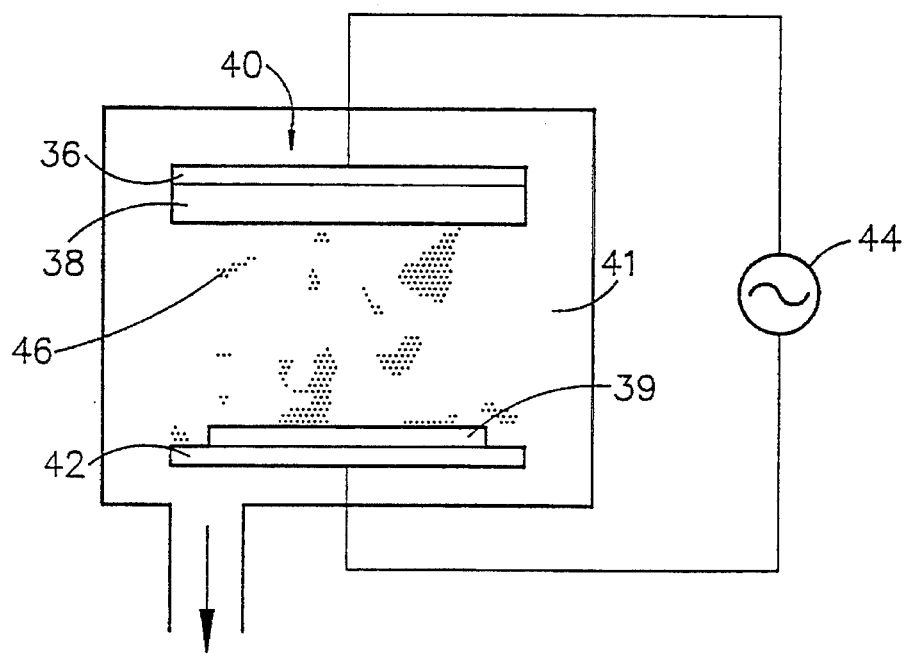
FIG. 3 illustrates the process of sputtering a thin film of a layered superlattice material according to the invention.

While the preferred process is to apply the precursor directly to the integrated circuit wafer or other substrate on which the end device is fabricated, this is not necessary. The precursor may instead be applied to first substrate in accordance with the above process, and then sputtered onto a second substrate. This process is illustrated in FIG. 3. The precursor is applied to a first substrate 36 in the above-described process to form a film 38 of the desired material. Since the first substrate 36 is not the final substrate on which the material will be deposited, problems of cracking, porosity, shrinking etc. are not as significant, and a wider variety of precursors may be used following the guidelines discussed in the Overview section above. Generally the coat through bake steps, P7 through P9 (FIG. 1A), will be repeated a number of times to form a relatively thick film 38. The first substrate is preferably a conductive support 36. The second substrate 39 is preferably a silicon or other integrated circuit wafer as described in connection with FIGS. 2A through 2D. The film 38 on its support 36 becomes the target electrode 40 in the sputtering process which takes place in sputtering chamber 41. The second substrate 39 is placed on the deposition electrode 42. A voltage source 44 is applied between the electrodes 40 and 42, and an inert gas plasma 46 is struck. Positive ions from the plasma 46 strike the target material 38 with sufficient energy to strip off atoms or molecules of the target material 38. Vacuum pumps are used to reduce the pressure in the sputtering chamber 41 so that the atoms or molecules make no or only a few collisions with each other before striking a surface, to which they stick. Most will follow the line of sight from the target electrode 40 to the wafer 39. Wafer 39 is generally heated to a temperature of between 200° C. and 750° C. Because of the nature of the sputtering process, significant excess amounts of elements which tend to form low vapor pressure compounds must be used even beyond the excess amounts used in the direct spin coating and misted deposition processes. For example, for bismuth, lead, thallium, and antimony, as much as 100% excess may be necessary to provide the best results. The amount of the excess will depend on the particular sputtering process and sputtering system used. Sputtering is a well-known process, that can be applied to almost any material, and thus we shall not describe it further here. In the above discussion "sputtering" is understood to mean any one of a spectrum of related processes, including DC sputtering, RF sputtering, magnetron sputtering, reactive sputtering, bias sputtering, and ion beam deposition.

The high-quality thin films produced by the above-described processes have led to the discovery that a class of materials that have never before been successfully utilized in non-volatile ferroelectric switching memories, in ferroelectric switching capacitors, or as high dielectric constant materials in volatile memories, are considerably superior to all previous materials used in such applications. In particular these materials exhibit low fatigue in switching applications, little or no imprinting, little change in the polarizability with film thickness, long retention of polarization charge even under high stress conditions, a high dielectric constant with low leakage current, and are compatible with, or can be designed to be compatible with, the other materials commonly used in integrated circuits, such as silicon and gallium arsenide.

The class of materials are those disclosed by Smolenskii as having a layered perovskite-like structure, as discussed in the Background of the Invention. It has been realized that these materials are more than a substance which spontaneously forms in layers. This is seen most easily by an example. Strontium bismuth tantalate ($SrBi_2Ta_2O_9$) can be considered to be a combination of a material having the formula $Bi_2O_3$ and a material having the formula $SrTa_2O_6$. $SrTa_2O_6$ has a tungsten bronze structure by itself, but within the layered material 92 has a perovskite structure. Thus the layered structure is in reality a superlattice in which the structures of the individual sublattices of the perovskite layers 94 and the non-perovskite layers 96 are interdependent. Hence we refer to these materials herein as "layered superlattice" materials.

The layered superlattice materials of the invention which are ferroelectric can be defined as: (A) a material having a localized structure, within a grain or other larger or smaller unit, which localized structure contains predominately repeatable units containing one or more ferroelectric layers and one or more intermediate non-ferroelectric layers spontaneously linked in an interdependent manner. The invention also includes materials that are not ferroelectric, and these can be included in the following definition: (B) a material having a localized structure, within a grain or other larger or smaller unit, which localized structure contains predominately repeatable units containing one or more perovskite-like layers and one or more intermediate non-perovskite-like layers spontaneously linked in an interdependent manner.

Figure 12A:
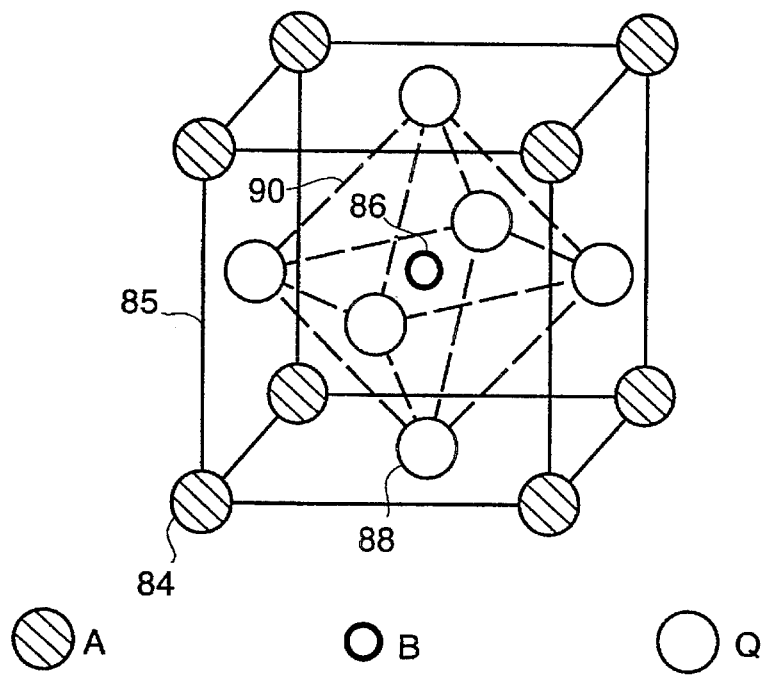
FIG. 12A illustrates the perovskite primitive unit cell.
Figure 12B:
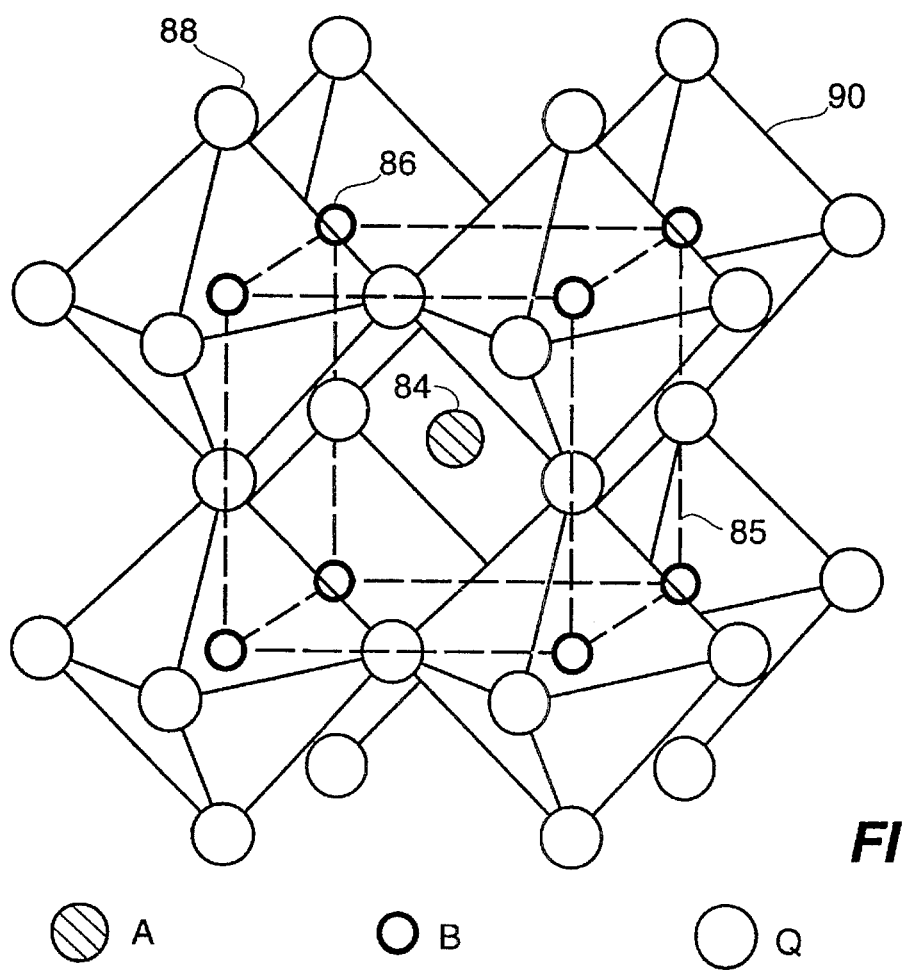
FIG. 12B illustrates another perovskite unit cell which is more useful for describing the invention.
Figure 13:
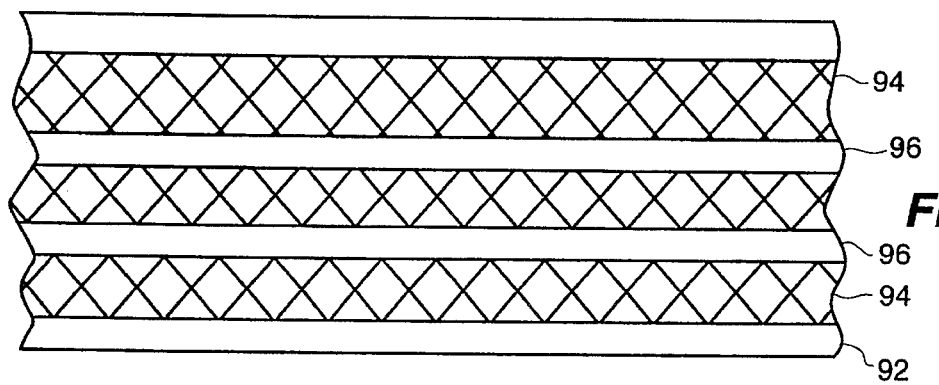
FIG. 13 illustrates a layered superlattice material according to the invention.
Figure 14:
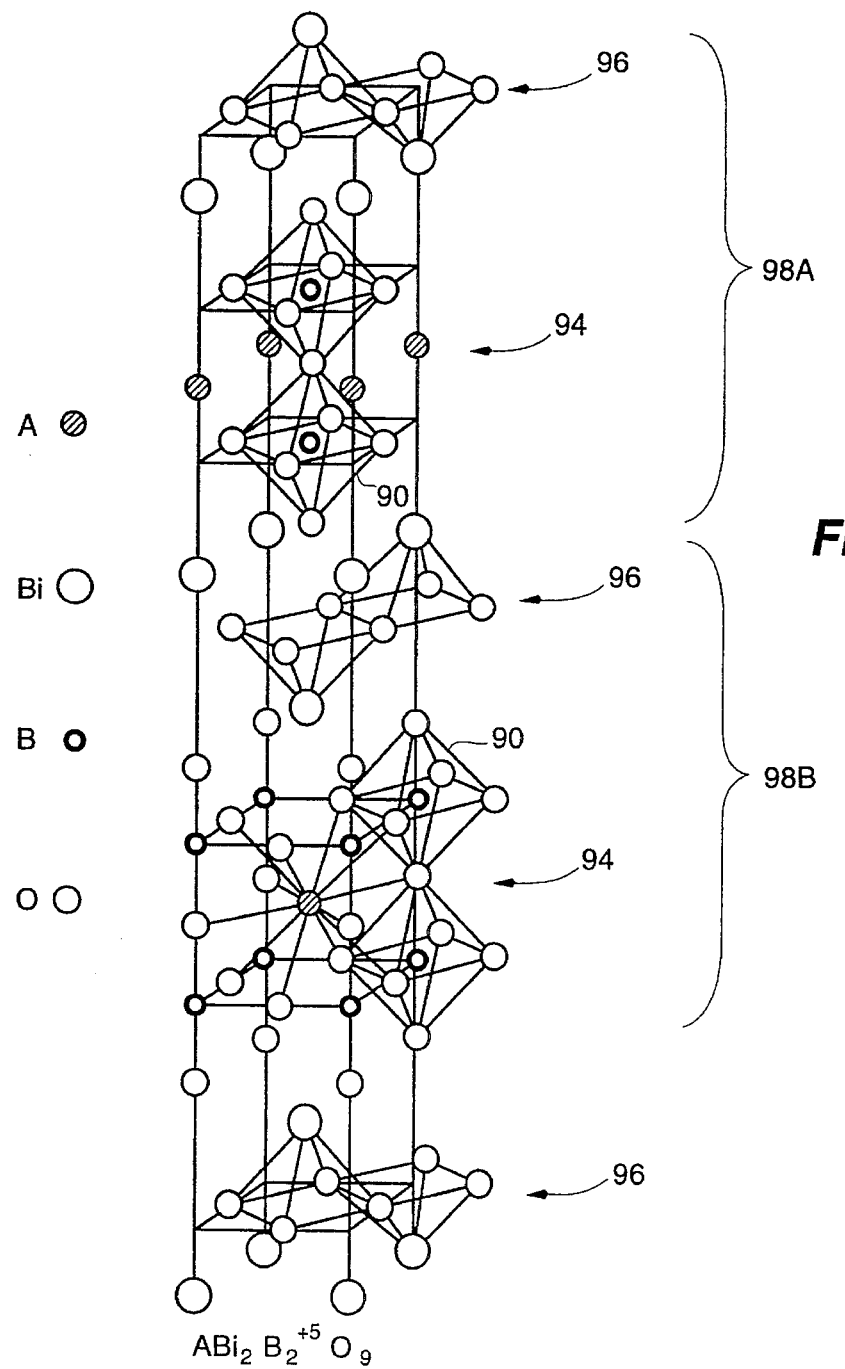
FIG. 14 shows the specific lattice structure for an $ABi_2B_2^{+5}O_9$ layered superlattice material.
Figure 15:
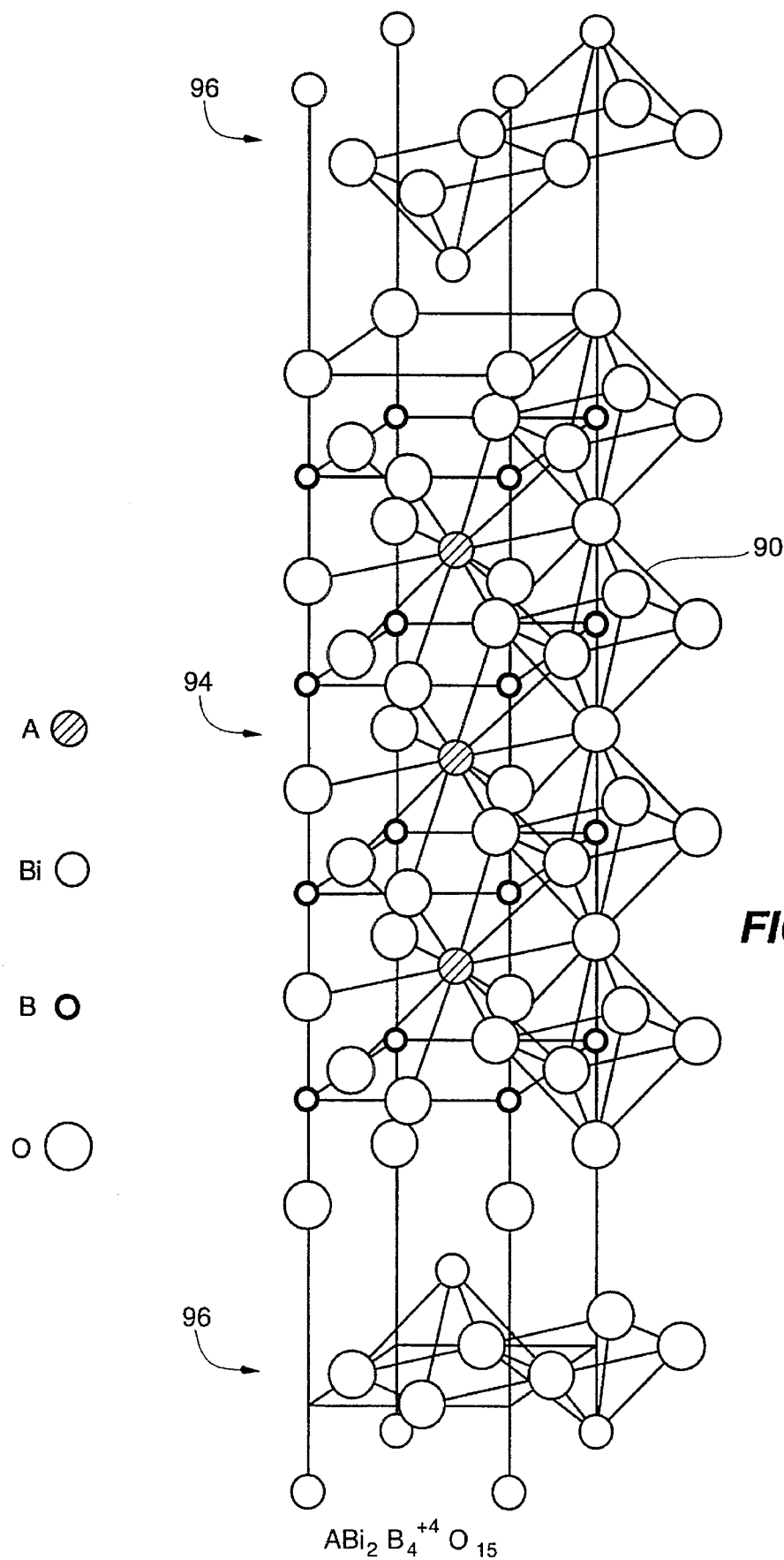
FIG. 15 shows the specific lattice structure for an $ABi_2B_4^{+4}O_9$ layered superlattice material.

It is well-known that compounds having the perovskite structure may be described in terms of the general formula $ABQ_3$, where A and B are cations and Q is an anion. In the prior art, the formula $ABQ_3$ is usually represented as $ABO_3$, or sometimes $ABX_3$, but we shall use $ABQ_3$ since it is more general than $ABO_3$ and the X may cause confusion with other x's that are used in the most general formula for a layered perovskite. A primitive perovskite unit cell as conventionally represented in the literature is shown in FIG. 12A. In terms of this depiction of the unit cell, the perovskite primitive structure is cubic, with the A cations 84, also called the A-site elements, located at the corners of the cube and generally being elements of relatively large size and small valence, and with the B cations 86, also called the B-site elements, located at the center of the cube and generally being elements of relatively small size and large valence, and the anions 88, located at the face centers of the cube. Another depiction of the perovskite unit cell, which is not a primitive cell but is more useful for purposes of the invention, is shown in FIG. 12B. In this depiction it is more obvious that the perovskite structure comprises corner-linked octahedrons 90, with the artions 88 at the corners of the octahedrons 90, the B cations 86 being at the centers of the octahedrons 90, and the A cations 84 in the spaces between the octahedrons 90. A cube 85 is shown by dotted lines in FIG. 12B to more clearly show the relationship of the atoms, and the octahedron 90 is shown by dotted lines in FIG. 12A. From the depiction of the unit cell in FIG. 12B, it is easy to see how the octahedrons 90, which each have a dipole moment which causes the ferroelectric character of the material, might be able to move slightly as the polarization switches if their upper and lower "points" were attached to a material more flexible than the lattice of a ferroelectric material. Turning to FIG. 13, a layered superlattice material 92 is illustrated. Smolenskii recognized that what we call the layered superlattice materials spontaneously form into layers 94 with a perovskite-like structure which alternate with layers 96 having a simpler structure. Depending on the material, the perovskite-like layers 94 may include one or a plurality of linked layers of perovskite-like octahedrons 90. As an example, FIG. 14 shows a unit cell of the material $ABi_2B_2^{+5}O_9$, which is the formula for strontium bismuth tantalate ($SrBi_2Ta_2O_9$) and other layered superlattice materials, such as tantalum, niobium, and tungsten, having a element with a valence of +5 in the B-site. In this structure, each perovskite-like layer 94 includes two layers of octahedrons 90 which are separated by layers 96 of a material that does not have a perovskite-like structure. In this material the primitive unit cell consists of two perovskite layers 94 and two non-perovskite layers 96, since the structure shifts between the layers 98A and 98B. In FIG. 15 the structure for a layered superlattice material having the formula $ABi_2B_4^{+4}O_{15}$, which is the formula for strontium bismuth titanate ($SrBi_4Ti_4O_{15}$) and other layered superlattice materials having an element, such as titanium, hafnium, and zirconium, having a valence of +4 in the B-sites. In this material each the perovskite-like layer 94 has four layers of octahedrons 90.

It has been discovered that the layered superlattice materials catalogued by Smolenskii et al. are all likely candidates for fatigue free switching ferroelectrics and dielectric materials that are resistant to degradation and breakdown over long periods of use. Rather than being random solid solutions following the general formula $ABO_3$, these materials follow the formulae outlined by Smolenskii:

(I) compounds having the formula $A_{m-1}Bi_2M_mO_{3m+3}$, where A=$Bi^{3+}$, $Ba^{2+}$, $Sr^{2+}$, $Ca^{2+}$, $Pb^{2+}$, $K^+$, $Na^+$ and other ions of comparable size, and M=$Ti^{4+}$, $Nb^{5+}$, $Ta^{5+}$, $Mo^{6+}$, $W^{6+}$, $Fe^{3+}$ and other ions that occupy oxygen octahedral; this group includes bismuth titanate, $Bi_4Ti_3O_{12}$;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$. It is noted that in the case of $Sr_2Nb_2O_7$ and $La_2Ti_2O_7$ the formula needs to be doubled to make them agree with the general formula.

The materials of the invention include all of the above materials plus combinations and solid solutions of these materials. The materials may be summarized more generally under the formula:

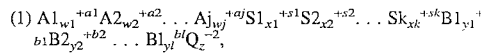

where A1, A2 . . . Aj represent A-site elements in the perovskite-like structure, which may be elements such as strontium, calcium, barium, bismuth, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either or the sites and the superlattice generator can have multiple elements. The value of z is found from the equation: ( (2) (a1w1+a2W2 . . . +ajwj)+(s1x1+s2x2 . . . +skxk)+(b1y1+b2y2 . . . +bjyj)=2z.

Formula (1) includes all three of the Smolenskii type compounds: for the type I material, w1=m−1, x1=2, y1=m, z=3m+3 and the other subscripts equal zero; for the type II material, w1=m+1, y1=m, z=3m+1, and the other subscripts equal zero; for the type III material, w1=m, y1=m, z=3m+2, and the other subscripts equal zero. It is noted that the Smolenskii type I formula does not work for M=Ti and m=2, while the formula (1) does work. This is because the Smolenskii formula does not consider valences. The materials according to the invention do not include all materials that can be fit into formula (1), but rather only those materials that spontaneously form layered superlattices. In summary, the materials of the invention include all the materials as described by the definitions (A) and (B) above, the Smolenskii formulas, and the formula (1), plus solid solutions of all the foregoing materials.

3. Examples of The Fabrication Process and Ferroelectric and Dielectric Properties For Specific Layered Superlattice Materials As mentioned above, a detailed example of the fabrication process for an integrated circuit memory cell as in FIG. 2D is given in U.S. patent application Ser. No. 919,186. Eight examples of the process of fabricating a layered superlattice material and capacitor devices as shown in FIGS. 2A through 2C are given below. Each is preceded by a table listing the reactive components utilized in the fabrication process and each is followed by a description of the ferroelectric and/or the dielectric properties as appropriate. The solvents used are described in a description of the process following each table. In the tables, "FW" indicates formula weight, "g" indicates grams, "mmoles" indicates millimoles, and "Equiv." indicates the equivalent number of moles in solution. "Xylenes" indicates a commercially available xylene solution which includes three different fractionations of xylene. Bismuth 2-ethylhexanoate indicates a commercially available bismuth solution of bismuth 2-ethylhexanoate in 74% naphtha; the formula weight in this case is placed in parenthesis to indicate that it is an equivalent formula weight of bismuth in the solution as a whole, rather than the formula weight of the just the bismuth 2-ethylhexanoate, in order to take into account the presence of the naphtha. All processes were performed at the atmospheric pressure in Colorado Springs, Colorado, except where otherwise noted. In the examples below, all the initial wafer substrates on which the materials described were fabricaed were layered substrates as illustrated by layers 2, 4, 6, and 8 in FIG. 2B or layers 22, 24, 26, and 28 in FIG. 2C, with the silicon substrates 2, 22 being made of P-type silicon of between 5 Ohms/cm and 25 Ohms/cm resistivity, having a field oxide layer 4, 24 that was wet grown to about 5000 Å, a 200 Å thick layer 6, 26 of sputtered titanium, and a 2000 Å, layer 8, 28 of sputtered platinum. After the layers 10, 12, 14 and 16, for the samples that had buffer layers, or the layers 30 and 32 for the samples that did not have buffer layers, were deposited as described in the examples, the wafer was patterned as illustrated in FIG. 2A using either a positive or negative photo resist in combination with a photo mask step. When a positive photo resist is indicated in an example, the resist is spun on at 5000 RPM, soft-baked on a hot plate at 95° C. for 2 minutes, followed by a standard photo mask process having a 7 second UV exposure, a 1 minute development and 1 minute water rinse, and a 5 minute hard bake at 140° C. When a negative photo resist is indicated in an example, the negative resist is spun on at 5000 RPM, soft-baked on a hot plate at 90° C. for 5 minutes, followed by a standard photo mask process utilizing a 4 second UV exposure, a 1 minute development and 1 minute water rinse, and a 5 minute hard bake at 140° C. When an IPC strip is indicated, this is an oxygen plasma strip using an Ion Plasma Corporation "barrel etcher" at 500 mTorr oxygen and 350 watts. When an rapid thermal process (RTP) is indicated, the process was done with an AG Associates model 410 Heat Pulser, the ramp rate given is for the period of increasing the temperature to the working temperature, and the time period given is the time for which the temperature was held at the working temperature. In all cases an oxygen flow of 3 liters/minute is used in the RTP anneals.

In each of the examples, following the description of the process of making the device with the particular material, there is a discussion of the electrical properties illustrated in the figures. In each figure, the material of the sample, the thickness of the sample, and other relevant parameters are given. The thickness is usually approximate since, as in all layering type processes, the thickness can vary, and it was not measured for each portion of the wafer. For some samples, the given thickness is based on the known thickness that results from the processing parameters; the measurements of thickness that were done confirmed that the thicknesses did not vary sufficiently from that determined from the process parameters to alter the results significantly. The figures include hysteresis curves, such as FIG. 5A, PUND switching curves, such as FIG. 7C, material endurance or "fatigue" curves such as FIG. 4C and FIG. 5C, and leakage current curves, such as FIG. 8G. The hysteresis curves are given in terms of the applied electric field in kilovolts per centimeter versus the polarization in microcoulombs per centimeter squared, except for those of FIGS. 6D, 8D and 8E where the abscissa is in volts. As is well-known, hysteresis curves which suggest good ferroelectric properties tend to be relatively boxy and long in the direction of polarization, the ordinate in the figures herein, as for example the curve in FIG. 7A, rather than thin and linear, as the curves in FIG. 4B. The hysteresis measurements were all made on an uncompensated Sawyer-Tower circuit unless otherwise noted. The PUND switching curves are given in terms of current in amps along the ordinate versus time in nanoseconds along the abscissa, except for those of of FIGS. 18, 20, and 22A through 23D, where the ordinate is in Amps/cm$^2$. The PUND curves are generated in a well-known manner by first initializing the sample with a pulse in the negative direction, then measuring the current through a small resistance, typically 50 ohms in the tests herein, for a series of four voltage pulses that give the measurement its name: a positive (P) pulse, a second positive of up (U) pulse, a negative (N) pulse, and then another negative or down (D) pulse. All pulses have the same absolute amplitude. The initial negative pulse makes sure the material starts with a negative polarization. The first positive, "P", pulse therefore switches the material to a positive polarization. Since the sample is already polarized positively, the second, or "U", pulse measures the change between the residual polarization and the saturated polarization in the positive direction. Likewise the "N" pulse measures the negative switching current, and the "D" pulse measures the change between the residual polarization and the saturated polarization in the negative direction. For a standard architecture of a memory cell (but not for all architectures) the PUND curves indicate the suitability of the material for a non-volatile ferroelectric switching memory application. Generally, it is desirable that the "P" and "N" curves are well-separated from the "U" and "D" curves, respectively, which provides a large signal in the standard architecture. It is also desirable that all the curves fall quickly to a low value; a curve that falls quickly indicates that the material completes the current flow, which produces the signal, quickly, that is, it is a "fast switching" material. Generally, in the tests herein, the switching time is taken to be the time to fall to a value of 10% of the maximum amplitude, since this 10% level will generally be within the noise level of a typical integrated circuit. The endurance or "fatigue" curves give the polarization, one of either $P_r^+$, $P_r^-$, Prp or Prn, in microcoulombs per square centimeter versus the number of cycles. These curves are of two types: one type, such as FIG. 4C, is taken from the polarizabilities measured in a hysteresis measurement, and the other type, such as FIG. 5C, is taken from the polarizabilities measured in a PUND switching test. The leakage current curves, such as FIG. 8G are given in terms of the applied electric field in kilovolts per centimeter as the abscissa versus the log of the current in amps per square centimeter. It is necessary to use the log of current because the curves are measured over an extremely wide range of currents. A leakage current of $10^6$ amps per square centimeter or less is considered excellent for dielectric applications. However, it should be kept in mind that for a given material the leakage current can be decreased simply by making the material thicker, and will be increased if the material is made thinner. Thus the thickness of the material on which the measurement is made must be considered. In state-of-the-art high-density CMOS integrated circuits, the dielectric layers range from about 100 Å for the capacitor dielectric in DRAM capacitors to about 15,000 Å for passivation layers.

EXAMPLE 1

Bismuth Titanate Between Buffer Layers of Strontium Titanate - $SrTiO_3/Bi_4Ti_3O_{12}/SrTiO_3$ The compounds shown in Table I were measured.

TABLE I

| Compound | FW | g | mmole | Equiv. |
|---|---|---|---|---|
| Bismuth 2-ethylhex- anoate | (638.61) | 21.2578 | 24.6328 | 4.00000 |
| Titanium Isopropoxide | 284.26 | 5.2517 | 18.4750 | 3.00006 |
| Strontium | 87.62 | 2.8023 | 31.982 | 1.0000 |
| 2-ethylhexanoic acid | 144.21 | 9.2283 | 63.992 | 2.0009 |
| Titanium Isopropoxide | 284.26 | 9.0912 | 31.982 | 1.0000 |

The bismuth 2-ethylhexanoate was placed in 90 ml xylenes. The solution was stirred and heated to a maximum temperature of 117° C. to distill out all light hydrocarbon fractions and water. The first measure of titanium isopropoxide was combined with 60 ml of 2-methoxyethanol, and was stirred and heated to a maximum temperature of 116° C. to distill out all water and isopropanol. The bismuth solution and the titanium solution were combined, then heated to a maximum temperature of 136° C. to distill out all 2-methoxyethanol and some xylenes until 60 ml of solution remained. The concentration was 0.1206 moles of $Bi_4Ti_3O_{12}$ per liter with 0.002% excess titanium.

The strontium was placed in the 2-ethylhexanoic acid together with 50 ml 2-methoxyethanol. The solution was stirred and heated to a maximum temperature of 115° C. to distill off all light hydrocarbon fractions and water. The second measure of titanium isopropoxide was dissolved in 50 ml methoxyethanol and stirred and heated to a maximum of 115° C. to distill off the isopropanol and water. The strontium and titanium solutions were combined and stirred and heated to a maximum temperature of 125° C. to distill down to a volume of 60.0 ml. The concentration was 0.533 moles of $SrTiO_3$ per liter. Just prior to use, a xylene exchange was performed by adding 25 ml of xylenes to 5 ml of the above $SrTiO_3$ solution and stirred and heated to a maximum temperature of 128° C. to distill out 7 ml to produce a final solution of 23 ml volume and a concentration of 116 moles of $SrTiO_3$ per liter.

The wafer was baked at 140° C. in air for 30 minutes to dehydrate it. An eyedropper was used to place 1 ml of the $SrTiO_3$ solution on a wafer as in FIG. 2B with the layers deposited up to and including the platinum bottom electrode 8. The wafer was spun at 1500 RPM for 20 seconds. The wafer was then placed on a hot plate and baked at 250° C. in air for four minutes. An eyedropper was used to place 1 ml of the $Bi_4Ti_3O_{12}$ solution on the wafer and the wafer was spun at 1500 RPM for 20 seconds. The wafer was placed on a hot plate and baked at 250° C. for 4 minutes. The steps from using an eyedropper to deposit 1 ml of $SrTiO_3$ solution on the wafer through baking on the hot plate were repeated for another $SrTiO_3$ layer 14. The wafer was then transferred to a diffusion furnace and annealed at 700° C. in an oxygen flow of 5 liters/minute for 50 minutes. The top layer 16 of 2000 Å platinum was sputtered, a resist was applied, followed by a standard photo mask process, an ion mill etch, an IPC strip and a final contact anneal at 700° C. in an oxygen flow of 5 l/m for 50 minutes. The resulting sample was tested with the results shown in FIGS. 4A through 4C.

Figure 4A:
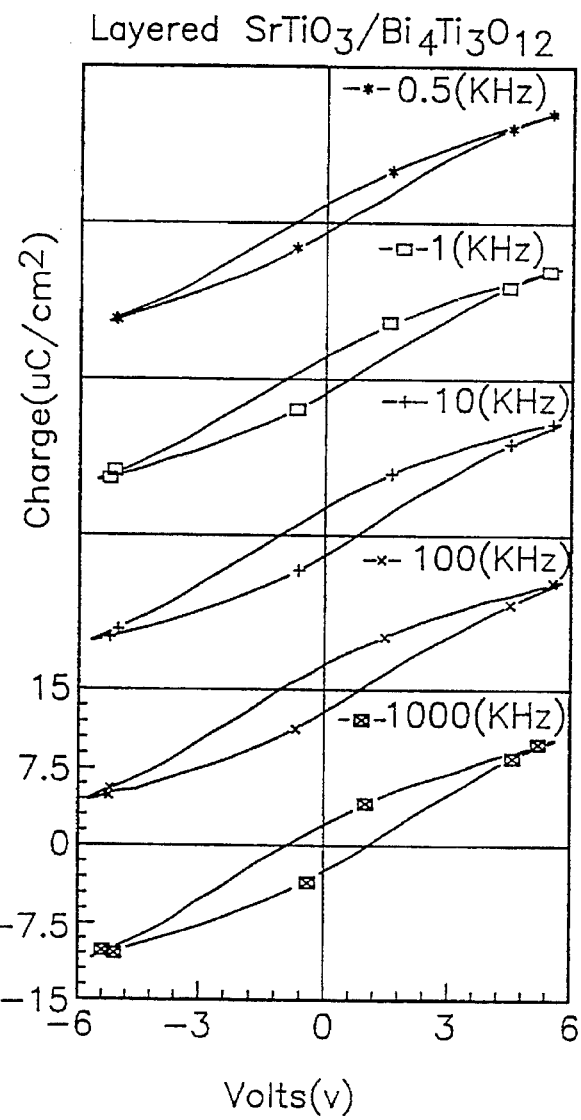
FIG. 4A shows the hysteresis curve at five different frequencies of a device as shown in FIG. 2B having a layer of $Bi_4Ti_3O_{12}$ between buffer layers of $SrTiO_3$.
Figure 4B:
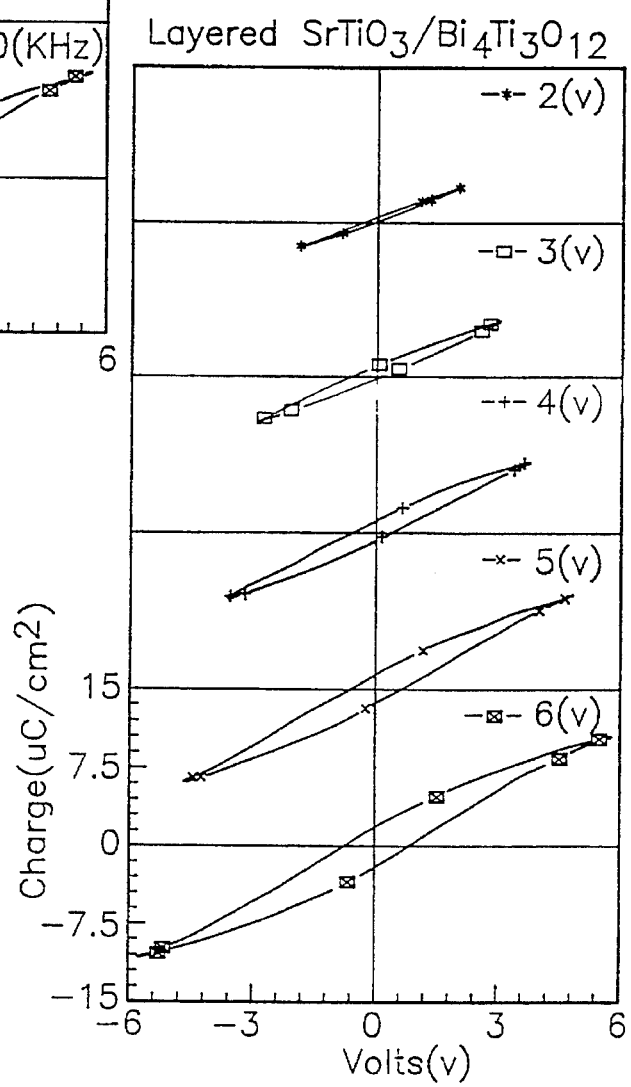
FIG. 4B shows the hysteresis curve at five different voltages of the device of FIG. 4A.
Figure 4C:
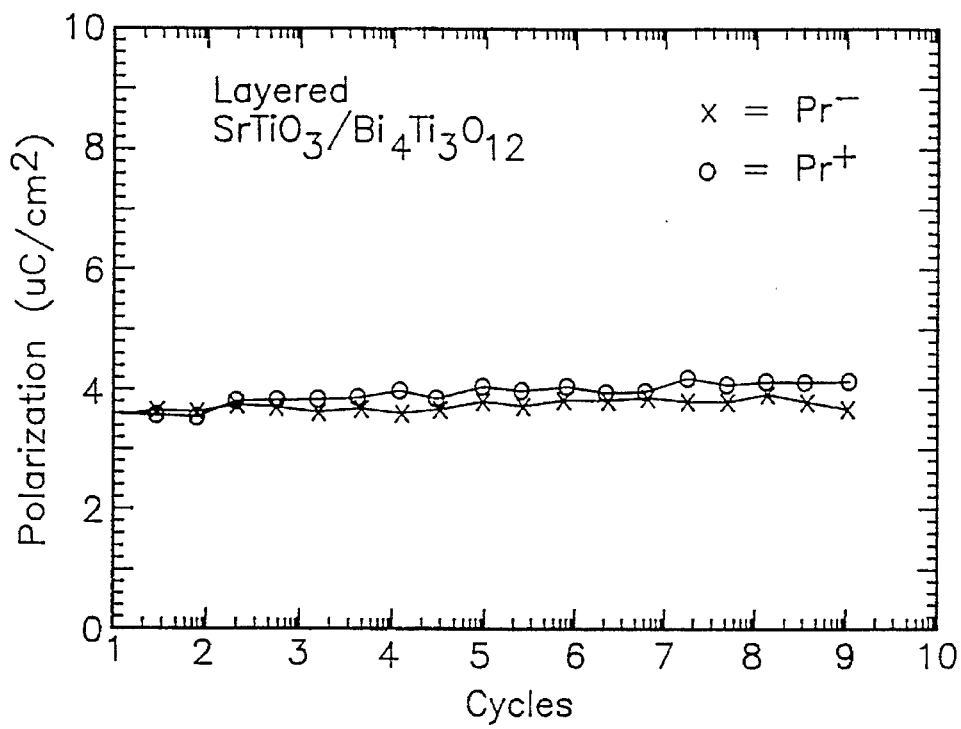
FIG. 4C shows a graph of $P_r^-$; and $P_r^+$ versus number of hysteresis cycles for a hysteresis curve of the device of FIG. 4A, illustrating the low fatigue of the material.

FIGS. 4A and 4B show the measured hysteresis curves for the capacitor device 1 (FIG. 2B) with $Bi_4Ti_3O_{12}$ deposited in a layer 12 with $SrTiO_3$ buffer layers 10, 14. The total thickness of the three layers was about 2500 Å. FIG. 4A shows the hysteresis curves at different frequencies ranging from 0.5 KHz to 1000 KHz, and FIG. 4B shows the hysteresis curves for five different voltages ranging from 2 volts to 6 volts. These hysteresis curves demonstrate that the ferroelectric properties of the sandwich structure are consistent over a wide range of frequencies and increase in a regular manner over the range of voltages that are typical of integrated circuit devices. However, their thin, elongated shape (as compared to the shape, say, of the hysteresis curves of FIGS. 5A and 7A) suggest that either the electric field has fallen off sharply in the buffer layers, or the ferroelectric material displaying the hysteresis is much thinner than the approximately 750Å of the $Bi_4Ti_3O_{12}$ layer 12. FIG. 4C shows that $P_r^-$ and $P_r^+$ remain almost unchanged all the way out past $10^9$ cycles. Thus, whatever is exhibiting the hysteresis is a very low-fatigue material.

EXAMPLE 2

Strontium Bismuth Titanate Between Buffer Layers of Strontium Titanate - $SrTiO_3/SrBi_4Ti_4O_{15}/SrTiO_3$ The compounds shown in Table II were measured.

TABLE II

| Compound | FW | g | mmole | Equiv. |
|---|---|---|---|---|
| strontium | 87.62 | 0.5310 | 6.0603 | 1.0000 |
| 2-ethylhexanoic acid | 144.21 | 1.7511 | 12.143 | 2.0037 |
| bismuth 2-ethylhex- anoate | (862.99) | 20.919 | 24.240 | 3.9998 |
| Titanium Isopropoxide | 284.26 | 6.8910 | 24.242 | 4.0001 |

The strontium was placed in about 80 ml 2-methoxyethanol and reacted to produce strontium 2-methoxyethoxide and evolving hydrogen gas. The 2-ethylhexanoic acid was added, and the mixture stirred and heated to a maximum temperature of about 118° C. to produce strontium 2-ethylhexanoate and distill off all water. The bismuth 2-ethylhexanoate was combined with 50 ml xylenes, and the mixture stirred and heated to a maximum temperature of about 125° C. to distill off all water. The titanium isopropoxide was combined with about 50 ml 2-methoxyethanol, and the mixture was stirred and heated to a maximum temperature of about 116° C. to produce titanium 2-methoxyethoxide and distill off all isopropanol and water. The strontium 2-ethylhexanoate and bismuth 2-ethylhexanoate solutions were combined (total 90 ml) and stirred and heated to a maximum of about 125° C. to distill down to 50 ml. About 40 ml xylenes were added, and the mixture was stirred and heated to a maximum temperature of about 125° C. to distill down to 50 ml again. The titanium 2-methoxyethoxide was added, and the mixture was stirred and heated to a maximum temperature of about 125° C. to distill down to 60.0 ml with a concentration of 0.101 moles of $SrBi_4Ti_4O_{15}$ per liter.

The wafer was baked at 140° C. in air for 30 minutes to dehydrate it. An eyedropper was used to place 1 ml of the $SrTiO_3$ solution described in Example 1 on a wafer as in FIG. 2B with the layers deposited up to and including the platinum bottom electrode 8. The wafer was spun at 5000 RPM for 21 seconds. The wafer was then placed on a hot plate and baked at 250° C. in air for one minute. An eyedropper was used to place 1 ml of the $SrBi_4Ti_4O_{15}$ solution on the wafer and the wafer was spun at 1500 RPM for 21 seconds. The wafer was placed on a hot plate and baked at 250° C. for 1 minute. The steps from using an eyedropper to deposit 1 ml of $SrTiO_3$ solution on the wafer through baking on the hot plate were repeated for another $SrTiO_3$ layer 14. The wafer was then transferred to a diffusion furnace and annealed at 650° C. in an oxygen flow of 5 l/m for 90 minutes. The top layer 16 of 2000 Å platinum was sputtered, a resist was applied, followed by a standard photo mask process, an ion mill etch, an IPC strip and a final contact anneal at 650° C. in an oxygen flow of 5 l/m for 90 minutes. The resulting sample was tested with the results shown in FIGS. 5A through 5C.

Figure 5A:
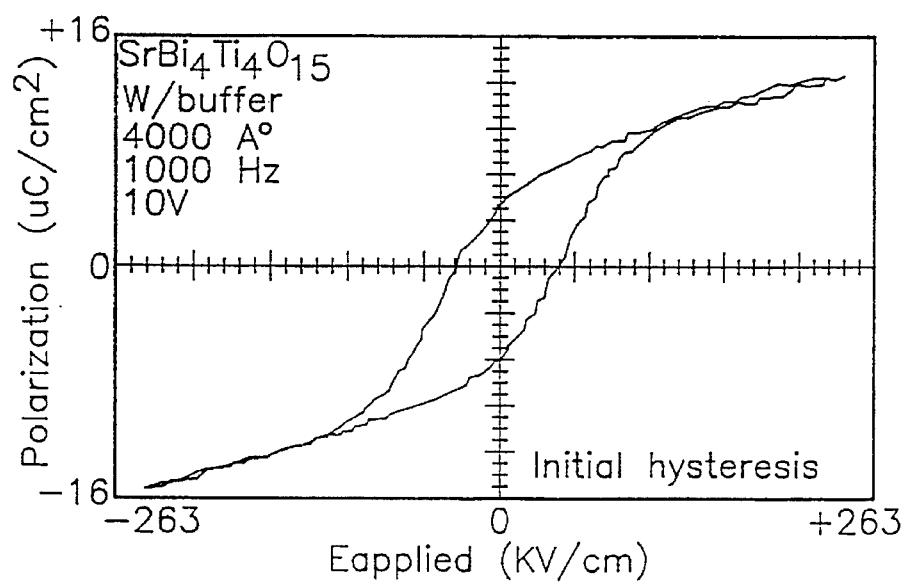
FIG. 5A is an initial hysteresis curve of a device as shown in FIG. 2B having a layer of $SrBi_4Ti_4O_{15}$ between buffer layers of $SrTiO_3$.
Figure 5B:
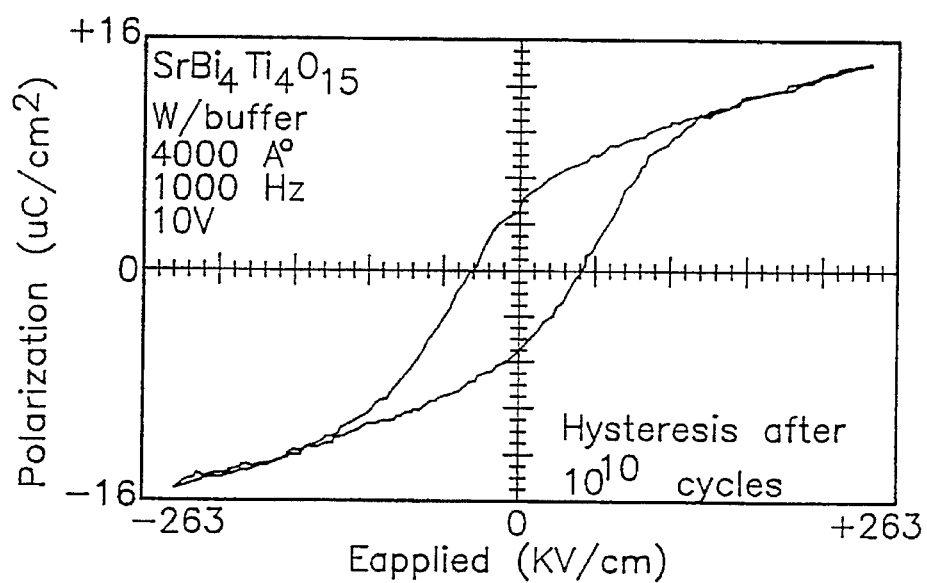
FIG. 5B is the hysteresis curve for the same sample as used to generate the curve of FIG. 5A, except after $10^{10}$ cycles.
Figure 5C:
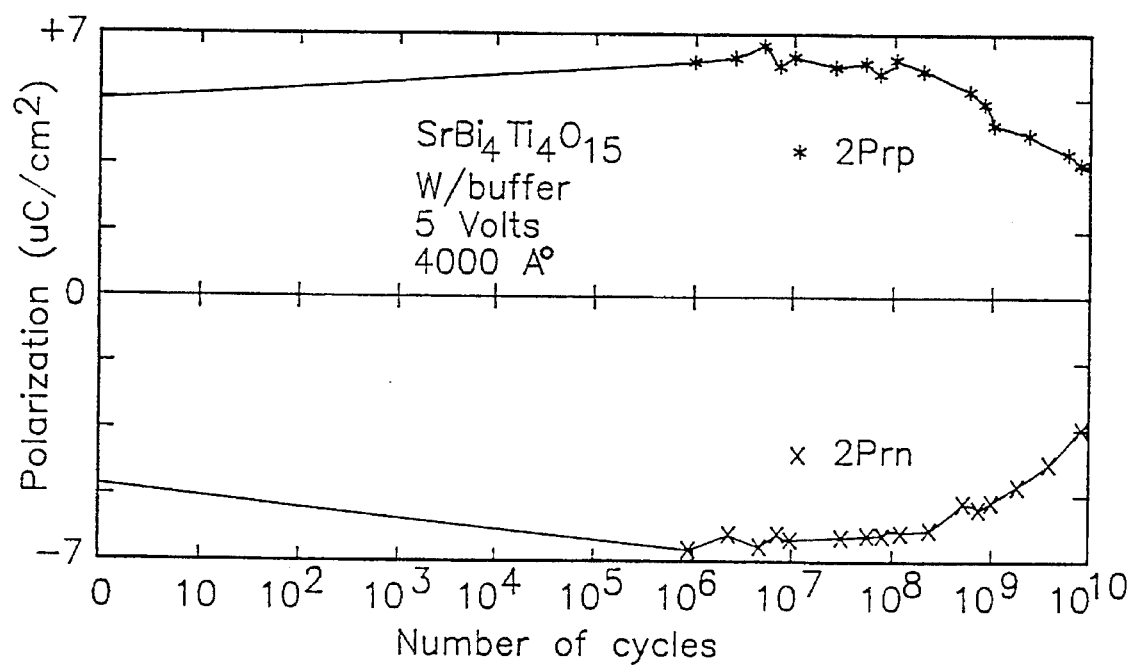
FIG. 5C is a graph of 2Prp and 2Prn versus number of switching cycles for the same sample used in FIGS. 5A and 5B.

FIG. 5A shows the initial hysteresis curve for the $SrTiO_3/SrBi_4Ti_4O_{15}/SrTiO_3$ layered material, and FIG. 5B shows the hysteresis curve after $10^{10}$ cycles. This is clearly a low-fatigue ferroelectric structure, since the hysteresis curve changed only slightly. Moreover, the hysteresis curve is fat and more perpendicular, resulting in a relatively large Pr. FIG. 5C Shows a graph of 2Prn and 2Prp over $10^{10}$ cycles. This graph is derived from a PUND switching test rather than a hysteresis test. It shows more fatigue than the previous sample, but still the fatigue changes by only about 30% over the entire $10^{10}$ cycles, which is significantly better than the 50% fatigue of the best prior art materials over $10^9$ cycles.

EXAMPLE 3

Strontium Bismuth Tantalate - $SrBi_2Ta_2O_9$

The compounds shown in Table III were measured.

TABLE III

| Compound | FW | g | mmole | Equiv. |
|---|---|---|---|---|
| Tantalum ethoxide | 406.26 | 4.9553 | 12.197 | 2.0000 |
| 2-ethylhex-anoic acid | 144.21 | 8.7995 | 61.019 | 10.006 |
| Strontium | 87.62 | 0.5330 | 6.0831 | 0.9975 |
| 2-ethylhex-anoic acid | 144.21 | 1.7613 | 12.213 | 2.0026 |
| Bismuth 2-ethylhexanoate | (862.99) | 10.525 | 12.196 | 1.9998 |

The strontium was combined with the first measure of 2-ethylhexanoic acid and 80 ml 2-methoxyethanol. The mixture was stirred on low heat of between about 70° C. and 90° C. to hurry the reaction rate. When all the strontium was reacted and the solution had cooled to approximately room temperature, the tantalum ethoxide followed by the second measure of 2-ethylhexanoic acid were added. The mixture was stirred and heated to a maximum temperature of 115° C. to distill out ethanol and water. Then 75 ml xylenes followed by the bismuth 2-ethylhexanoate were added. The solution was stirred and heated with a maximum temperature of about 125° C. until only 60.0 ml of solution remained. The concentration was 0.102 moles of $SrBi_2Ta_2O_9$ per liter. The wafer was baked at 140° C. in air for 30 minutes to dehydrate it. An eyedropper was used to place 1 ml of the $SrBi_2Ta_2O_9$ solution on a wafer as in FIG. 2C with the layers deposited up to and including the platinum bottom electrode 28. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a diffusion furnace and annealed at 750° C. in an oxygen flow of 5 l/m for 2 hours. The top layer 32 of 2000 Å platinum was sputtered, a resist was applied, followed by a standard photo mask process, an ion mill etch, an IPC strip and a final contact anneal at 750° C. in an oxygen flow of 5 l/m for 30 minutes. The resulting sample was tested with the results shown in FIGS. 6A through 6C.

Before proceeding with a discussion of the figures relating to $SrBi_2Ta_2O_9$, it should be noted that in very recent samples a precursor solution in xylenes as described above with a concentration of 0.2 moles $SrBi_2Ta_2O_9$ was diluted to 0.13 moles with n-butyl acetate and then spun onto the wafer and processed as described above. The resulting film was smoother and more uniform than previous films of the same material.

Figure 6A:
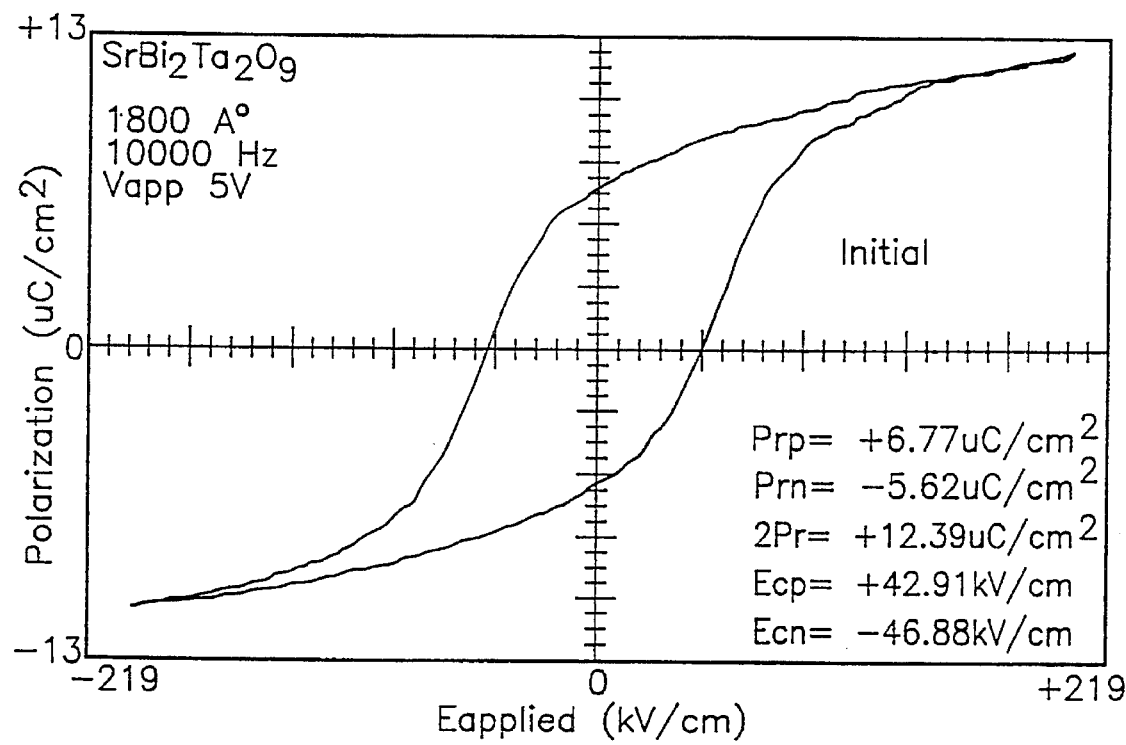
FIG. 6A is an initial hysteresis curve for a ferroelectric capacitor as shown in FIG. 2C utilizing $SrBi_2Ta_2O_9$ as the ferroelectric material.
Figure 6B:
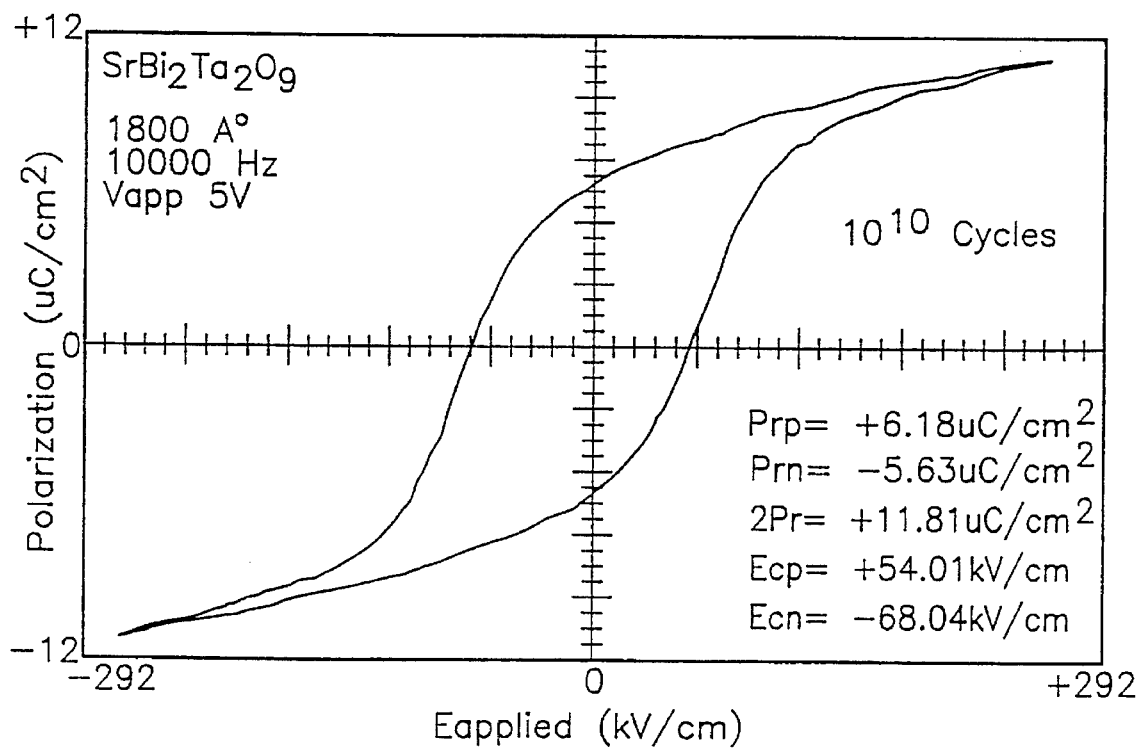
FIG. 6B is the hysteresis curve for the same sample as used to generate the curve of FIG. 6A, except after $10^{10}$ cycles.
Figure 6C:
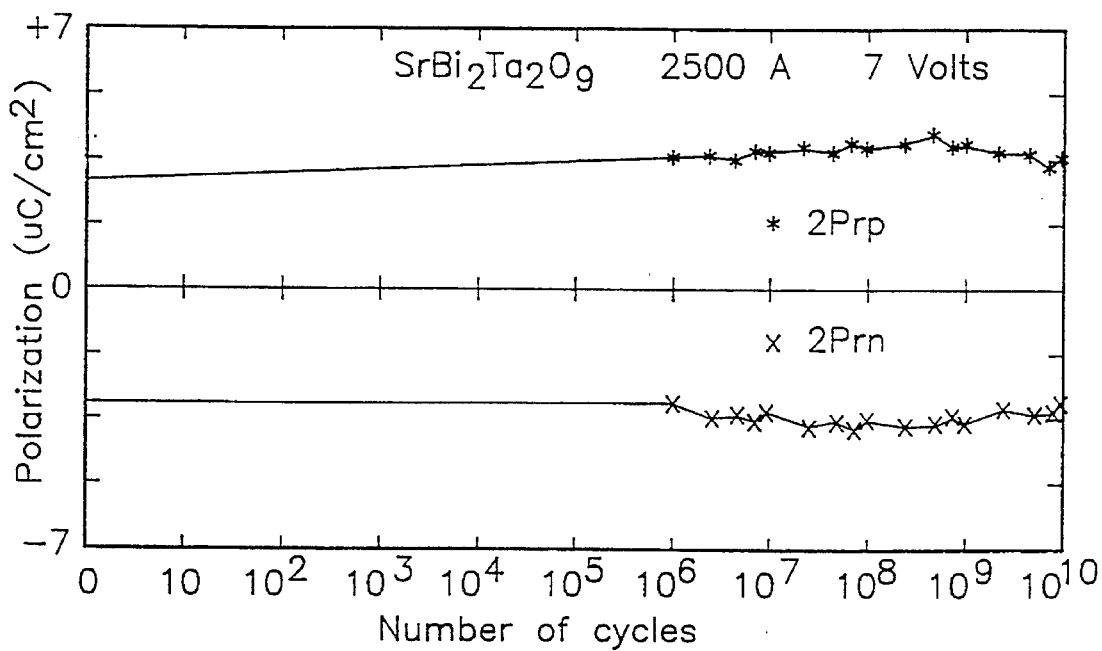
FIG. 6C is 2Prp and 2Prn versus number of switching cycles for the same sample used in FIGS. 6A and 6B.

FIG. 6A shows an initial hysteresis curve for the $SrBi_2Ta_2O_9$ sample while FIG. 6B shows the hysteresis curve for the same sample after $10^{10}$ cycles. Again there is very little change in the two curves, demonstrating low-fatigue. Moreover, the curves are very boxy and vertical, yielding large Pr. FIG. 6C shows a graph of 2Prp and 2Prn over $10^{10}$ cycles, again derived from a PUND switching test. This curve shows negligible fatigue over the entire $10^{10}$ cycles. These results are phenomenal when compared to the prior art materials, and indicate that this layered superlattice material would last indefinitely in a ferroelectric switching memory.

Figure 6D:
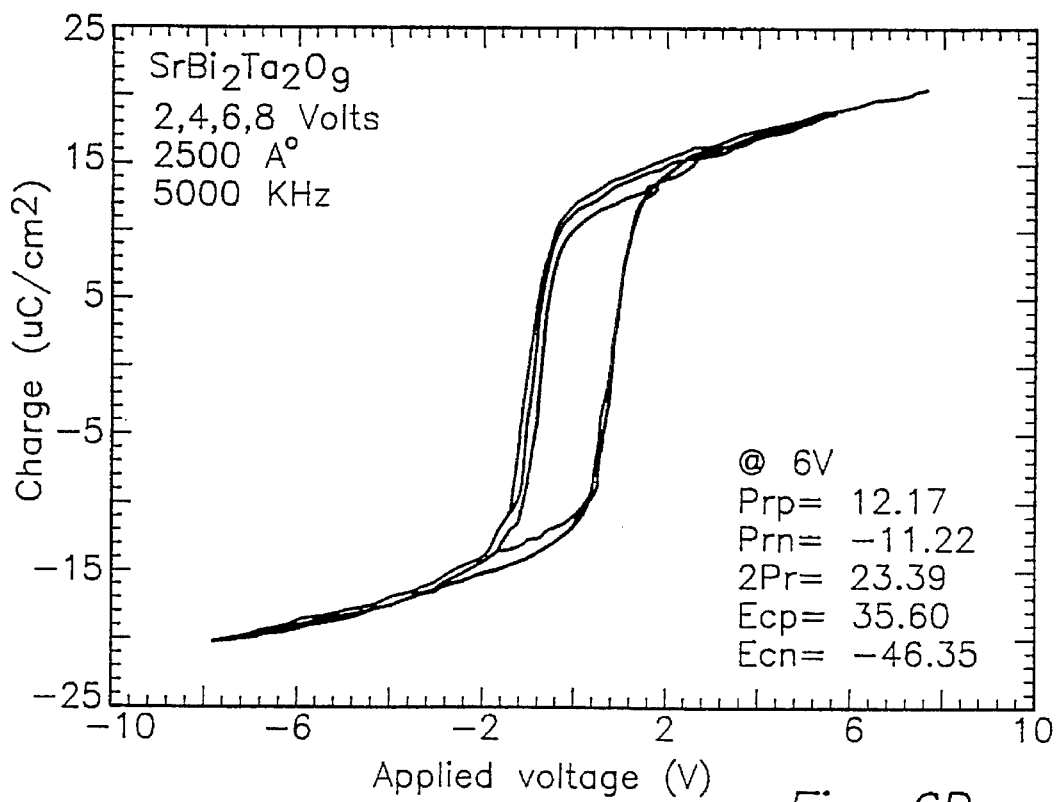
FIG. 6D is shows hysteresis curves at 2, 4, 6, and 8 volts for another ferroelectric capacitor as shown in FIG. 2C also utilizing $SrBi_2Ta_2O_9$ as the ferroelectric material.

FIG. 6D shows hysteresis curves at 2, 4, 6, and 8 volts for another sample capacitor of the type shown in FIG. 2C utilizing strontium bismuth tantalate ($SrBi_2Ta_2O_9$) as the ferroelectric material. This capacitor was made in a process as described in Example 3 above, except that 10% excess bismuth was used in the precursor solution and other process parameters were more carefully controlled to ensure better stoichiometry. These hysteresis curves are even boxier and more vertical than the curves of 6A and 6B, indicating even better ferroelectric switching performance. Moreover, the hysteresis curves for the four different voltages all nearly overlap, with the curves for the higher voltages simply extending out further along approximately the same line. This feature holds great significance for practical integrated circuit devices, since it means that even if the voltage changes substantially from specifications, as often happens in the real world, the device performance will not change significantly. The value of 2Pr for this sample was 23.39!

Figure 6E:
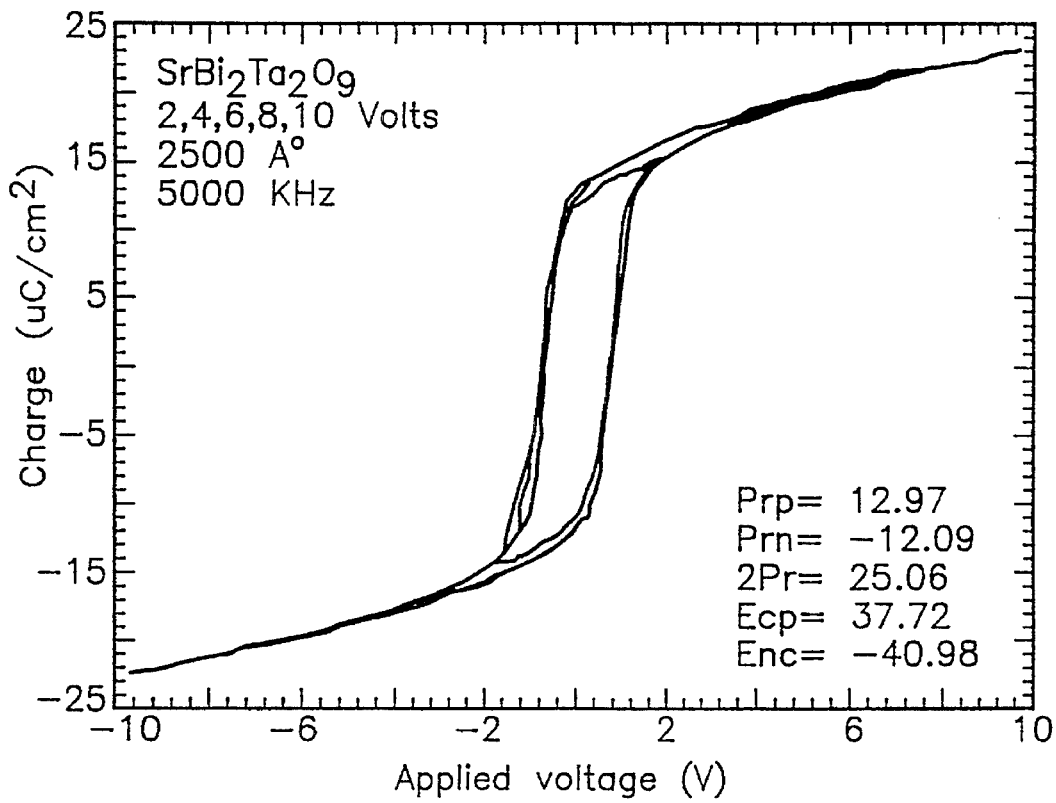
FIG. 6E shows hysteresis curves at 2, 4, 6, 8, and 10 volts for a further ferroelectric capacitor as shown in FIG. 2C also utilizing $SrBi_2Ta_2O_9$ as the ferroelectric material.

FIG. 6E shows hysteresis curves at 2, 4, 6, 8, and 10 volts for a further sample capacitor of the type shown in FIG. 2C utilizing strontium bismuth tantalate ($SrBi_2Ta_2O_9$) as the ferroelectric material. Again, this capacitor was made in a process as described in Example 3 above, except that 10% excess bismuth was used in the precursor solution and other process parameters were carefully controlled to ensure better stoichiometry. This hysteresis curves are boxier and more vertical than the previous curves, and the hysteresis curves for the five different voltages all overlap even more so. The value of 2Pr was 25.06, the best obtained to date for this material. This value of 2Pr is more than 4 times the value of Ps for strontium bismuth tantalate given in Appendix F on page 625 in the Lines and Glass reference given above!

EXAMPLE 4

Strontium Bismuth Niobate - $SrBi_2Nb_2O_9$

The compounds shown in Table IV were measured.

TABLE IV

| Compound | FW | g | mmole | Equiv. |
| --- | --- | --- | --- | --- |
| strontium | 87.62 | 0.5625 | 6.4198 | 1.0000 |
| 2-ethylhexanoic acid | 144.21 | 2.0940 | 14.520 | 2.2618 |
| bismuth 2-ethylhexanoate | (862.99) | 11.079 | 12.838 | 1.9998 |
| niobium butoxide | 458.48 | 5.8862 | 12.839 | 1.9999 |
| 2-ethylhexanoic acid | 144.21 | 9.2911 | 64.428 | 10.036 |

The strontium was placed in 30 ml 2-methoxyethanol. The first measure of 2-ethylhexanoic acid was added and was allowed to react completely. The bismuth 2-ethylhexanoate was added, followed by 35 ml xylenes. The niobium butoxide and second measure of 2-ethylhexanoic acid was added, followed by 40 ml of xylenes. The mixture was heated and stirred, with a maximum temperature of 123° C., until all the butanol, water, and 2-methoxyethanol were removed. The final volume was 63 ml, and the final mass was 57.475 g. The concentration was 0.102 moles of $SrBi_2Nb_2O_{9per}$ liter, or 0.1117 mmoles of $SrBi_2Nb_2O_9$ per gram of solution. The wafer was baked at 140° C. in air for 30 minutes to dehydrate it. An eyedropper was used to place 1 ml of the $SrBi_2Nb_2O_9$ solution on a wafer as in FIG. 2C with the layers deposited up to and including the platinum bottom electrode 28. The wafer was spun at 1000 RPM for 20 seconds. The wafer was then placed on a hot plate and baked at 230° C. in air for two minutes and 30 seconds. The steps from using an eyedropper to deposit the $SrBi_2Nb_2O_9$ solution on the wafer through baking on the hot plate were repeated for another layer. The wafer was then transferred to a diffusion furnace and annealed at 750° C. in an oxygen flow of 5 l/m for 40 minutes. The top layer 32 of 2000 Å platinum was sputtered, a negative resist was applied followed by a standard photo mask process, an ion mill etch, an IPC strip and a final contact anneal at 750° C. in an oxygen flow of 5 l/m for 30 minutes. The resulting sample was tested with the results shown in FIGS. 7A through 7E.

Figure 7A:
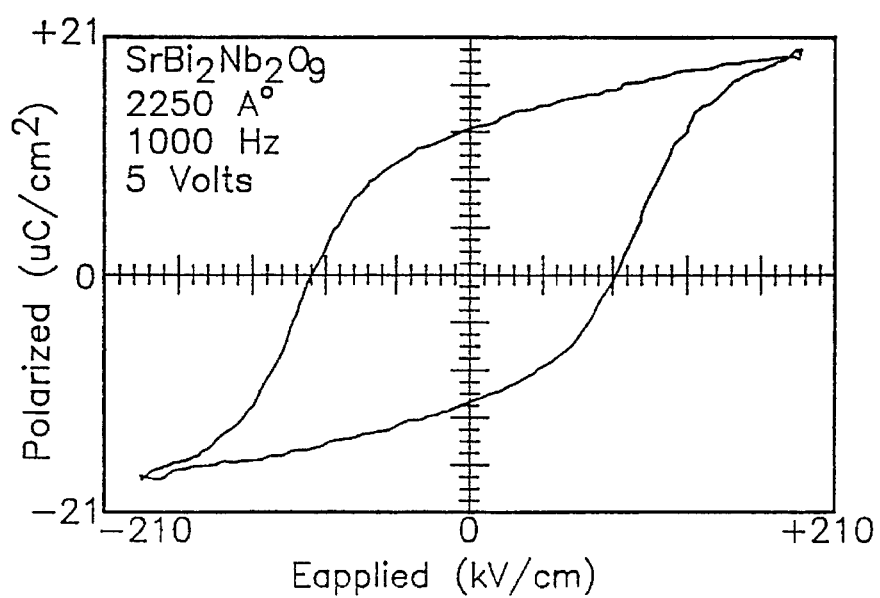
FIG. 7A is a hysteresis curve for a ferroelectric capacitor as shown in FIG. 2C utilizing $SrBi_2Nb_2O_9$ as the ferroelectric material and with the maximum applied voltage of 5 volts.
Figure 7B:
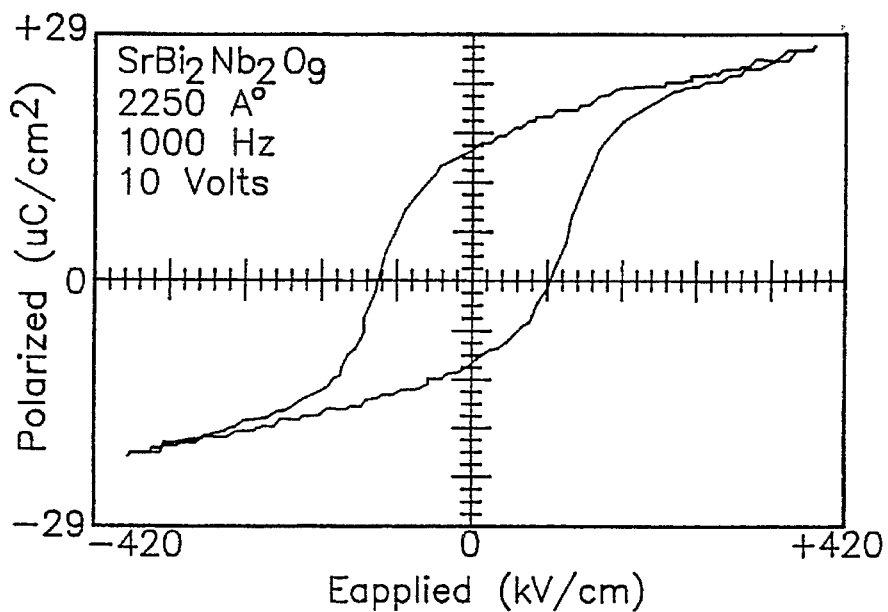
FIG. 7B is a hysteresis curve for the sample of FIG. 7A with a maximum applied voltage of 10 volts.
Figure 7C:
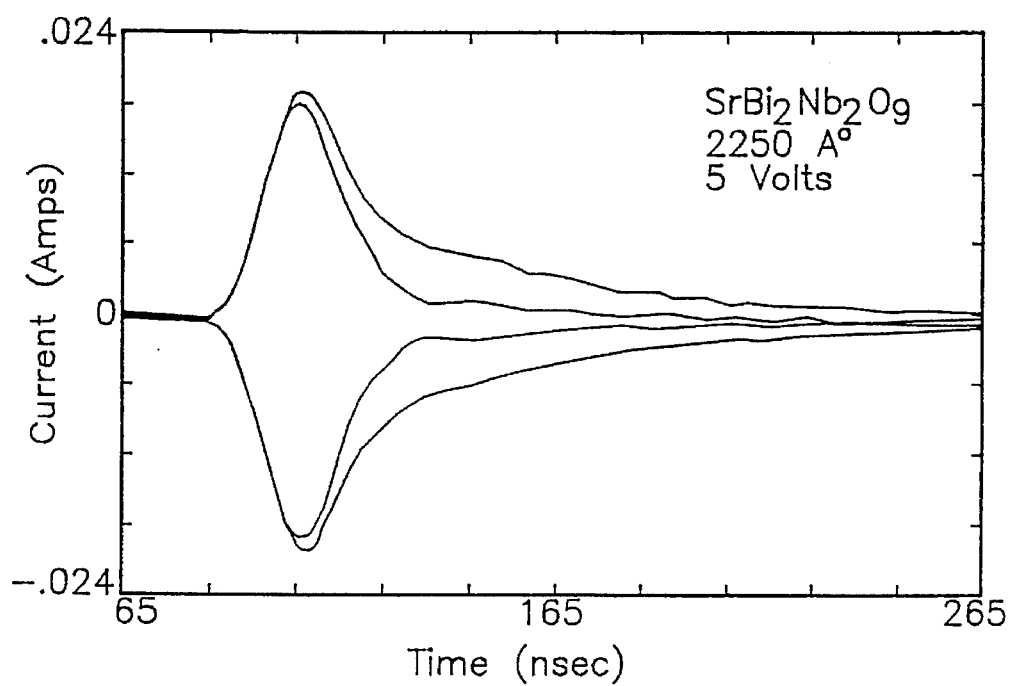
FIG. 7C is graph of a PUND switching pulse measurement for for the sample of FIG. 7A with a pulse voltage of 5 volts.
Figure 7D:
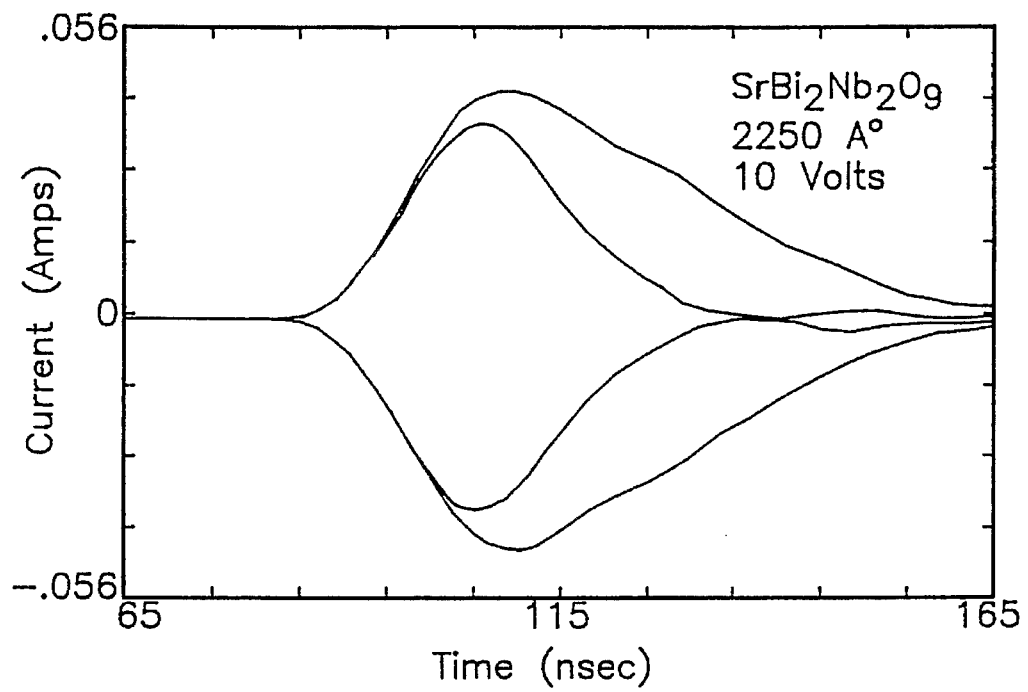
FIG. 7D is a PUND switching pulse measurement for the sample of FIG. 7A with a pulse voltage of 10 volts.
Figure 7E:
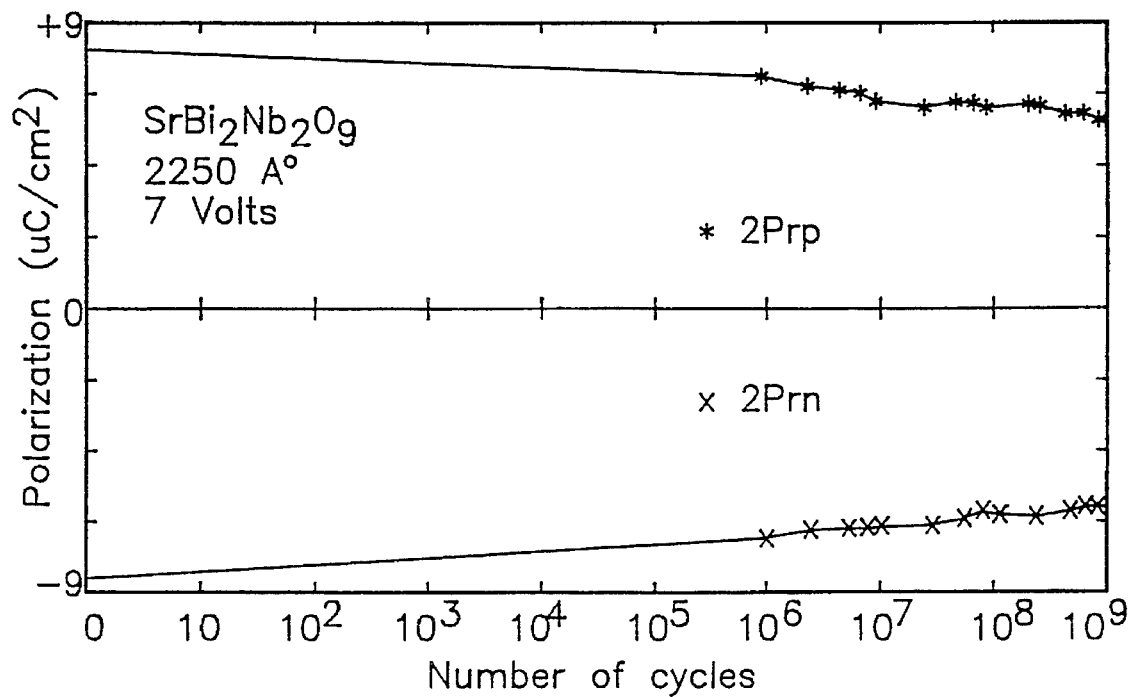
FIG. 7E is a graph of 2Prp and 2Prn versus number of switching cycles for the sample of FIG. 7A.

FIG. 7A is a graph of the hysteresis curve for $SrBi_2Nb_2O_9$ at five volts and FIG. 7B is a graph of the hysteresis curve at 10 volts. Both show the boxy, vertical, structures that are highly desirable in ferroelectrics since they indicate high polarizability. Further, the Pund switching curves shown in FIG. 7C for 5 volts and 7d for 10 volts show good differentiation in the switching pulses (the pulses that go most positive and negative) and the dielectric charge pulses (the other two pulses). Moreover, the current falls quickly into the background noise; that is, although there is a long tail on the pulses, the tail is down in the noise. This quick fall off indicates that the material is a relatively "fast" switching material. FIG. 7E is a graph of 2Prp and 2Prn versus number of switching cycles. This shows much lower fatigue than prior art materials, but not as low as that for strontium bismuth tantalate ($SrBi_2Ta_2O_9$) in FIG. 6C, although it is possible that the difference in the fatigue is due to less than optimum processing on this particular sample.

EXAMPLE 5

Strontium Bismuth Tantalum Niobate - $SrBi_2TaNbO_9$

The compounds shown in Table V were measured.

TABLE V

| Compound | FW | g | mmole | Equiv. |
| --- | --- | --- | --- | --- |
| strontium | 87.62 | 0.5821 | 6.6435 | 1.0001 |
| 2-ethylhexanoic acid | 144.21 | 1.9770 | 13.709 | 2.0635 |
| bismuth 2-ethylhexanoate | (862.99) | 11.4687 | 13.289 | 2.0005 |
| tantalum butoxide | 546.522 | 3.6303 | 6.6426 | 1.0000 |
| niobium butoxide | 458.48 | 3.0456 | 6.6428 | 1.0000 |
| 2-ethylhexanoic acid | 144.21 | 9.6081 | 66.626 | 10.030 |

The strontium was placed in 30 ml of 2-methoxyethanol and the first measure of 2-ethylhexanoic acid was added and allowed to react completely. Then the bismuth 2-ethylhexanoate was added followed by 40 ml xylenes. the tantalum butoxide and the niobium butoxide were added, followed by the second portion of the 2-ethylhexanoic acid and 40 ml additional xylenes. The mixture was stirred and heated to a maximum temperature of 122° C. to distill out all water, butanol and 2-methoxyethanol until 65 ml of solution remained. The concentration was 0.102 moles of $SrBi_2TaNbO_9$ per liter. The wafer was baked at 140° C. in air for 30 minutes to dehydrate it. An eyedropper was used to place 1 ml of the $SrBi_2TaNbO_9$ solution on a wafer as in FIG. 2C with the layers deposited up to and including the platinum bottom electrode 28. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $SrBi_2TaNbO_9$ solution on the wafer through the RTP were repeated for another layer. The wafer was then transferred to a diffusion furnace and annealed at 750° C. in an oxygen flow of 5 l/m for 2 hours. A top layer 32 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIGS. 8A through 8F.

Figure 8A:
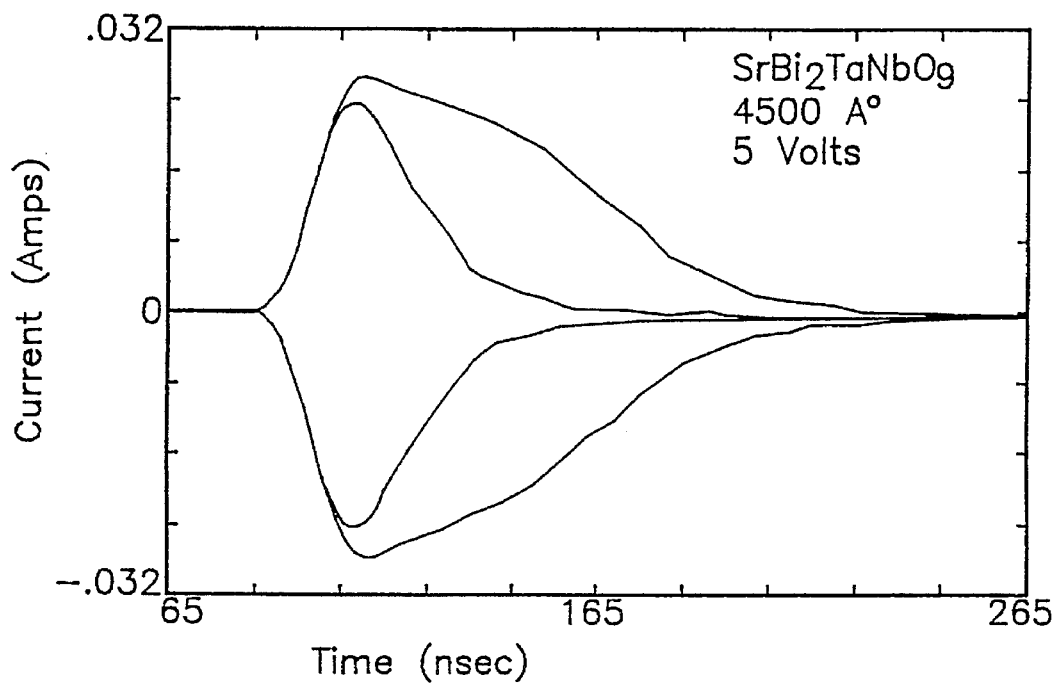
FIGS. 8A and 8B are PUND switching measurements taken of a ferroelectric capacitor as shown in FIG. 2C utilizing $SrBi_2TaNbO_9$ as the ferroelectric material with pulses of 5 volts and 10 volts respectively.
Figure 8B:
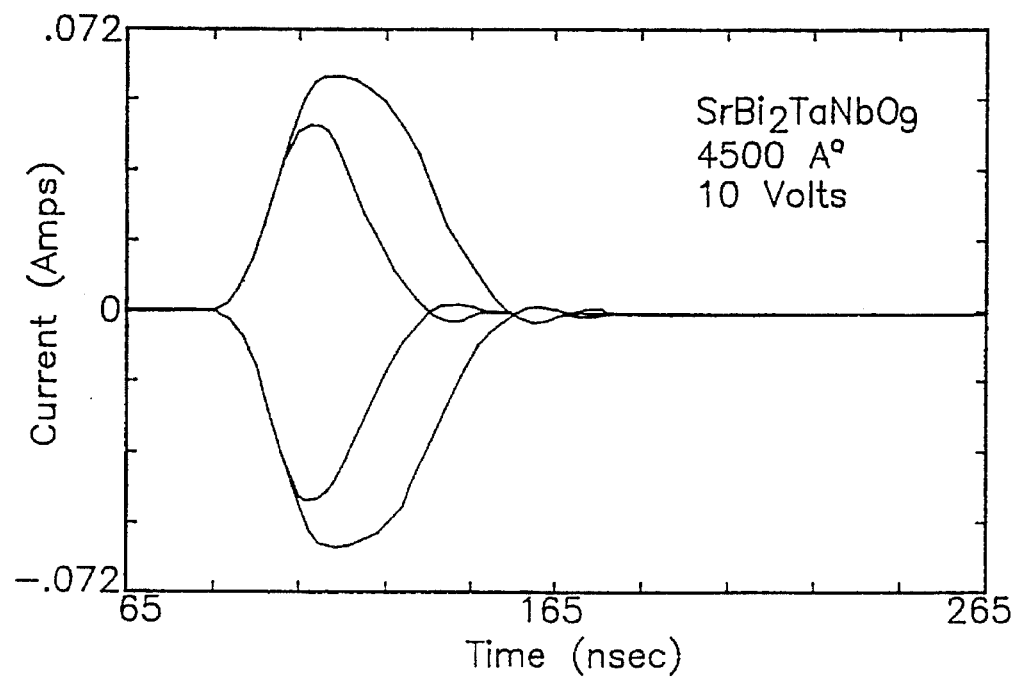
Figure 8C:
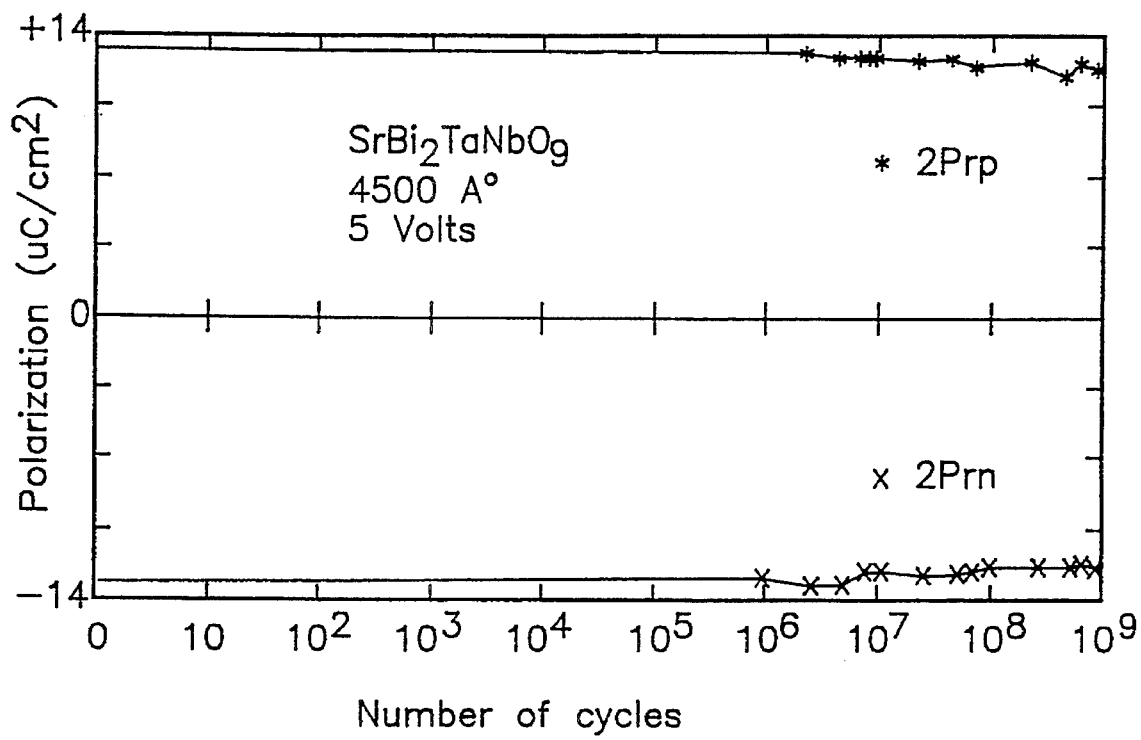
FIG. 8C is a graph of 2Prp and 2Prn versus number of switching cycles for the sample of FIGS. 8A and 8B.
Figure 8D:
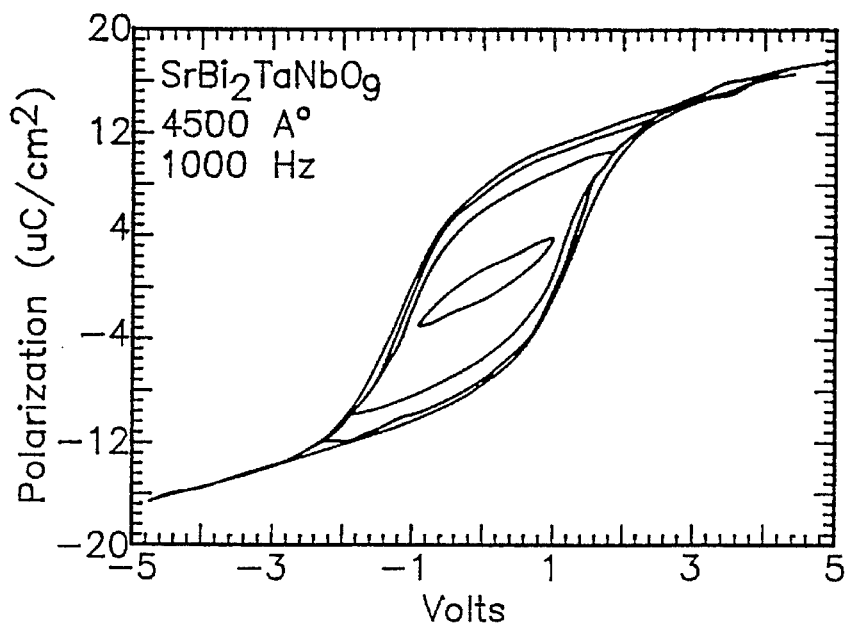
FIG. 8D shows hysteresis curves at five different voltages for the sample of FIGS. 8A through 8C.
Figure 8E:
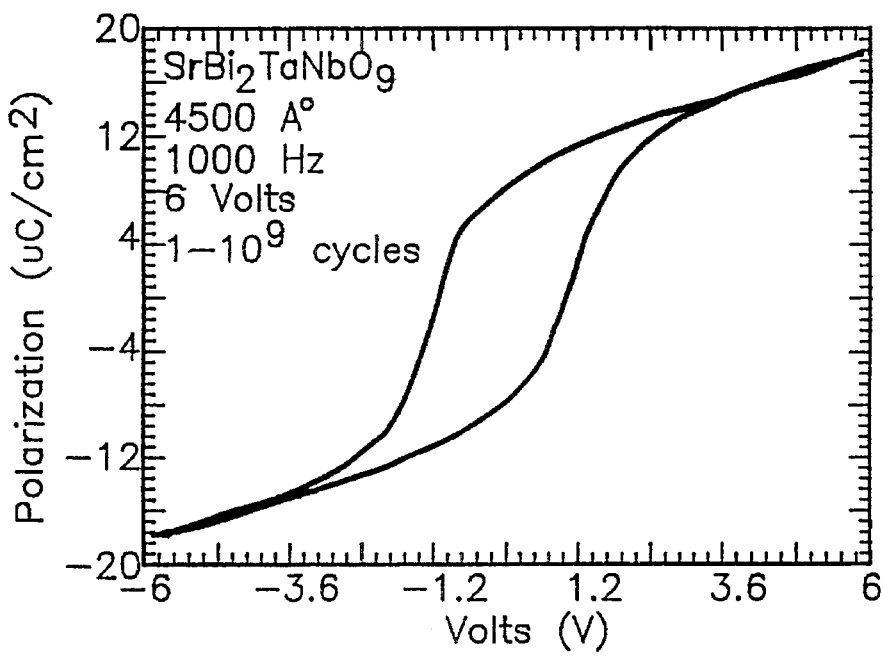
FIG. 8E shows hysteresis measurements performed on the sample of FIGS. 8A through 8D at twenty different data points over approximately $10^{10}$ hysteresis cycles.
Figure 8F:
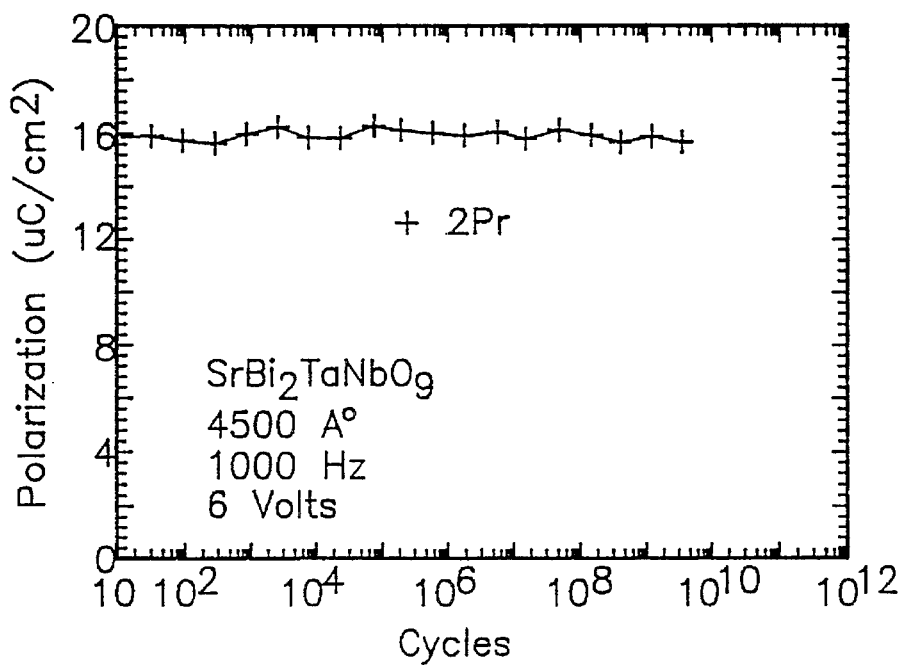
FIG. 8F is a graph of 2Pr versus number of cycles taken from the hysteresis curves of FIG. 8E.
Figure 8G:
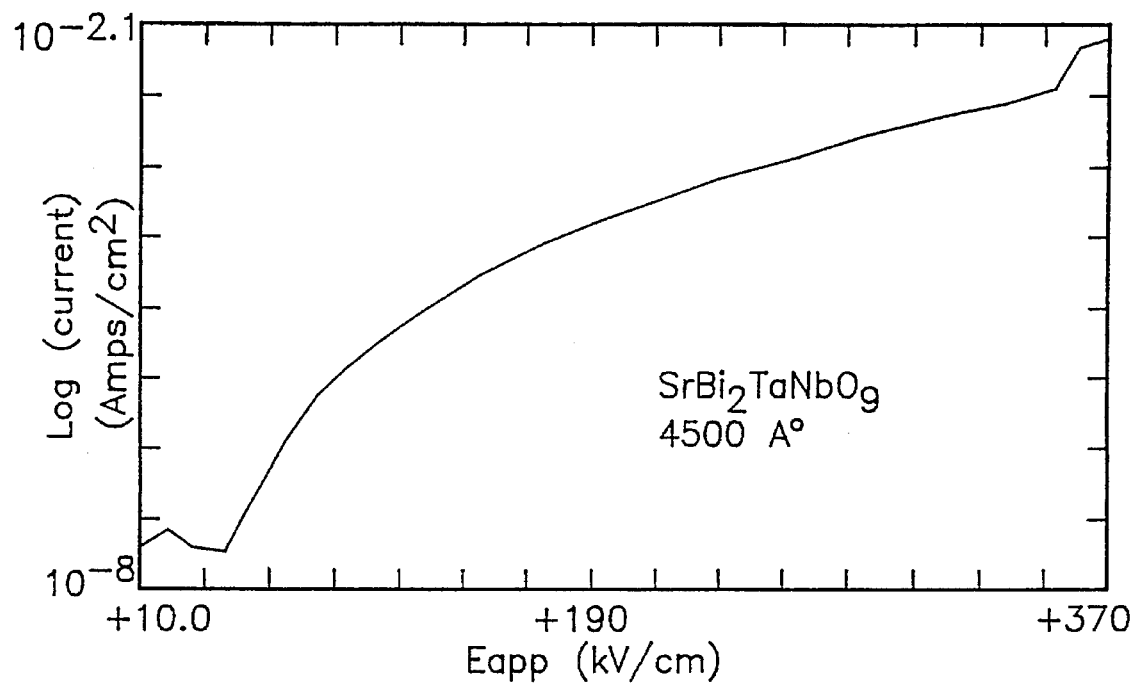
FIG. 8G is graph of the logarithm of the DC leakage current versus applied field for the sample of FIGS. 8A through 8F.

The first thing to note is that $SrBi_2TaNbO_9$ is a material with two B-site elements, tantalum and niobium. FIG. 8a shows the PUND switching test results for $SrBi_2TaNbO_9$ at 5 volts and FIG. 8B shows the PUND results at 10 volts. The results at 5 volts are very good, showing good differentiation between the switching curves and dielectric curves and a relatively fast fall off into the noise level indicating fast switching. The results for 10 volts are excellent, again showing good differentiation, and almost no tail, indicating very fast switching. One immediately thinks that if this material has low fatigue, it would be an excellent material for a ferroelectric switching application, such as a memory. FIG. 8C shows the curves of 2Prp and 2Prn versus switching cycles. While this shows a little more fatigue than the same curves for $SrBi_2Ta_2O_9$ (FIG. 6C), still the results must be considered to be phenomenal as compared to prior art materials. There is only about 5% fatigue over $10^9$ cycles, which is ten times better than even the best materials in the prior art. The results show that $SrBi_2TaNbO_9$ should provide non-volatile ferroelectric memories that last indefinitely. Moreover, none of the elements in the compound are elements that cause compatibility problems with conventional integrated circuit technologies. FIG. 8D shows the superimposed hysteresis curves for $SrBi_2TaNbO_9$ at 1 (the smallest curve) 2, 3, 4, and 5 (the largest curve) volts. The curves at 2, 3, 4, and 5 volts all are boxy and vertical, with good polarizability. FIG. 8E is a graph in which the hysteresis curve at 6 volts was repeated on the same graph paper at 10, 100, 1000, switching cycles etc. up to $10^9$ switching cycles. The curve follows almost exactly the same line, again indicating an fatigue that was inconceivable in the prior art. FIG. 8F shows a graph of 2Pr versus number of hysteresis cycles taken from the same data as the curves of FIG. 8E, but going out to $10^{10}$ cycles. Again, there is almost no change over the entire $10^{10}$ cycles. It is noted that the voltages of the curves of FIGS. 8A through 8F are all within the range of voltages that are common in integrated circuits. The material shows excellent performance at 5 volts, the most common voltage used in integrated circuits, and has good performance all the way down to 2 volts, which shows promise of integrated circuits that can operate at even lower voltages than conventional circuits, which would result in low current consumption, long battery life in circuits that run on batteries, and enhanced reliability of circuit components. FIG. 8G is a graph of applied electric field versus the log of the measured current, commonly referred to as a leakage current curve, for $SrBi_2TaNbO_9$. The curve shows that the leakage current is extremely small, of the order of $10^{-8}$ amps/cm$^2$ up to about 2 volts across a 4500 Å thickness, then increases relatively steeply. The left half of the curve represents voltages of from 1 to 10 volts across the 4500 Å sample, about the range of voltages found in a conventional integrated circuit. At these voltages the leakage current remains below $10^{-5}$ amps/cm$^2$, which indicates that the material should not have leakage current problems in an integrated circuit operating at standard voltages.

EXAMPLE 6

Barium Bismuth Tantalate - $BaBi_2Ta_2O_9$

The compounds shown in Table VI were measured.

TABLE VI

| Compound | FW | g | mmole | Equiv. |
| --- | --- | --- | --- | --- |
| barium | 137.327 | 0.9323 | 6.7889 | 1.0000 |
| 2-ethylhexanoic acid | 144.21 | 1.9733 | 13.684 | 2.0156 |
| bismuth 2-ethylhexanoate | (862.99) | 11.717 | 13.577 | 1.9999 |
| tantalum butoxide | 546.522 | 7.4211 | 13.579 | 2.0002 |
| 2-ethylhexanoic acid | 144.21 | 9.9216 | 68.800 | 10.134 |

The barium was placed in 40 ml of 2-methoxyethanol and 20 ml of toluene, to slow the reaction, and the first measure of 2-ethylhexanoic acid were added and allowed to react completely. Then the bismuth 2-ethylhexanoate was added followed by 40 ml xylenes. The solution was stirred and heated to a maximum temperature of about 123° C. to distill out water, the toluene and the 2-methoxyethanol. The solution was allowed to cool to room temperature, then the tantalum butoxide was added, followed by the second portion of the 2-ethylhexanoic acid and 40 ml additional xylenes. The mixture was heated to a temperature of about 123° C. while stirring to distill out the butanol until 66 ml of solution remained. The concentration was 0.103 moles of $BaBi_2Ta_2O_9$ per liter. The wafer was baked at 140° C. in air for 30 minutes to dehydrate it. An eyedropper was used to place 1 ml of the $BaBi_2Ta_2O_9$ solution on a wafer as in FIG. 2C with the layers deposited up to and including the platinum bottom electrode 28. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $BaBi_2Ta_2O_9$ solution on the spinner to the RTP were repeated for another layer. The wafer was then transferred to a diffusion furnace and annealed at 750° C. in an oxygen flow of 5 l/m for 2 hours. A top layer 32 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIG. 9.

Figure 9:
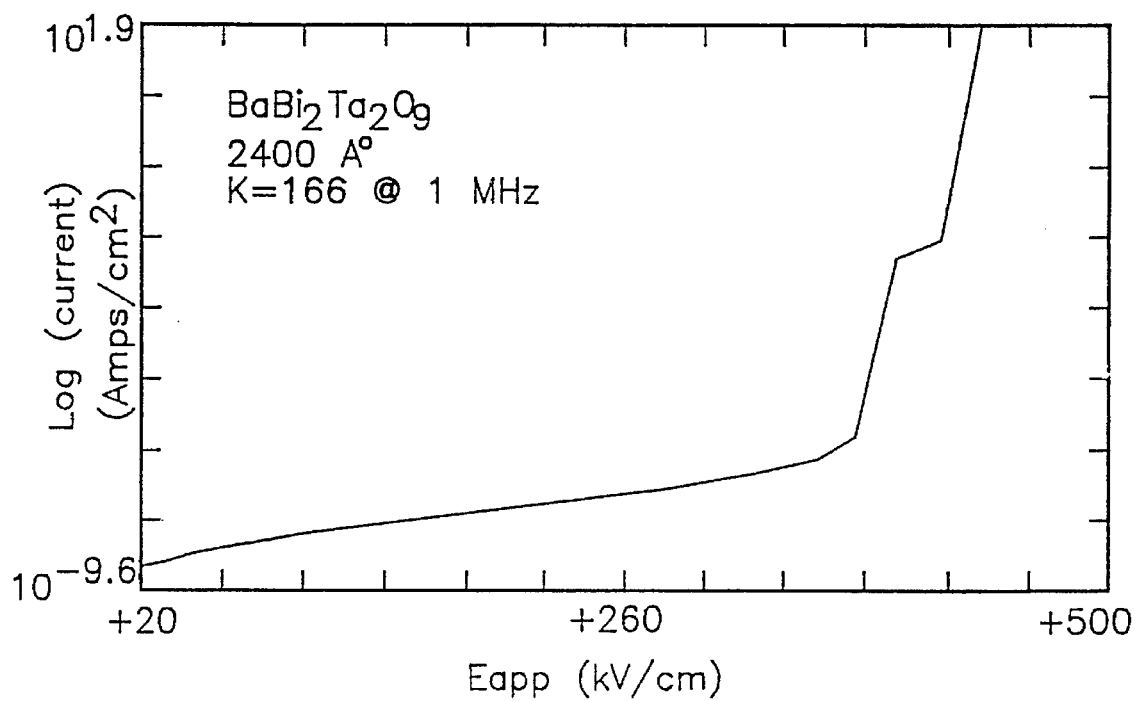
FIG. 9 is a graph of the logarithm of the DC leakage current versus applied field for a capacitor as shown in FIG. 2C utilizing $BaBi_2Ta_2O_9$ as the high dielectric constant material.

The $BaBi_2Ta_2O_9$ was not a switching ferroelectric, but was a paraelectric with a dielectric constant of 166 at 1 megahertz. This is a very high dielectric constant as compared to the dielectric constant of 3.9 for silicon dioxide, the most commonly used dielectric in integrated circuits. FIG. 9 shows the leakage current curve for $BaBi_2Ta_2O_9$. At low voltages, the leakage current is negligible, of the order of $10^{-10}$ amps/cm2. Over the range of voltages uses in conventional integrated circuits, i.e. 1–10 volts, the leakage current across the 2400 Å sample remains below about $10^{-8}$ amps/cm$^2$, which is still very small. The thickness of this sample is about the same thickness generally used for dielectrics in conventional integrated circuits. These results show that this material will be an excellent high dielectric material in integrated circuits. Moreover, none of the elements of which the material is composed create compatibility problems with conventional integrated circuit materials. In addition $BaBi_2Ta_2O_9$ should be much more resistant to radiation damage than conventional dielectrics because, except for the oxygen, the elements out of which is compounded are heavier than the elements such as silicon and nitrogen out of which conventional integrated circuit dielectrics are composed.

EXAMPLE 7

Lead Bismuth Tantalate - $PbBi_2Ta_2O_9$

The compounds shown in Table VII were measured.

TABLE VII

| Compound | FW | g | mmole | Equiv. |
| --- | --- | --- | --- | --- |
| Lead 2-ethylhexanoate in xylenes | (1263.6) | 16.691 | 13.209 | 1.1000 |
| bismuth 2-ethylhexanoate | (753.35) | 18.095 | 24.019 | 2.0002 |
| tantalum butoxide | 546.52 | 13.126 | 24.017 | 2.0001 |
| 2-ethylhexanoic acid | 144.21 | 17.967 | 124.59 | 10.375 |

The lead 2-ethylhexanoate in xylenes previously prepared stock solution and the bismuth 2-ethylhexanoate were combined, followed by ml xylenes. Then the tantalum butoxide was added, followed by the 2-ethylhexanoic acid. The mixture was stirred on low heat of between about 70° C. and 90° C. for four hours, then raised to a maximum temperature of 114° C. to distill out the butanol until 66 ml of solution remained. The concentration was 0.172 moles of $PbBi_2Ta_2O9$ per liter with 10% excess lead. The wafer was baked at 140° C. in air for 30 minutes to dehydrate it. An eyedropper was used to place 1 ml of the $PbBi_2Ta_2O_9$ solution on a wafer as in FIG. 2C with the layers deposited up to and including the platinum bottom electrode 28. The wafer was spun at 1000 RPM for 20 seconds. The wafer was then placed on a hot plate and baked at 375° C. in air for two and a half minutes. The steps from using an eyedropper to place the $PbBi_2Ta_2O_9$ solution on the wafer through baking were repeated for another layer. The wafer was then transferred to a diffusion furnace and annealed at 750° C. in an oxygen flow of 5 l/m for 90 minutes. A top layer 32 of 2000 Å platinum was sputtered, a negative resist was applied followed by a standard photo mask process, an ion mill etch, an IPC strip and a final contact anneal at 750° C. in an oxygen flow of 5 l/m for 30 minutes. The sample was tested with the results shown in FIG. 10.

Figure 10:
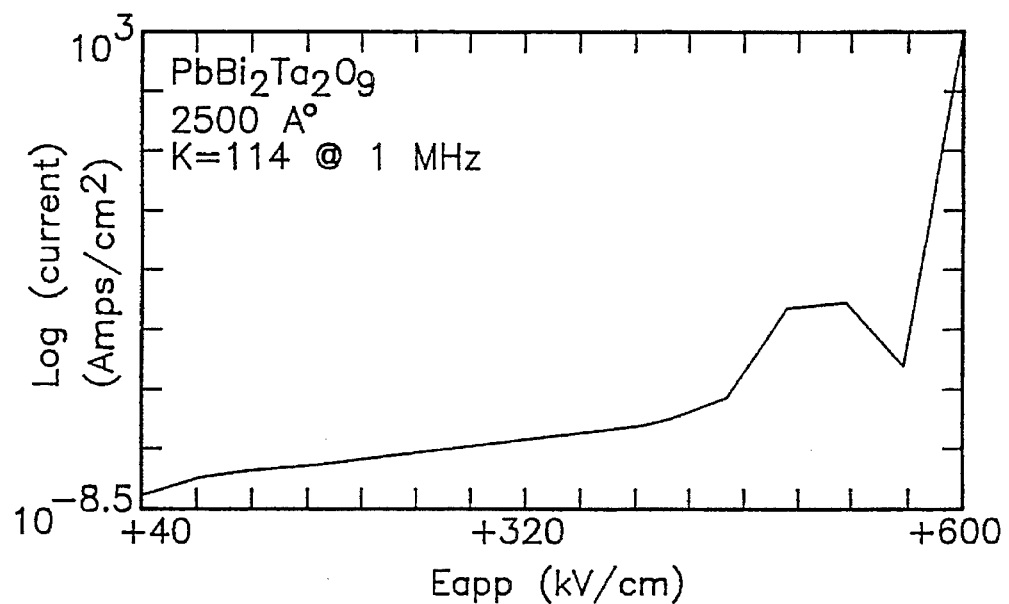
FIG. 10 is a graph of the logarithm of the DC leakage current versus applied field for a capacitor as shown in FIG. 2C utilizing $PbBi_2Ta_2O_9$ as the high dielectric constant material.

FIG. 10 is a leakage current graph for an approximately 2500 Å sample of $PbBi_2Ta_2O_9$. This material is of particular interest because the presence of lead makes it extremely resistant to radiation damage. The dielectric constant is 114 at 1 megahertz, which is smaller than that of $BaBi_2Ta_2O_9$, but still 30 to 40 times the dielectric constant of conventional semiconductor dielectrics. The leakage current is higher, but still excellent within the range of voltages common in integrated circuits. The elements from which the material is compounded are also relatively compatible with conventional integrated circuit materials.

EXAMPLE 8

Barium Bismuth Niobate- $BaBi_2Nb_2O_9$

The compounds shown in Table VIII were measured.

TABLE VIII

| Compound | FW | g | mmole | Equiv. |
|---|---|---|---|---|
| barium | 137.327 | 0.9419 | 6.8588 | 1.0000 |
| 2-ethylhexanoic acid | 144.21 | 2.0538 | | |
| bismuth 2-ethylhexanoate | (862.99) | 11.838 | 13.717 | 1.9999 |
| niobium butoxide | 458.48 | 6.2894 | 13.718 | 2.0001 |
| 2-ethylhexanoic acid | 144.21 | 10.051 | 69.697 | 10.162 |

The barium was placed in 30 ml of 2-methoxyethanol and 20 ml of toluene, to slow the reaction, and the first measure of 2-ethylhexanoic acid was added and allowed to react completely while stirring. Then the bismuth 2-ethylhexanoate was added followed by 50 ml xylenes. The mixture was stirred and heated with a maximum temperature of 118° C. to distill out all water, the toluene and the 2-methoxyethanol. The solution was allowed to cool to room temperature, then the niobium butoxide was added, followed by the second portion of the 2-ethylhexanoic acid and 30 ml additional xylenes. The mixture was heated to a temperature of 124° C. while stirring to distill out all butanol and water until 68 ml of solution remained. The concentration was 0.101 moles of $BaBi_2Nb_2O_9$ per liter. The wafer was baked at 140° C. in air for 30 minutes to dehydrate it. An eyedropper was used to place 1 ml of the $BaBi_2Nb_2O_9$ solution on a wafer as in FIG. 2C with the layers deposited up to and including the platinum bottom electrode 28. The wafer was spun at 1000 RPM for 20 seconds. The wafer was then placed on a hot plate and baked at 230° C. in air for two minutes. The wafer was placed in a rapid thermal processor and annealed for 30 seconds in an oxygen flow of 3 l/m at temperature of 700° C. with a 125°/sec ramp rate. The steps from using an eyedropper to place $BaBi_2Nb_2O_9$ solution on the wafer to the RTP were repeated for another layer. The wafer was then transferred to a diffusion furnace and annealed at 750° C. in an oxygen flow of 5 l/m for 1 hour. A top layer 32 of 2000 Å platinum was sputtered, a negative resist was applied, followed by a standard photo mask process, an ion mill etch, an IPC strip and a final contact anneal at 750° C. in an oxygen flow of 5 l/m for 30 minutes. The resulting sample was tested with the results shown in FIG. 11.

Figure 11:
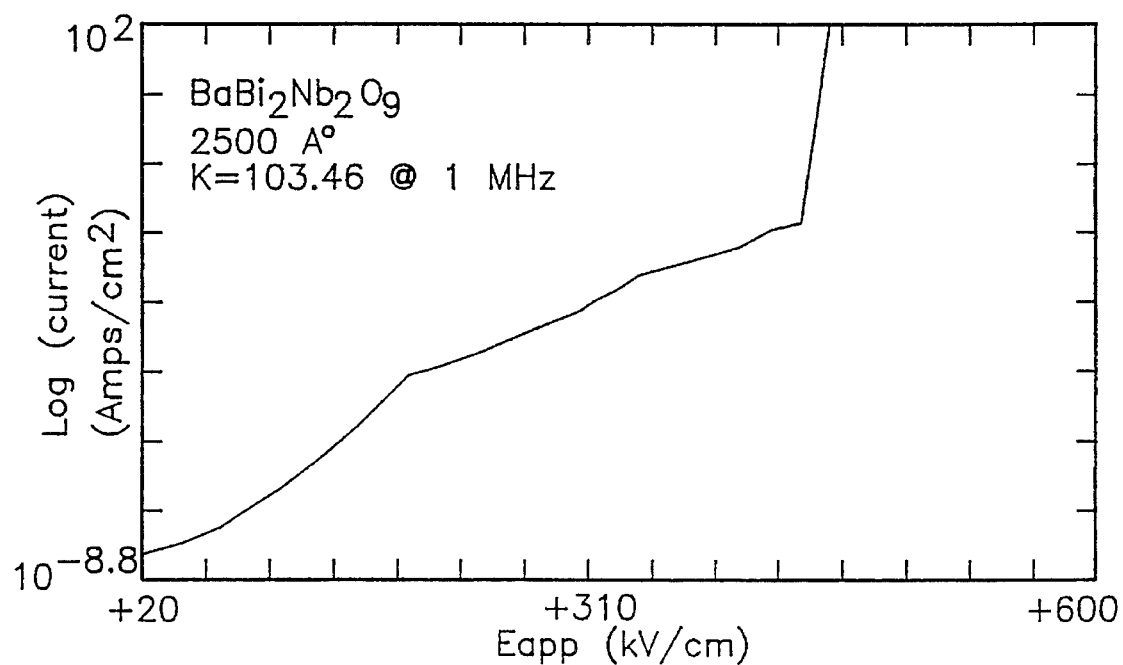
FIG. 11 is a graph of the logarithm of the DC leakage current versus applied field for a capacitor as shown in FIG. 2C utilizing $BaBi_2Nb_2O_9$ as the high dielectric constant material.

The measured dielectric constant for $BaBi_2Nb_2O_9$ was 103.46 at 1 megahertz. This is lower than the dielectric constants for $BaBi_2Ta_2O_9$ and $PbBi_2Ta_2O_9$, but still very high. FIG. 11 is a graph of the leakage current for $BaBi_2Nb_2O_9$. This leakage current result in again not as excellent as for $BaBi_2Ta_2O_9$ and $PbBi_2Ta_2O_9$, but still is good. Thus this material should be preferable to conventional integrated circuit dielectric materials. Again, this material should be relatively resistant to radiation damage as compared to conventional integrated circuit materials.

5. Discussion of the Ferroelectric Properties of the Layered Superlattice Materials While as a by-product of the ferroelectric research described herein it has been found that the layered superlattice materials have many advantageous properties outside the ferroelectric area, which advantages and properties are also included in the invention, the primary thrust of research and the expected benefit of the new materials is in ferroelectrics. In this section the ferroelectric properties and advantages of the layered superlattice material will be summarized, using strontium bismuth tantalate ($SrBi_2Ta_2O_9$) as an exemplary material.

Figure 16:
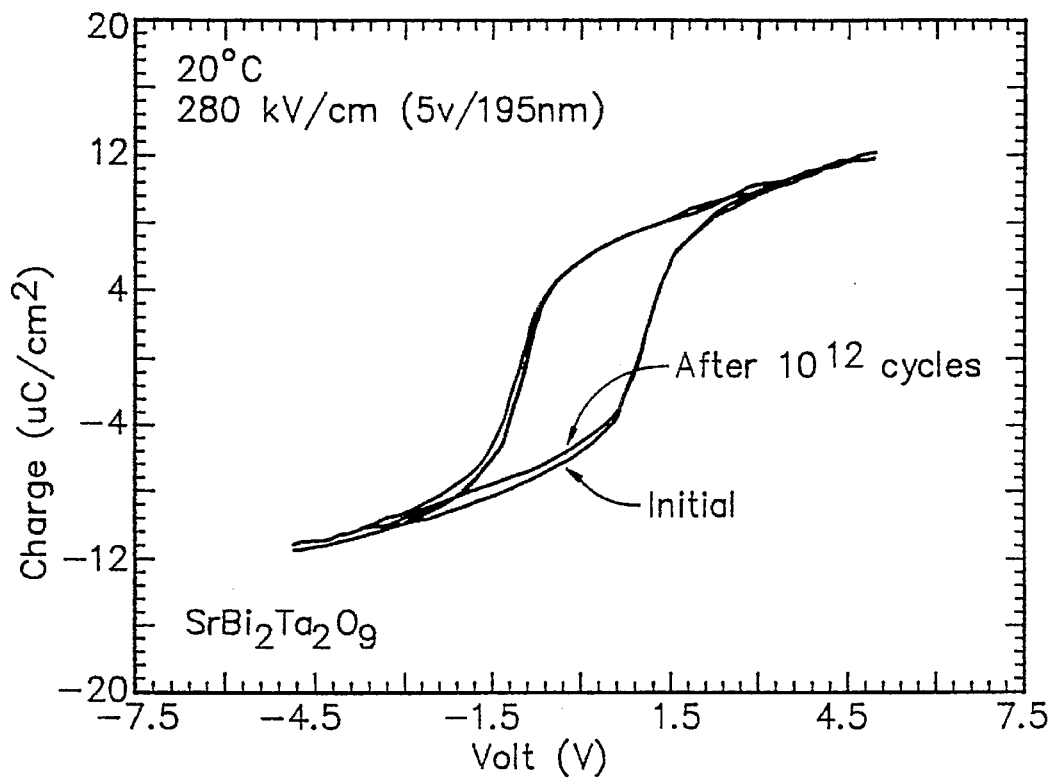
FIG. 16 shows a hysteresis curve for a sample of $SrBi_2Ta_2O_9$ after $10^{12}$ cycles superimposed on an initial hysteresis curve for the same sample.
Figure 17:
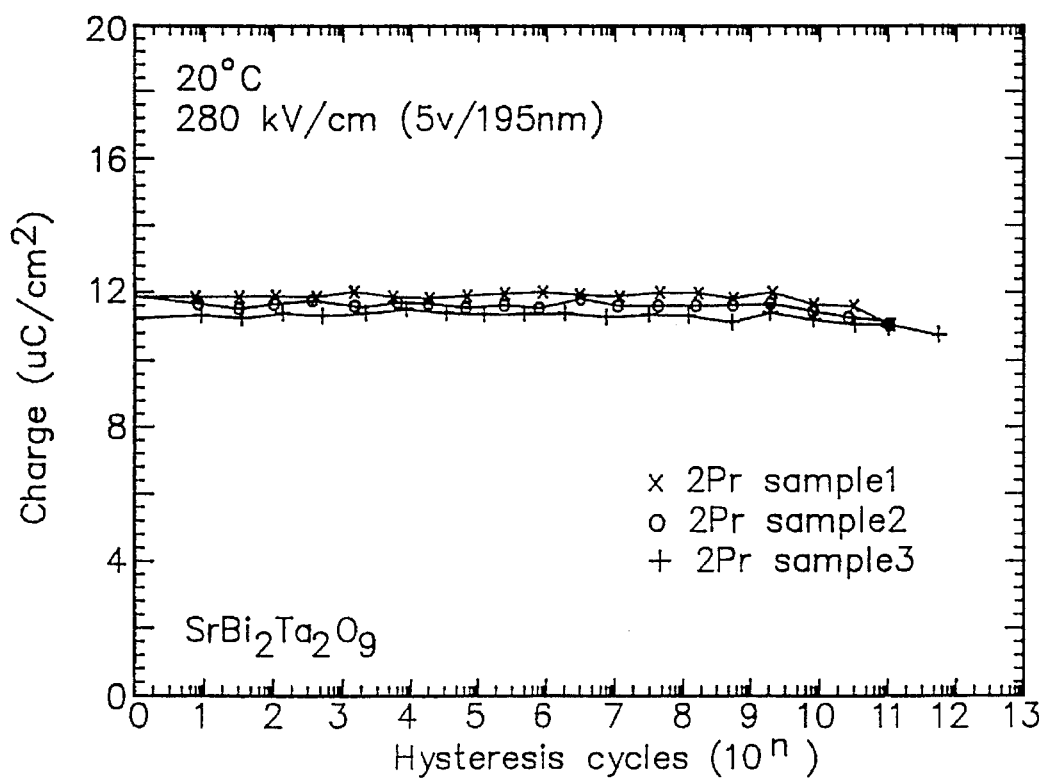
FIG. 17 shows 2Pr versus number of hysteresis cycles for three samples of $SrBi_2Ta_2O_9$, with the test for one sample going out to $10^{12}$ cycles.

Turning to FIG. 16, a hysteresis curve for a sample of $SrBi_2Ta_2O_9$ after $10^{12}$ cycles superimposed on an initial hysteresis curve for the same sample is shown. $10^{12}$ cycles is roughly equivalent to device switching 1000 times a second for 25 years. This is far more switching than can be expected for a non-volatile memory cell. The two curves change so little that for about half the loop the curve for $10^{12}$ cycles retraces the initial curve. This is not an isolated, especially good sample. FIG. 17 shows 2Pr versus number of hysteresis cycles for three samples of $SrBi_2Ta_2O_9$, with the curve for one sample going out to $10^{12}$ cycles and the curve for the others going out to over $10^{11}$ cycles. The curves for all three samples are nearly superimposed. It is expected that as experience grows with the fabrication processes, the difference from one sample to the next will become even less. For the best of the prior art materials, PZT, 2Pr decreased more than 50% over only $10^9$ cycles, and varied widely from sample to sample.

Figure 18:
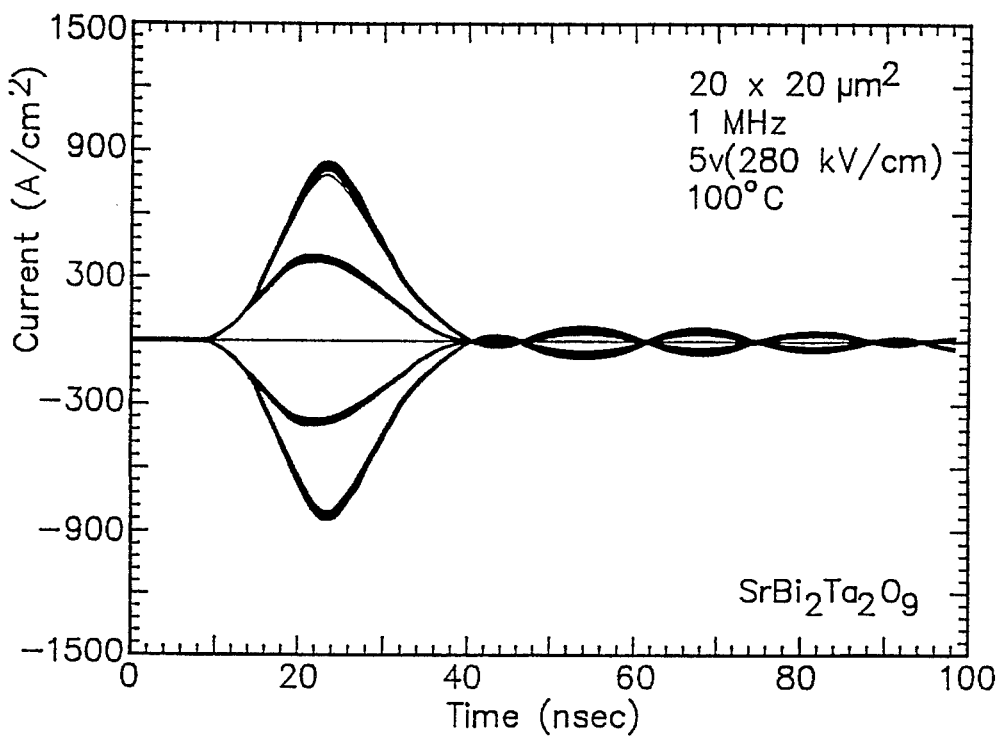
FIG. 18 shows superimposed PUND switching measurements performed on a sample of $SrBi_2Ta_2O_9$ at 17 data points over approximately $10^{10}$ switching cycles at a temperature of 100° C.
Figure 19:
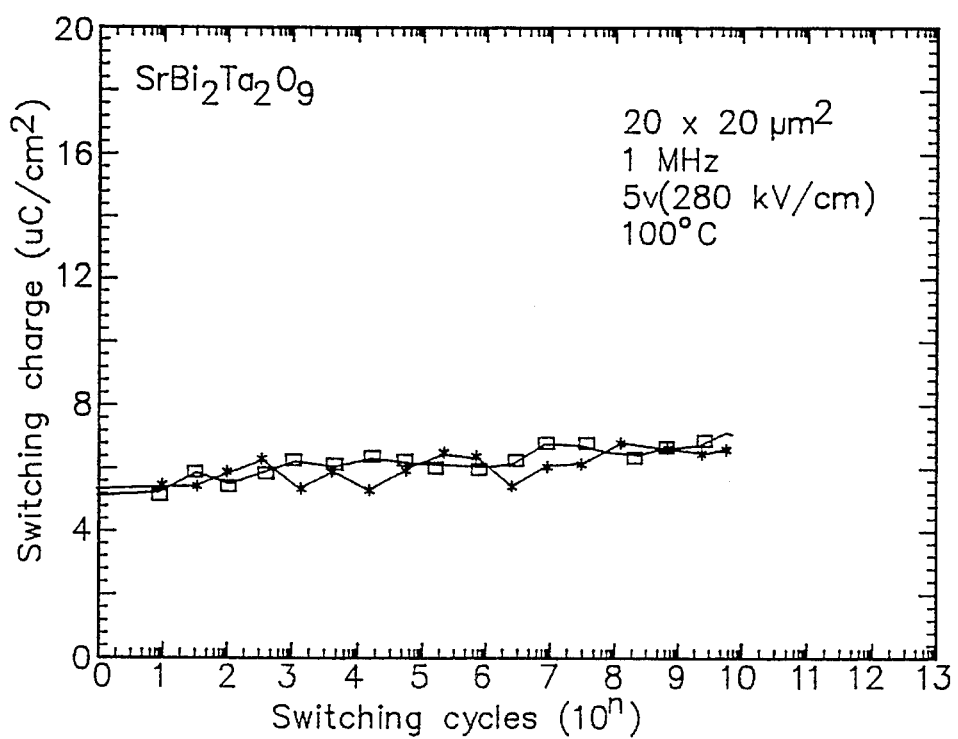
FIG. 19 shows the switching charge versus number of switching cycles for the PUND measurements of FIG. 18.
Figure 20:
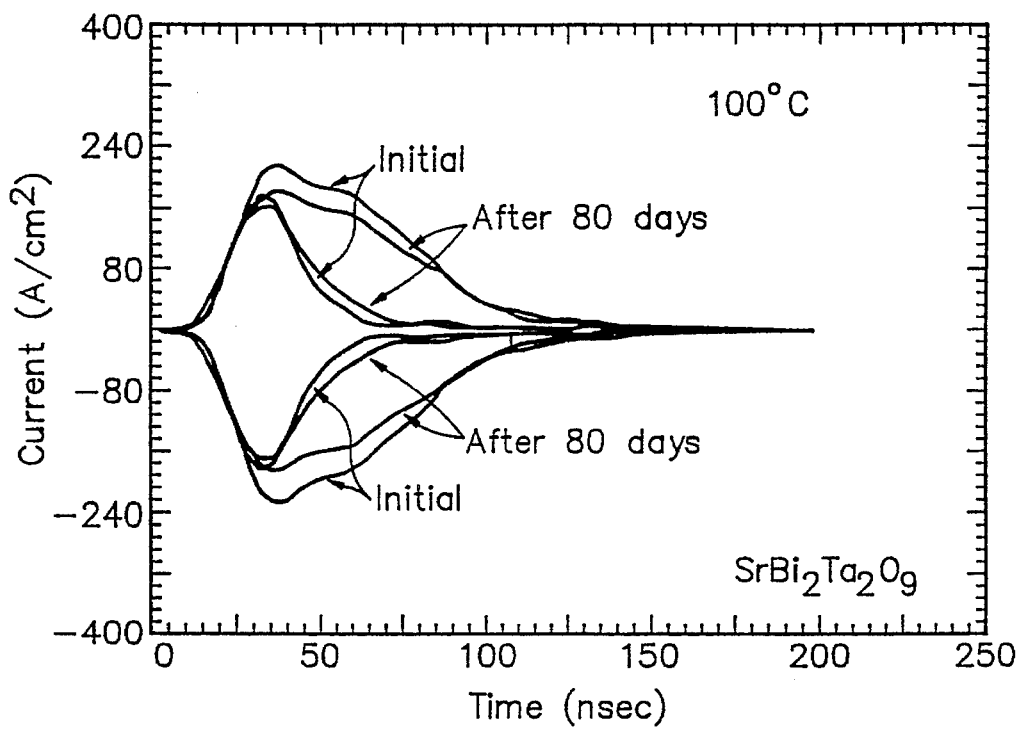
FIG. 20 shows PUND measurements for a sample of $SrBi_2Ta_2O_9$ taken after the sample had retained a polarization charge for 80 days at 100° C. superimposed on the initial PUND measurements for the same sample.
Figure 21:
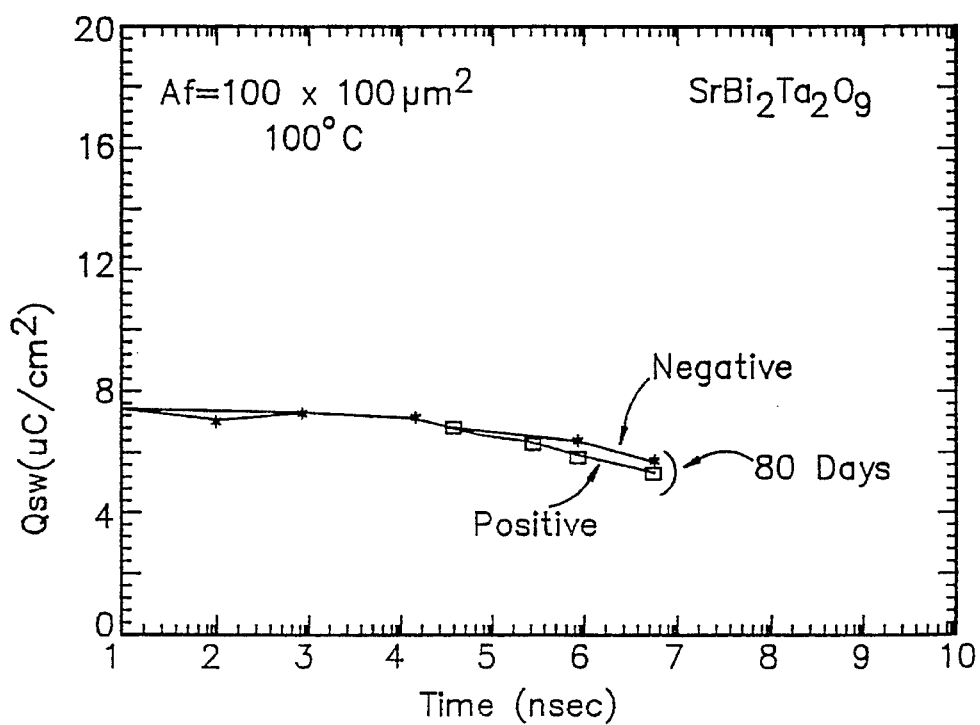
FIG. 21 shows the decay of a switching charge for a positive and negative polarization state for a sample of $SrBi_2Ta_2O_9$ illustrating data retention over an eighty day period at 100° C.

Because of the "shock absorber" feature of the layered superlattice materials, they also can perform under stressful conditions. FIG. 18 shows superimposed PUND switching measurements performed on a sample of $SrBi_2Ta_2O_9$ at 17 data points over approximately $10^{10}$ switching cycles at a temperature of 100° C., and FIG. 19 shows the switching charge versus number of switching cycles for the PUND measurements of FIG. 18. The PUND measurements are so consistent that the line of the curve merely grows thicker, without disturbing any of the features of the curve. FIG. 20 shows PUND measurements for a sample of $SrBi_2Ta_2O_9$ taken after the sample had retained a polarization charge for 80 days at 100° C. superimposed on the initial PUND measurements for the same sample. While there was significant change, the percentage change was relatively constant over the entire curves so that the shape of the curves stayed the same. The switching current still remains well within the range sufficient to operate a switching device. FIG. 21 shows the decay of a switching charge for the positive and negative polarization state for samples of $SrBi_2Ta_2O_9$ illustrating data retention over an eighty day period at 100° C. The graph was made by negatively polarizing, i.e. programming, seven samples of $SrBi_2Ta_2O_9$ and positively polarizing seven other samples, then placing them in a storage container and holding them at 100° C. About every ten days to twelve days one of the negatively charged samples and one of the positively charged samples were removed from storage and the switching charge measured. Thus the curve not only shows the retention of programming for eighty days at 100° C., but also shows consistency between samples. There clearly was sufficient charge remaining after 80 days to operate a memory function.

Figure 22A:
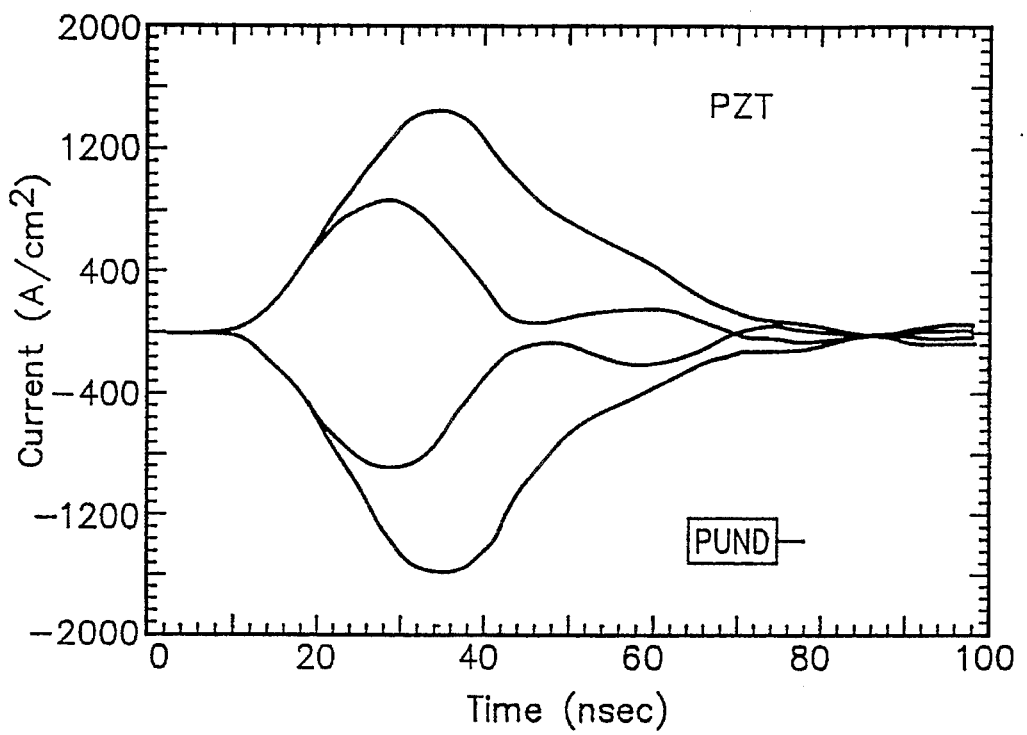
FIG. 22A shows the results of an initial PUND measurement for a sample of PZT prior art material.
Figure 22B:
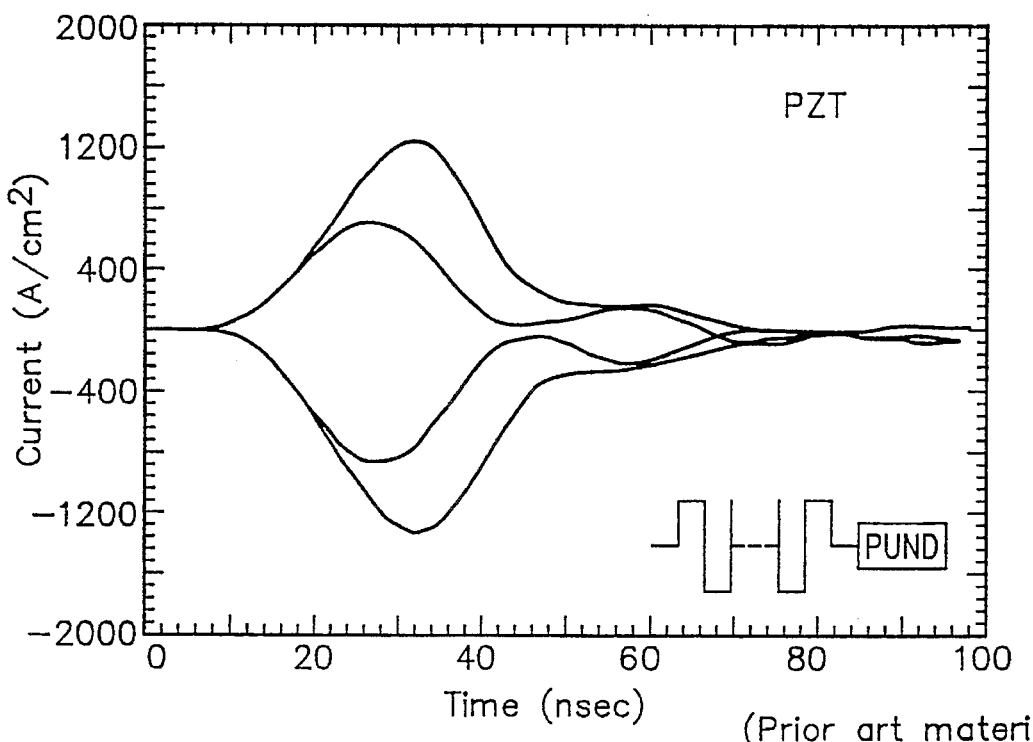
FIG. 22B shows the results of a PUND measurement taken on a sample of PZT prior art material after pulsing the sample with bipolar pulses at 1 MHZ for one hour at 84° C.
Figure 22C:
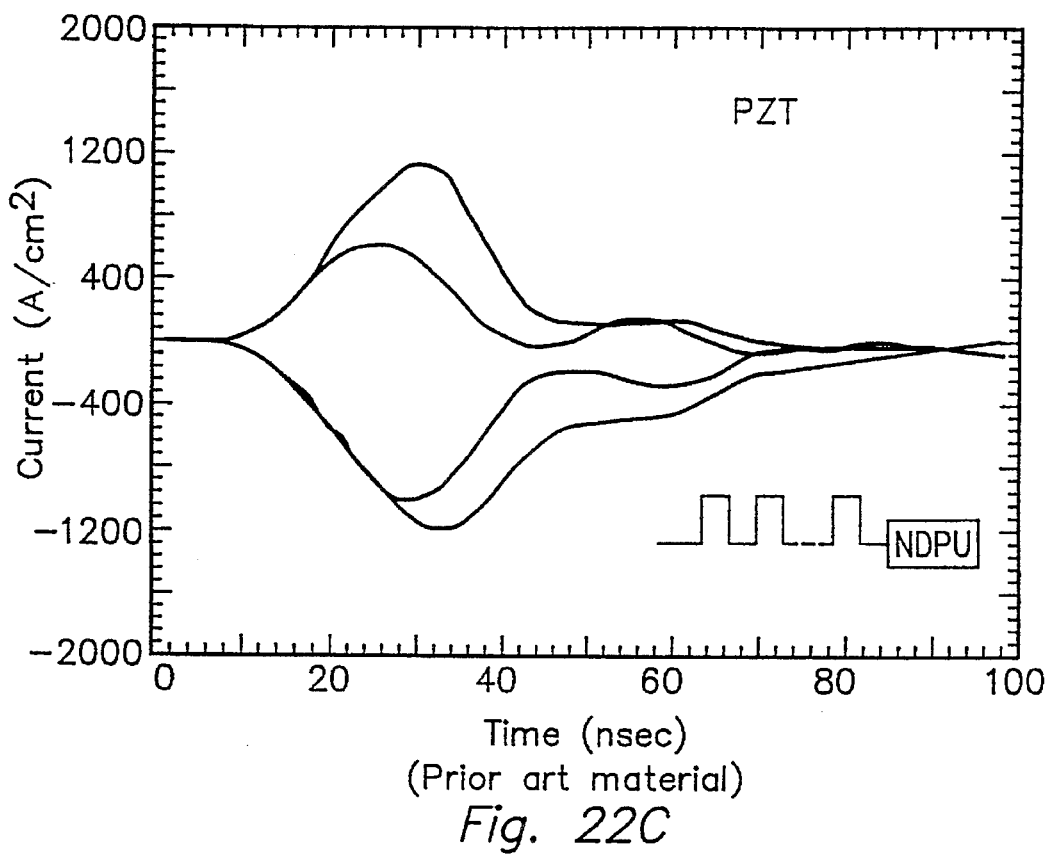
FIG. 22C shows the results of a PUND measurement taken on a sample of PZT prior art material after pulsing the sample with positive pulses at 1 MHZ for one hour at 84° C.
Figure 22D:
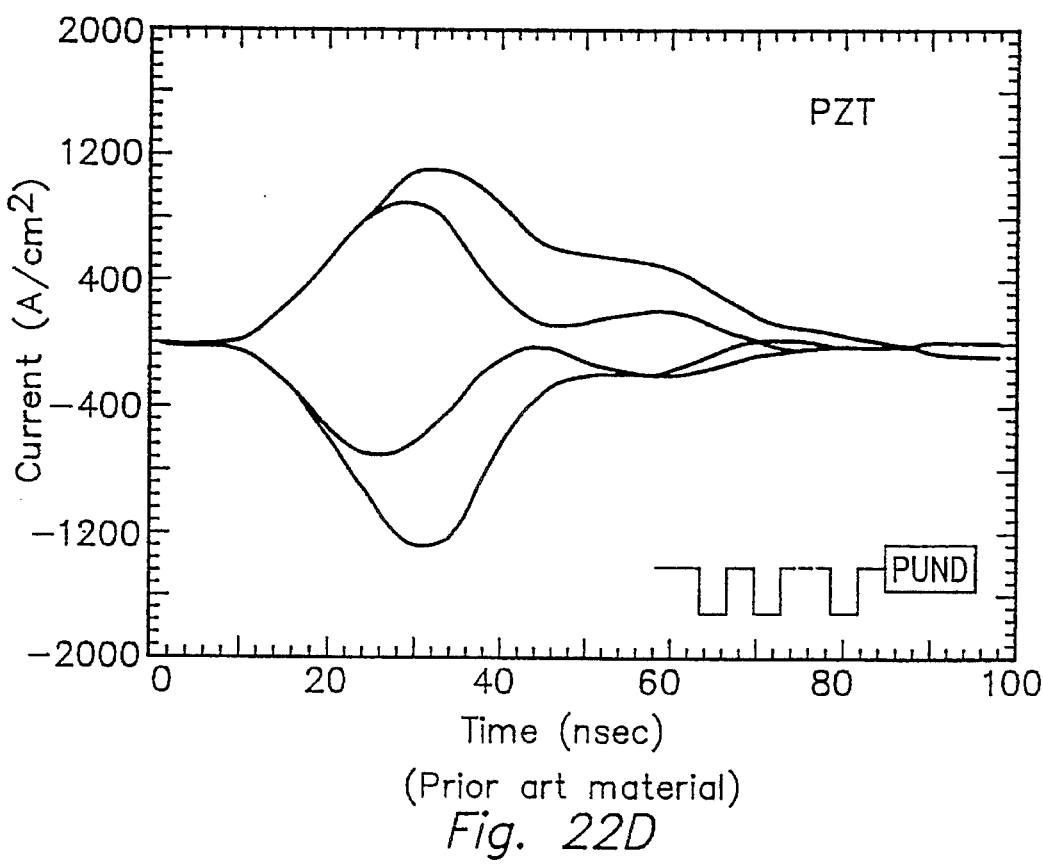
FIG. 22D shows the results of a PUND measurement taken on a sample of PZT prior art material after pulsing the sample with negative pulses at 1 MHZ for one hour at 84° C.
Figure 23A:
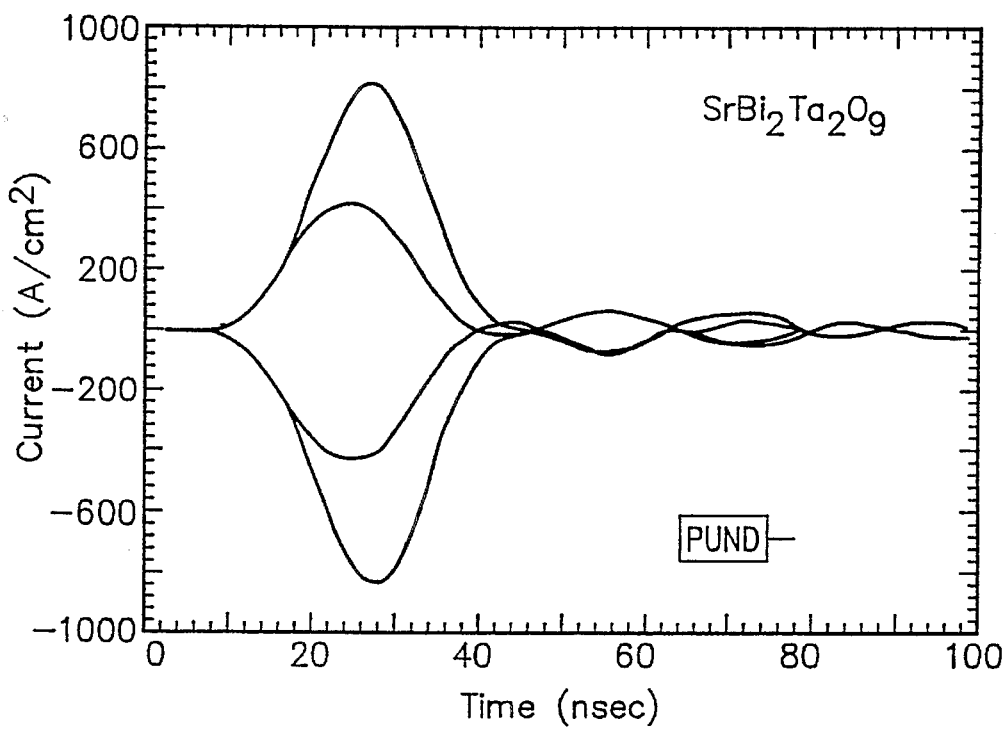
FIG. 23A shows the results of an initial PUND measurement for a sample of $SrBi_2Ta_2O_9$.
Figure 23B:
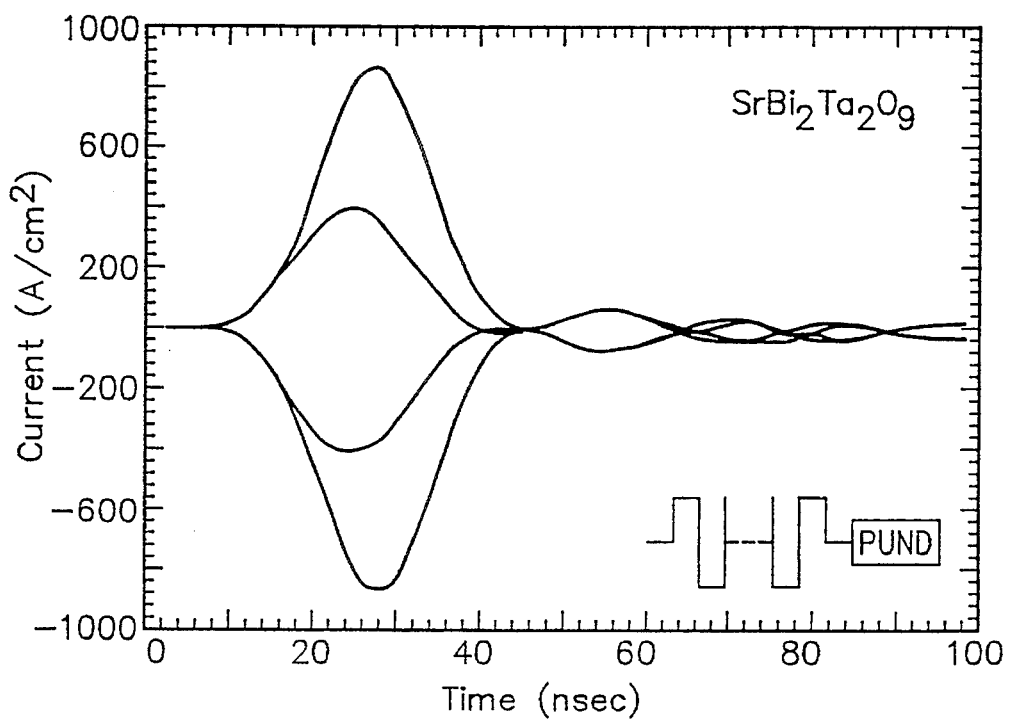
FIG. 23B shows the results of a PUND measurement taken on a sample of $SrBi_2Ta_2O_9$ after pulsing the sample with bipolar pulses at 1 MHZ for one hour at 84° C.
Figure 23C:
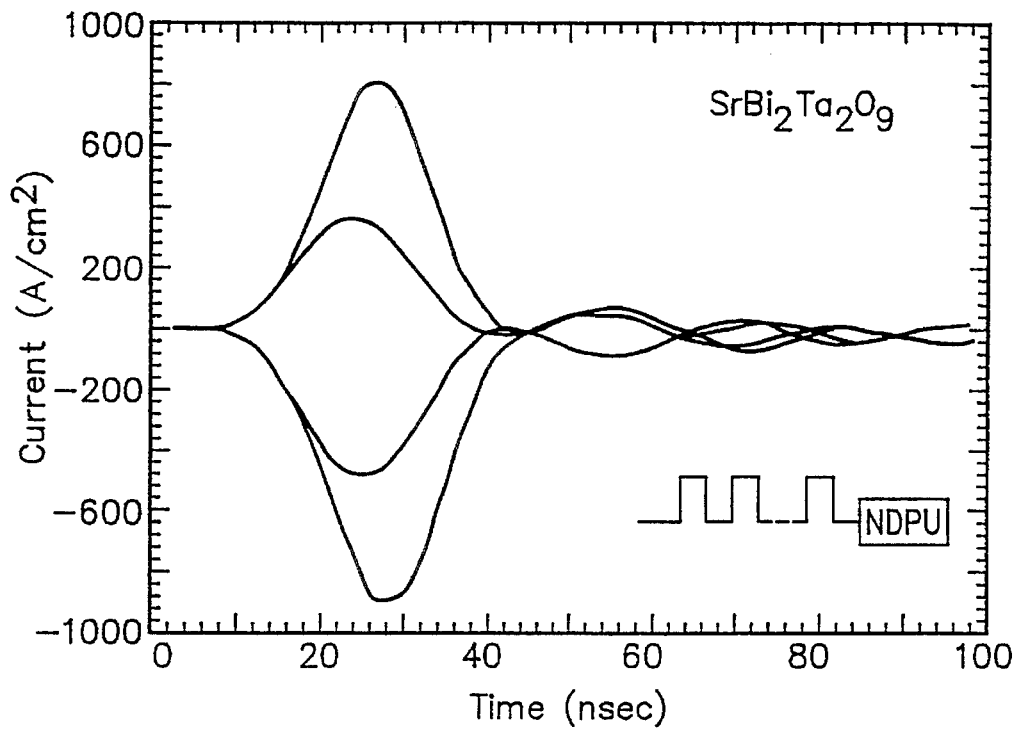
FIG. 23C shows the results of a PUND measurement taken on a sample of $SrBi_2Ta_2O_9$ after pulsing the sample with positive pulses at 1 MHZ for one hour at 84° C.
Figure 23D:
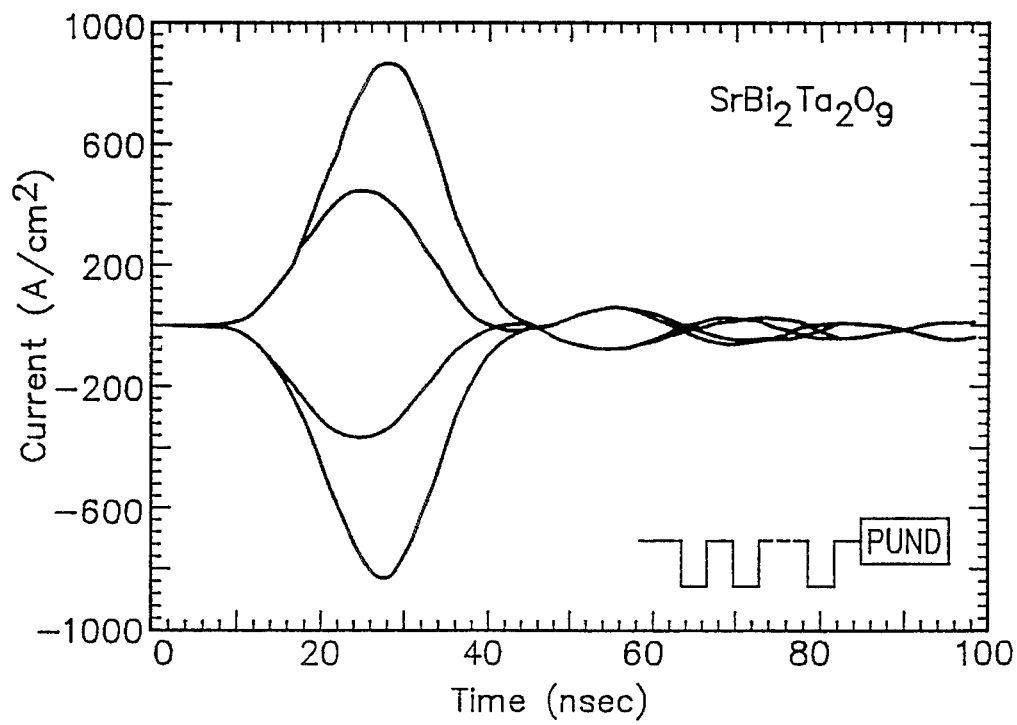
FIG. 23D shows the results of a PUND measurement taken on a sample of $SrBi_2Ta_2O_9$ after pulsing the sample with negative pulses at 1 MHZ for one hour at 84° C.

FIGS. 22A through 22D illustrate the imprinting characteristic of the prior art PZT material: FIG. 22A shows the results of an initial PUND measurement for a virgin sample of PZT prior art material; FIG. 22B shows the results of a PUND measurement taken on a sample of PZT after pulsing the sample with bipolar pulses at 1 MHZ for one hour at 84° C.; FIG. 22C shows the results of a PUND measurement taken on a sample of PZT after pulsing the sample with positive pulses at 1 MHZ for one hour at 84° C.; and FIG. 22D shows the results of a PUND measurement taken on a sample of PZT after pulsing the sample with negative pulses at 1 MHZ for one hour at 84° C. Comparing FIG. 22B with FIG. 22A, the overall level of the curves changes significantly, though the general shape of the curves remains the same. Comparing FIGS. 22C and 22D with FIG. 22A, the overall level of the curves drop by more than 30% and the shape of the curves changes so much that the reliability of the material in a memory would be compromised. It is noted that generally the hysteresis imprinting and fatigue in PZT is even more pronounced than the PUND fatigue. FIGS. 23A through 23D the results of an identical series of tests on $SrBi_2Ta_2O_9$ is shown. There is not significant change in either the level of the curves or the shape of the curves in any test. In fact that changes are so small that it would be difficult to guess which was the initial curve if one were not told. Thus the layered superlattice material fabricated by the process of the invention shows little or no evidence of imprinting.

The above-described data shows that the materials fabricated according to the process of the invention are vastly superior to the materials fabricated according to prior art processes.

There has been described a novel process for fabrication of thin films, and in particular layered superlattice thin films for integrated circuits that results in reliable, low fatigue devices which have many advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it is seen that layered superlattice materials generally have much better ferroelectric and dielectric properties when fabricated according to the process of the invention, the process can now be applied to fabrication many other materials for integrated circuits.

These materials may be incorporated into many different devices other than capacitors, many different integrated circuits other than memories. The process may also be applied in other switching applications requiring low fatigue, such as pyroelectrics, electro-optics, etc. It is also evident that the steps recited in the fabrication processes may in some instances be performed in a different order. Or equivalent materials, structures, and processes may be substituted for the various materials, structures, and processes described. Different dimensions will certainly be used in other applications. Additional materials, structures, and process steps may be added. Consequently, the invention is to be construed as embracing each and every novel feature and novel combination of features present in and/or possessed by the processes, materials, and structures described.

What is claimed is:

1. A method of fabricating an integrated circuit including a layered superlattice material, said method comprising the steps of:

providing an integrated circuit substrate and a precursor liquid including a plurality of metal moieties in effective amounts for spontaneously forming a layered superlattice material upon thermal treatment of said precursor liquid;

forming a film of said precursor on said integrated circuit substrate;

heating said film to form a layered superlattice material on said integrated circuit substrate; and completing the fabrication of said integrated circuit substrate to form thereon a plurality of interconnected electrical devices.

2. A method as in claim 1 wherein said providing step includes a step of preparing a metal carboxylate having carboxylate ligands up to eight carbons in length.

3. A method as in claim 2 wherein said metal carboxylate is a metal 2-ethylhexanoate.

4. A method as in claim 1 wherein said solvent comprises a compound selected from the group consisting of alcohols, aromatic hydrocarbons, and esters.

5. A method as in claim 1, wherein said solvent is 1,4 dioxane.

6. A method as in claim 1 wherein said step of heating includes a step of drying at a temperature of 200° C. or less.

7. A method as in claim 1 wherein said providing step includes a step of selecting said metal moieties from a group consisting of strontium, calcium, barium, bismuth, cadmium, lead, titanium, tantalum, hafnium, tungsten, niobium, zirconium, bismuth, scandium, yttrium, lanthanum, antimony, chromium, thallium, oxygen, chlorine, fluorine, and mixtures thereof.

8. A method as in claim 7, wherein said selecting step includes a step of mixinq said metal moieties to form a material selected from a group consisting of strontium bismuth tantalate, strontium bismuth niobate, strontium bismuth tantalum niobate, barium bismuth tantalate, lead bismuth tantalate, and barium bismuth niobate.

9. The method as set forth in claim 1, wherein said heating step includes a step of annealing said film in an oxygen-rich environment.

10. The method as set forth in claim 9, wherein said annealing step includes a step of baking said film at a temperature ranging from 500° C. to 800° C.

11. The method as set forth in claim 10, wherein said annealing step is preceded by a step of drying said film at a temperature less than 200° C.

12. A method of fabricating a layered superlattice material comprising the steps of:

providing a support and a precursor liquid containing a plurality of metal moieties in effective amounts for spontaneously forming a layered superlattice material upon thermal treatment of said precursor liquid;

forming a film of said precursor liquid to said support; and heating said precursor on said support to form a layered superlattice material containing said metal on said support; and sputtering said layered superlattice material from said support onto a substrate.

13. A method as in claim 12 wherein said substrate comprises an integrated circuit wafer.

14. A method of fabricating an integrated circuit comprising the steps of:

providing an integrated circuit wafer, a support, and a precursor liquid comprising a plurality of metal moieties in effective amounts for yielding a layered superlattice material from said precursor upon thermal treatment of said precursor metal carboxylates in a solvent;

applying said precursor to said support to form a sputtering target;

sputtering said target to form a sputter-deposited layer on said integrated circuit wafer;

treating said sputter-deposited layer to form a layered superlattice material on said wafer; and completing fabrication of said integrated circuit wafer to form a plurality of interconnected electrical devices on said wafer.

* * * * *